United States Patent
Kaeriyama et al.

(10) Patent No.: US 8,084,768 B2
(45) Date of Patent: *Dec. 27, 2011

(54) SEMICONDUCTOR DEVICE

(75) Inventors: Shunichi Kaeriyama, Tokyo (JP); Masayuki Mizuno, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/881,637

(22) Filed: Sep. 14, 2010

(65) Prior Publication Data

US 2011/0007554 A1    Jan. 13, 2011

Related U.S. Application Data

(62) Division of application No. 12/195,992, filed on Aug. 21, 2008, now Pat. No. 7,825,408, which is a division of application No. 10/924,804, filed on Aug. 25, 2004, now Pat. No. 7,425,720.

(30) Foreign Application Priority Data

Aug. 27, 2003 (JP) ................................ 2003-302911
Jul. 6, 2004 (JP) ................................ 2004-199662

(51) Int. Cl.
    H01L 29/06    (2006.01)
(52) U.S. Cl. .... 257/41; 257/774; 257/776; 257/E45.002
(58) Field of Classification Search ................. 257/41, 257/774, 776, E45.002
    See application file for complete search history.

(56) References Cited

U.S. PATENT DOCUMENTS

| | | | |
|---|---|---|---|
| 4,642,487 A | 2/1987 | Carter | |
| 6,487,106 B1 | 11/2002 | Kozicki | |
| 6,668,344 B1 | 12/2003 | Sakata et al. | |
| 6,791,859 B2 | 9/2004 | Hush et al. | |
| 6,838,720 B2 | 1/2005 | Krieger et al. | |
| 6,969,866 B1 | 11/2005 | Lowrey et al. | |
| 7,026,911 B2 | 4/2006 | Aono et al. | |
| 7,116,573 B2 | 10/2006 | Sakamoto et al. | |
| 7,227,169 B2 | 6/2007 | Kozicki | |
| 7,425,720 B2 * | 9/2008 | Kaeriyama et al. | 257/4 |
| 7,473,982 B2 | 1/2009 | Aono et al. | |
| 7,825,408 B2 * | 11/2010 | Kaeriyama et al. | 257/41 |
| 2004/0085826 A1 | 5/2004 | Sakata et al. | |
| 2004/0178403 A1 | 9/2004 | Ovshinsky | |

FOREIGN PATENT DOCUMENTS

| | | |
|---|---|---|
| JP | 2-113723 | 4/1990 |
| JP | 6-283996 | 10/1994 |
| JP | 2001-502848 | 2/2001 |
| JP | 2002-141494 | 5/2002 |
| JP | 2002-374165 | 12/2002 |
| WO | 98/19350 | 5/1998 |

* cited by examiner

OTHER PUBLICATIONS

Japanese Patent Office issued a Japanese Office Action dated Mar. 9, 2009, Application No. 2004-199662.

*Primary Examiner* — Trung Q Dang
(74) *Attorney, Agent, or Firm* — Young & Thompson

(57) ABSTRACT

A programmable semiconductor device has a switch element in an interconnection layer, wherein in at least one of the inside of a via, interconnecting a wire of a first interconnection layer and a wire of a second interconnection layer, a contact part of the via with the wire of the first interconnection layer and a contact part of the via with the wire of the second interconnection layer, there is provided a variable electrical conductivity member, such as a member of an electrolyte material. The via is used as a variable electrical conductivity type switch element or as a variable resistance device having a contact part with the wire of the first interconnection layer as a first terminal and having a contact part with the wire of the second interconnection layer as a second terminal.

14 Claims, 65 Drawing Sheets

HALF-ADDER

SET-RESET FLIPFLOP WITH ENABLE INPUT

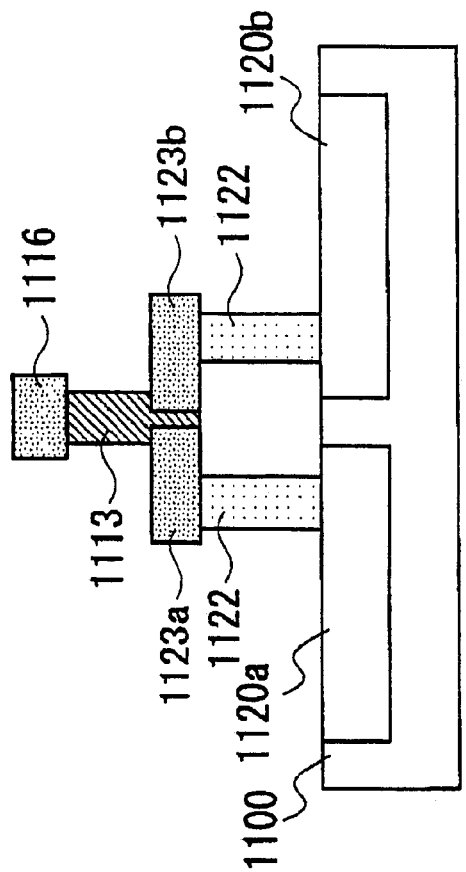
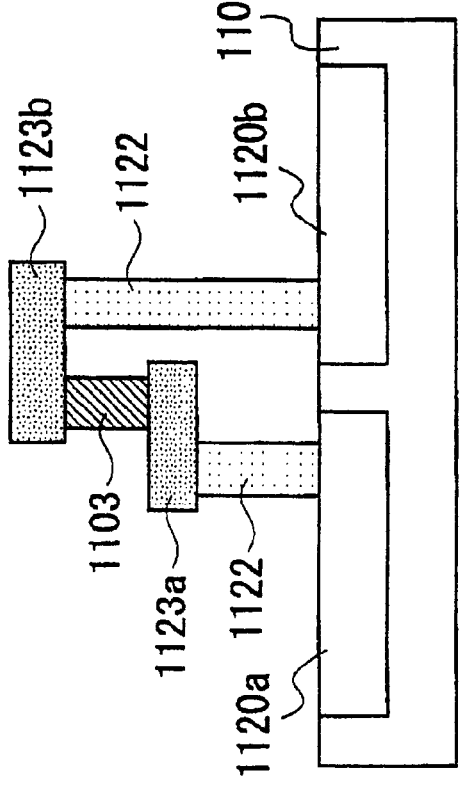

FIG. 48
AND/NAND
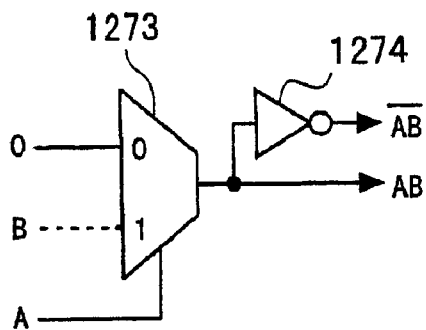 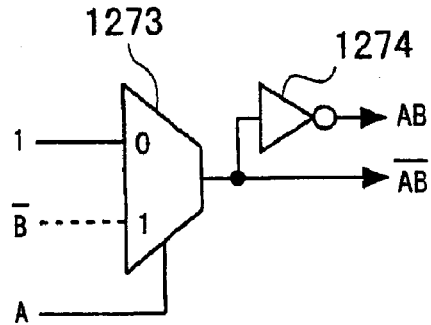
OR/NOR
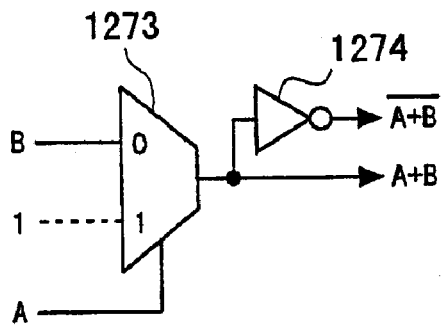 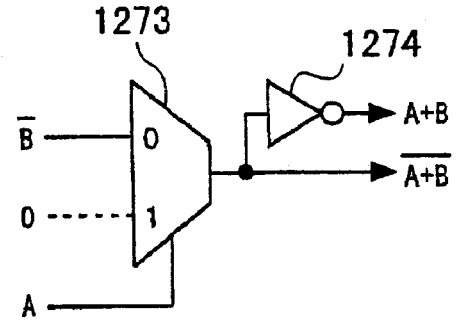
XOR/XNOR
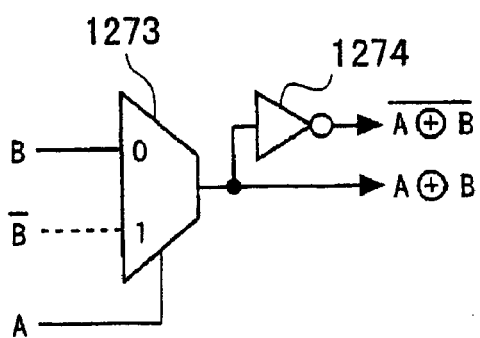 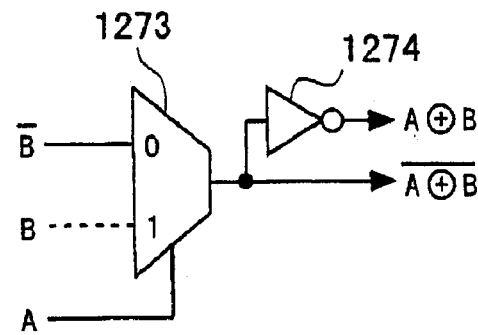

SEMICONDUCTOR DEVICE

FIELD OF THE INVENTION

This invention relates to a semiconductor device. More particularly, it relates to an interconnection structure of a programmable semiconductor device, a logic integrated circuit, an arithmetic circuit device and a memory device having such interconnection structure, and a programming circuit therefor.

BACKGROUND OF THE INVENTION

A conventional semiconductor integrated circuit is composed of transistors formed on a semiconductor substrate, and an interconnection structure, formed as an upper layer of the semiconductor substrate for interconnecting the elements. The interconnection pattern is determined at the designing stage of the integrated circuit, and hence the connecting states of the transistors cannot be changed after the fabrication of the semiconductor integrated circuit.

The above problem can be solved with a programmable semiconductor integrated circuit, such as FPGA (field programmable gate array). With the programmable semiconductor integrated circuit, the function of the logic circuit or the arithmetic circuit, and the interconnection between the logic circuits and/or the arithmetic circuits, can be changed based on stored memory devices to enable the logic/arithmetic functions or the interconnection between them to be reconfigured as desired. As the memory devices for storage of the configuration information, an SRAM (static random access memory) cell, an antifuse or a floating gate MOS transistor, is used.

A DRAM (dynamic random access memory) cell or a ferroelectric capacitor may also be used.

[Patent Publication 1] U.S. Pat. No. 6,487,106

SUMMARY OF THE DISCLOSURE

If, in a conventional semiconductor integrated circuit, a design failure has been found, or a design has been changed, after fabrication, the circuit must be re-fabricated after re-designing the interconnection pattern.

In case of a design change, tremendous costs are incurred in re-designing the interconnection pattern or in mask formulation. In keeping with the increase in the scale of the integrated circuit, the probability of occurrence of design failure is increasing, while the cost of the mask is increasing rapidly with the progress of process miniaturization. For this reason, there is a demand for a technique capable of coping with change of specifications or the post-fabrication inconveniences without re-formulating a mask.

In a programmable semiconductor integrated circuit, such as FPGA, the circuit structure can be changed by changing the memory storage contents. However, the circuit suffers from a problem that the memory devices occupy an extremely large area. The result is that the programmable semiconductor integrated circuit has an increased chip area, such that it is extremely expensive. Moreover, the FPGA, in which the memory devices take-up a large area, the interconnection switches, used for changing the connection of logic circuits or arithmetic circuits, take-up a large area, thereby lowering the proportion of the area of the logic circuit or the arithmetic circuit in the entire chip surface. Thus, in the routine FPGA, as many functions as possible are allotted to one logic circuit or one arithmetic circuit to raise the granularity of the logic or arithmetic circuit and hence the proportion of the logic or arithmetic circuit in the entire chip area. However, the logic circuit or arithmetic circuit with a coarse granularity tends to produce wastefulness, depending on the allocated functions, thus lowering the utilization efficiency.

Among the problems that may be presented in near future, there is a problem of the increase in power consumption due to leak current from the memory device, and destruction of storage contents by cosmic-ray-induced soft error.

There is also presented a problem that the on-resistance of the components that make up the switch circuit, such as combinations of memory circuits and pass transistors, is as large as several hundreds of ohms or even several kilo ohms, thus increasing the signal delay.

On the other hand, a programmable device may be exemplified by FPGA employing a fuse or an antifuse. With the antifuse, or the like device, the on-resistance may be reduced to approximately hundreds of ohms, however, if once the device is programmed to an on-state or to an off-state, the original state cannot be restored. That is, with such programmable device, the correction or function changes of the fabricated circuit, addressed by the present invention, cannot be coped with.

Accordingly, it is an object of the present invention to provide a semiconductor device in which it is possible to make post-fabrication change of the interconnection structure to render the correction of inconveniences or changes of the specifications possible in the as-manufactured semiconductor integrated circuit or memory device, thereby reducing cost.

It is another object of the present invention to provide a reconfigurable semiconductor device which has a reduced chip area.

It is a further object of the present invention to provide a semiconductor device which may be re-configured and which has high utilization efficiency of a logic circuit or an arithmetic circuit with the use of fine granularity logic circuits or arithmetic circuits.

It is yet another object of the present invention to provide a semiconductor device which may be re-configured and in which it is possible to reduce signal delay.

The above and other objects are attained by a semiconductor device in accordance with an aspect of the present invention, which includes a substrate on which transistors are formed, and an interconnection structure formed as an upper layer of the substrate, the interconnection structure comprising a plug or a via having a variable electrical conductivity member between first and second terminals separated from each other, thereby to provide a switch element in the interconnection structure having the first and second terminals.

According to the present invention, the variable electrical conductivity switch is formed in a plug or via hole. According to the present invention, the variable electrical conductivity switch comprises an electrolyte material or a chalcogenide material, and an electric path across the two terminals of the switch element may be variably set between the shorted state, open-circuited state and a state intermediate between the shorted state and the open-circuited state.

A semiconductor device in accordance with another aspect of the present invention comprises a substrate on which transistors are formed, and an interconnection structure provided as an upper layer on said substrate. The interconnection structure has a first wire and a second wire, each containing a variable electrical conductivity member, in one interconnection layer between first and second terminals, separated from each other. The interconnection structure has a third wire in another interconnection layer distinct from the first-stated interconnection layer. The third wire overlies the variable electrical conductivity member and partially overlaps with the first and second terminals. There is provided in the interconnection structure a three-terminal switch element, the first and second terminals of which are provided by the first and second terminals of the wire of the aforesaid one interconnection layer, and a control terminal of which is provided by the third wire of the aforesaid other interconnection layer.

In another aspect, the present invention provides a non-volatile switch element, which enables the electrical conductivity across two wires to be changed by creating or dissolving an electrically conductive material from an electrolyte material arranged between two wires. The present invention provides a reconfigurable semiconductor device, such as a programmable logic circuit or arithmetic circuit or a memory circuit by using the switch element.

The present invention also provides, in another aspect, a switch circuit comprising a two-terminal switch element including a first electrode, a second electrode and an ion conductor interposed between the first and second electrodes for conducting metal ions therethrough. The second electrode is formed of a material having lower reactivity than that of the aforesaid first electrode. The electrical conductivity across the first electrode and the second electrode is changed by an oxidation-reduction reaction of the metal ions. The switch circuit of the present invention also includes first and second transistors of respective different polarities, connected to the first electrode, and third and fourth transistors of respective different polarities, connected to the second electrode.

A switch circuit according to another aspect of the present invention, comprises a three-terminal switch element including a first electrode, a second electrode neighboring to the first electrode, a third electrode facing the first and second electrodes and an ion conductor interposed between the first, second and third electrodes for conducting metal ions therethrough. At least one of the first and second electrodes is formed of a material having lower reactivity than that of the third electrode. The electrical conductivity across the first electrode and the second electrode is changed by an oxidation-reduction reaction of the metal ions. The switch circuit of the present invention also includes first and second transistors of respective different polarities, connected to the first electrode, third and fourth transistors of respective different polarities, connected to the second electrode, and fifth and sixth transistors of respective different polarities, connected to the third electrode.

The meritorious effects of the present invention are summarized as follows.

According to the present invention, the wire connection may be changed in the post-fabricated semiconductor integrated circuit, so that, in the post-fabricated semiconductor integrated circuit, it is possible to correct design failures or change the production of semiconductor integrated circuits at lower cost.

On the other hand, the memory devices or circuits, used in the conventional programmable integrated circuits for storage of the configuration information, as well as pass transistors used for interconnecting the wires, may be replaced by the interconnection structure of the present invention.

According to the present invention, the switch elements may be stacked in multiple layers in the interconnection layer to raise the density of the switch elements per unit area.

With the switch element of the present invention, in distinction from the switch element formed on a substrate, the power consumption may be diminished, because there is no leak current flowing in the substrate.

Moreover, with the present switch element, the on-resistance is lower than with the pass transistor, thereby increasing the capacitive load driving capability to provide higher operation speeds. Hence, the interconnection structure of the present invention assures superior characteristics in terms of area, power consumption and operating speeds as compared to the conventional memory device-pass transistor combination. That is, the present invention provides a reconfigurable semiconductor device having improved performance in take-up area, delay, leak current or soft error tolerance. Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 40 is a diagram showing the structure of a programmable switch circuit by a switch element with a solid electrolyte embodying the present invention.

FIG. 48 illustrates an exemplary operation of a programmable logic circuit embodying the present invention.

PREFERRED EMBODIMENTS OF THE INVENTION

Figure 1A:
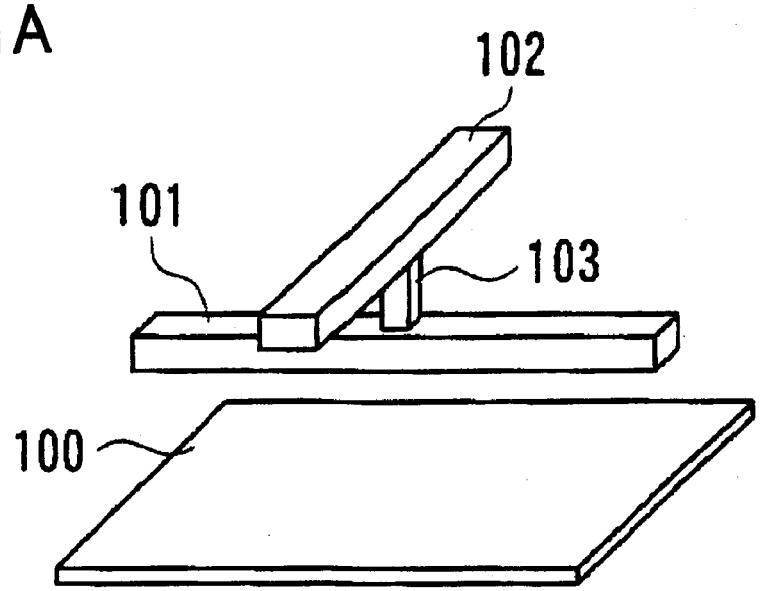
FIG. 1 illustrates an embodiment of the present invention, FIG. 1A schematically showing a three-dimensional set-up of an interconnection structure having a switch element in a via, and FIG. 1B schematically showing the cross-section of the three-dimensional set-up of an interconnection structure having a switch element in a via.

Referring to the drawings, the best mode for carrying out the present invention is now explained.

FIG. 1 shows a first embodiment of an interconnection structure of the present invention. FIG. 1A illustrates a three-dimensional structure of a programmable switching circuit according to the present invention. Referring to FIG. 1A, an interconnection structure, according to the present invention, includes a semiconductor substrate 100, a first interconnection layer 101, a second interconnection layer 102 and a switch element 103 of a via structure.

In the semiconductor substrate 100, there are formed elements, such as transistors or the like. The first interconnection layer 101 and the second interconnection layer 102 each include a planar interconnection structure formed of an electrically conductive material, such as copper or aluminum. A via 103, having the function of a switch, is a vertically extending conducting member connecting a wire (conducting member) of the first interconnection layer 101 to a wire (conducting member) of the second interconnection layer 102.

An electrolytic material, containing metal ions, is arranged within the via 103 or in a contact area of the via 103 with the wire of the first interconnection layer 101 or in a contact area of the via 103 with the wire of the second interconnection layer 102, in order to change the electrical conductivity, depending on a method for precipitating the electrically conductive material.

Figure 1B:
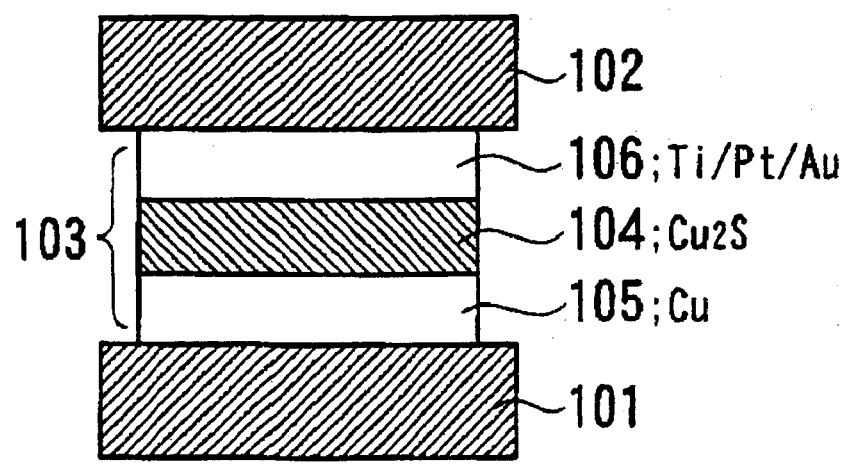

For example, copper sulfide ($Cu_2S$) is arranged in the via 103 as an electrolytic material 104, a copper electrode, termed a first electrode 105, is arranged in a location of connection of the electrolytic material and the first interconnection layer 101, and an electrode of a oxidation withstand material, such as titanium or platinum, termed a second electrode 106, is arranged in a location of connection of the electrolytic material 104 and the second interconnection layer 102, as shown in FIG. 1B.

If, in FIG. 1B, a positive voltage is applied to the first electrode 105 and a negative voltage is applied to the second electrode 106, electrons (e−) are supplied from the second electrode 106 to the electrolytic material 104, basically in accordance with the principle of the metal-plating, copper ions ($Cu^{2+}$) in copper sulfide are reduced in the vicinity of the second electrode 106 ($Cu^{2+}+2e^-\rightarrow Cu$) and copper (Cu) is precipitated in the vicinity of the second electrode 106. If the voltage continues to be applied, the copper precipitated from the second electrode 106 continues to grow towards the first electrode 105 into contact with the first electrode 105. Since the first electrode 105 and the second electrode 106 are interconnected by precipitated copper at this time, the resistance across the terminals may be reduced. The resistance value across both terminals in this state (on-resistance) may be lower to 50Ω or less, so that the resistance value may be reduced to a value on the order of one-tenth to one-hundredth of that in the case of the connection employing a pass transistor.

If, in this state, a negative voltage and a positive voltage are applied to the first electrode 105 and to the second electrode 106, respectively, copper precipitated between the first electrode 105 and the second electrode 106 is oxidized ($Cu\rightarrow Cu^{2+}+2e^-$) and dissolved again as copper ions ($Cu^{2+}$) into the electrolytic material 104 to cut off the connection between the first electrode 105 and the second electrode 106. The electrical resistance across the first electrode 105 and the second electrode 106 in this state (off-resistance), which depends on e.g. the thickness of the electrolytic material 104 or on the area of the via 103, is of a high value of 1MΩ or higher in the case of a device tentatively produced by the present inventors. On this operating principle, the wiring of the first interconnection layer 101 and the wiring of the second interconnection layer 102 may be shorted or opened to enable the use as a switch element. The shorted and opened states may repeatedly be re-programmed 1000 times or more. In addition, it has been confirmed that this shorted or opened state may be maintained for 1000 hours or longer at an ambient temperature. The via structure of the present invention may, of course, be applied to a stacked via structure.

Figure 2:
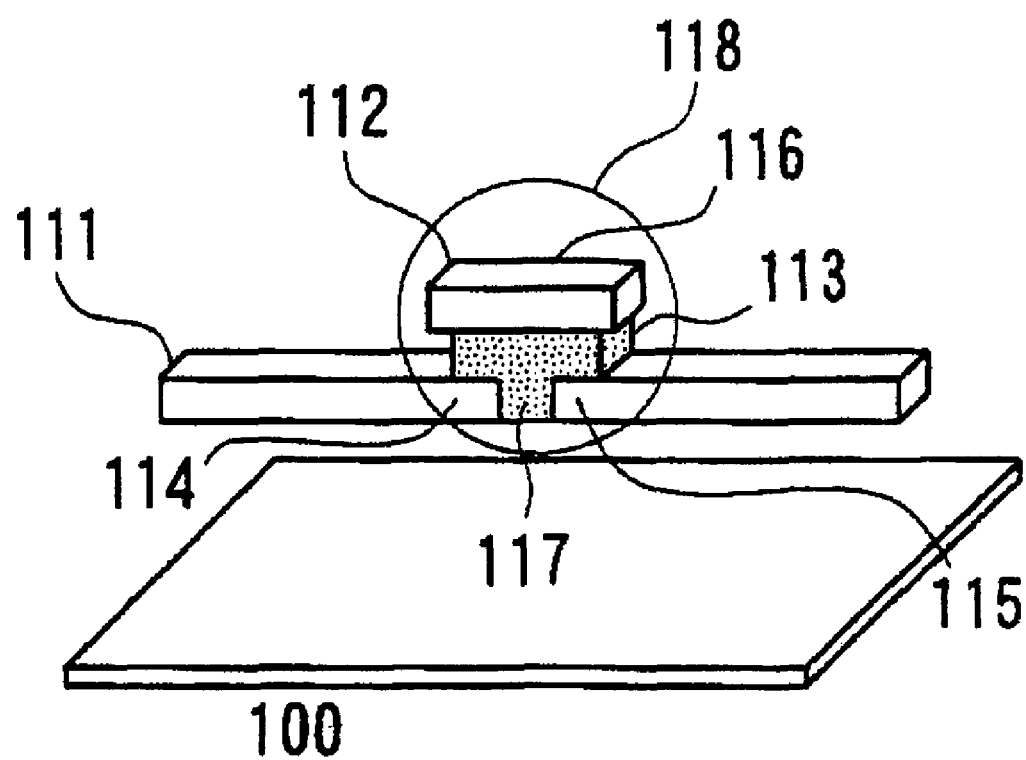
FIG. 2 is a diagram showing an interconnection structure having a switch element with a control gate according to a modification of the present invention.

FIG. 2 shows a modification of the interconnection structure of the present invention. Referring to FIG. 2, the interconnection structure of the present invention includes a semiconductor substrate 100, a first interconnection layer 111 and a second interconnection layer 112.

The semiconductor substrate 100 includes elements, such as transistors or the like. The first interconnection layer 111 and the second interconnection layer 112 each comprise a planar interconnect formed of an electrically conductive material, such as copper or aluminum. Two conductors (wires) of the first interconnection layer 111 are adjacent to each other, with a minor gap 117 in-between, to form a source electrode 114 and a drain electrode 115. In the inside and vicinity of the gap 117, there is laminated an electrolyte material 113. A conductor of a second interconnection layer 112 is arranged thereon to form a gate electrode 116. The size of the gap 117 ranges e.g. between 10 nm and 1 μm.

In the electrolyte material 113, a suitable voltage or current is applied to the gate 116 to precipitate an electrically conductive material from the electrolyte material to change the electrical conductivity.

Such a case is explained in which the source electrode 114 and the drain electrode 115 are formed of a oxidation resistant material, such as titanium or platinum, the gate electrode 116 is formed of copper and the electrolyte material 113 interposed therebetween is formed of copper sulfide ($Cu_2S$).

Figure 37A:
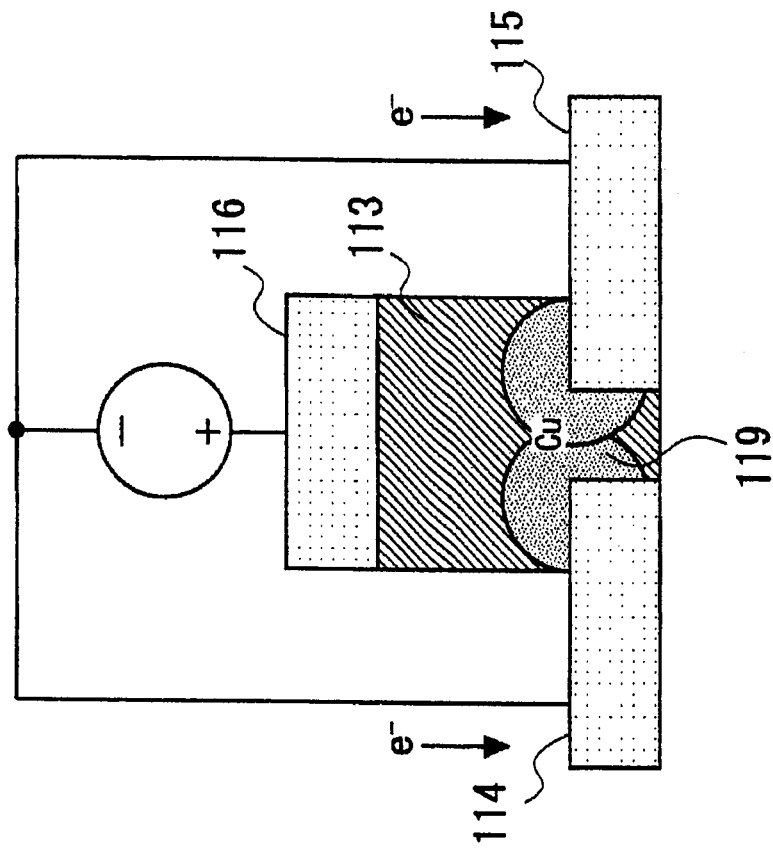
FIG. 37 illustrates the operation of a three-terminal switch element according to an embodiment of the present invention.
Figure 37B:
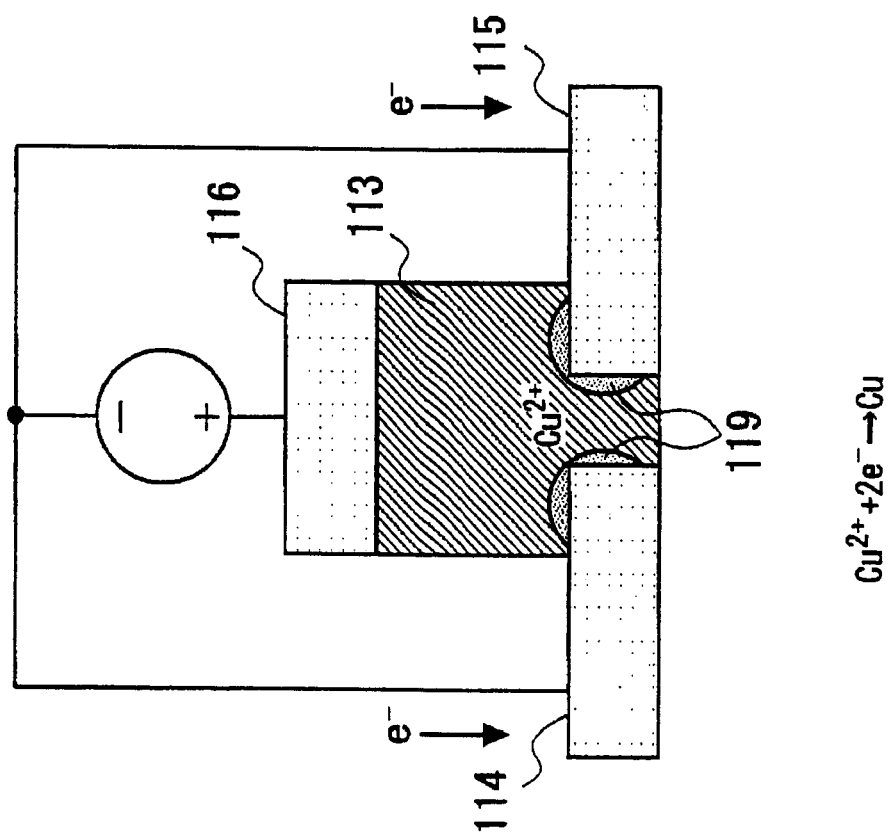

If a positive voltage is applied to the gate electrode 116 and a negative voltage is applied to the source electrode 114 and the drain electrode 115, electrons are supplied to copper sulfide in the vicinity of the source electrode 114 and the drain electrode 115, in accordance with the principle of the metal-plating, so that copper ions ($Cu^{2+}$) in copper sulfide are reduced and copper 119 is precipitated in the vicinity of the source electrode 114 and the drain electrode 115, as shown in FIG. 37A. If the voltage continues to be applied, copper precipitates 119 gradually grows such that the copper precipitate grown from the source electrode 114 and copper precipitate grown from the drain electrode 115 are contacted with and electrically connected to each other, as shown in FIG. 37B.

If conversely a positive voltage is applied to the source electrode 114 and the drain electrode 115 and a negative voltage is applied to the gate electrode 116, the copper 119, precipitated in the vicinity of the source electrode 114 and the drain electrode 115, is oxidized and again dissolved into the electrolytic material to break the connection across the source electrode 114 and the drain electrode 115.

This shorts or opens the source 114 and the drain 115. In this manner, a three-terminal switch element 118, capable of adjusting the electrical conductivity between the source 114 and the drain 115 by the voltage or the current applied to the gate 116, is formed in the interconnection layer as an upper layer on the substrate.

If the switch element shown in FIG. 1 or 2 exploits the oxidation-reduction reaction of the electrolyte material, at least one of the terminals includes, as a first electrode material, at least one of platinum, aluminum, gold, silver, copper, titanium, tungsten, vanadium, niobium, tantalum, chromium, molybdenum, nitrides or silicides thereof, whilst at least another terminal includes, as a second electrode material, copper, silver, chromium, tantalum or tungsten. Between the first and second electrodes, there is arranged an electrolyte material containing metal ions, such as ions of sulfides of the second electrode material, or an electrolyte material, containing metal ions ionized and dissolved from the second electrode so as to be movable freely. If, with this electrode structure, the voltage is applied across the terminals, or the current is caused to flow between the terminals, the amount of metal precipitates across the terminals is changed by the oxidation-reduction reaction of metal ions in the electrolyte material, these metal precipitates shorting or open-circuiting (disconnecting) the terminals to change the electrical conductivity across the terminals.

Figure 3:
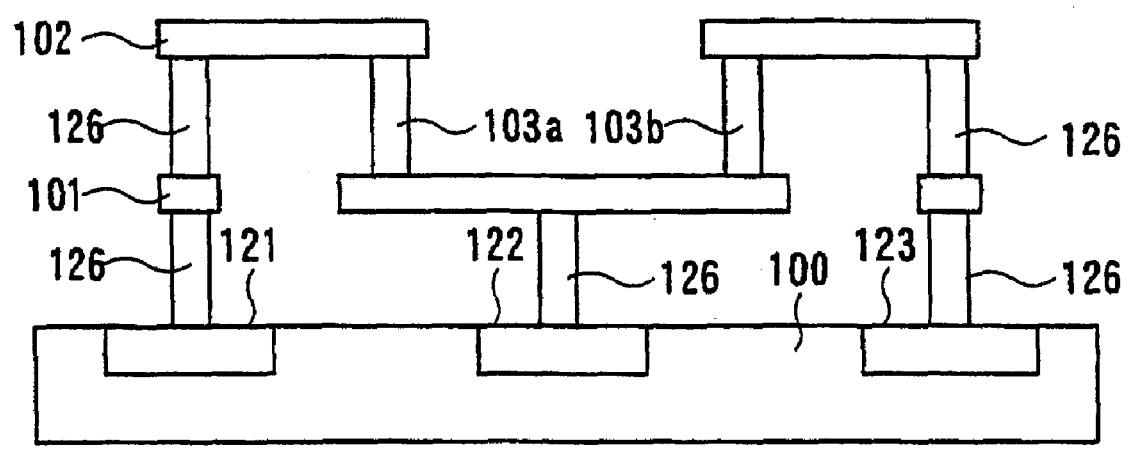
FIG. 3 is a diagram showing an interconnection structure according to an embodiment of the present invention, in which the connection of a logical circuit may be changed.

FIG. 3 schematically illustrates the cross-sectional structure of a semiconductor integrated circuit employing the above-described switch element. Referring to FIG. 3, an embodiment of a semiconductor integrated circuit of the present invention includes a semiconductor substrate 100, a plural number of logic circuits 121, 122 and 123, formed on the semiconductor substrate 100, a first interconnection layer 101, a second interconnection layer 102, a usual via 126 and vias 103a, 103b, having the switching function described above in connection with the previous embodiment.

A plural number of logic circuits are formed on the semiconductor substrate 100 and are interconnected by conductors of the first interconnection layer 101, second interconnection layer 102 or other interconnection layers. The conductors of these different interconnection layers are interconnected by the vias 126 or the vias 103.

In the present embodiment, certain vias are vias 103, the electrical conductivity of which may be changed, while other vias are normal vias 126 of the electrically conductive material. With such structure of the semiconductor integrated circuit, the circuit operation may be changed by controlling the state of the vias, the electrical conductivity of which may be changed.

Assume that outputs may be obtained from the logic circuits 121, 123, and a signal is entered to the logic circuit 122. If, in such case, the electrical conductivity of the via 103a is set to a high value, while that of the via 103b is set to a low value, the logic circuit 122 operates in dependence upon the result of the output of the logic circuit 121. If conversely the electrical conductivity of the via 103a is set to a low value, while that of the via 103b is set to a high value, the logic circuit 122 operates in dependence upon the result of the output of the logic circuit 123. Hence, by changing the setting of the vias 103a and 103b, the electrical conductivity of which may be changed, it is possible to change the operation of the logic circuit 122.

Figure 4:
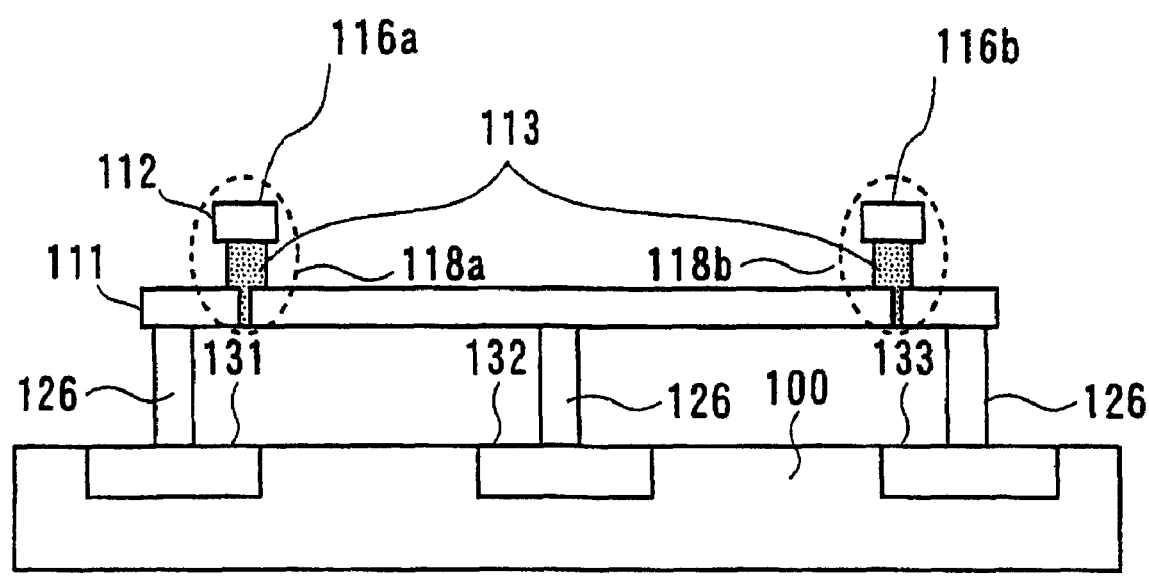
FIG. 4 is a diagram showing an interconnection structure according to a modification of the present invention, in which the connection of a logical circuit may be changed.

In FIG. 4, the vias 103a and 103b of FIG. 3, the electrical conductivity of which may be changed, are replaced by three-terminal devices 118a and 118b, respectively. Referring to FIG. 4, an embodiment of a semiconductor integrated circuit, according to the present invention, includes a semiconductor substrate 100, a plural number of logic circuits 131, 132, and 133, a first interconnection layer 111, a second interconnection layer 112, gate terminals 116a and 116b, formed in the second interconnection layer, the three-terminal devices 118a and 118b, each being adapted so that the electrical conductivity across the terminals thereof may be changed by the voltage applied to the gate terminal, as shown in FIG. 2, and a material 113, performing the role of changing the electrical conductivity across the terminals of the three-terminal device 118.

With the circuit shown in FIG. 4, the electrical conductivity across the channels of the three-terminal devices 118a and 118b may be changed by applying suitable voltage or current to the gates 116a and 116b. For example, if the electrical conductivity of the three-terminal device 118a is set to a high value and that of the three-terminal device 118b is set to a low value, the logic circuit 132 is connected to the logic circuit 131. If conversely the electrical conductivity of the three-terminal device 118a is set to a low value and that of the three-terminal device 118b is set to a high value, the logic circuit 132 is connected to the logic circuit 133. Thus, by suitably setting the electrical conductivity of the three-terminal devices 118a and 118b, it is possible to change the operation of the logic circuit 132.

Embodiments

The embodiments of the present invention, in which the switch element according to the present invention, explained in the above preferred embodiment, has been applied to a programmable logic circuit and to a memory circuit, are now explained with reference to the drawings.

Figure 5:
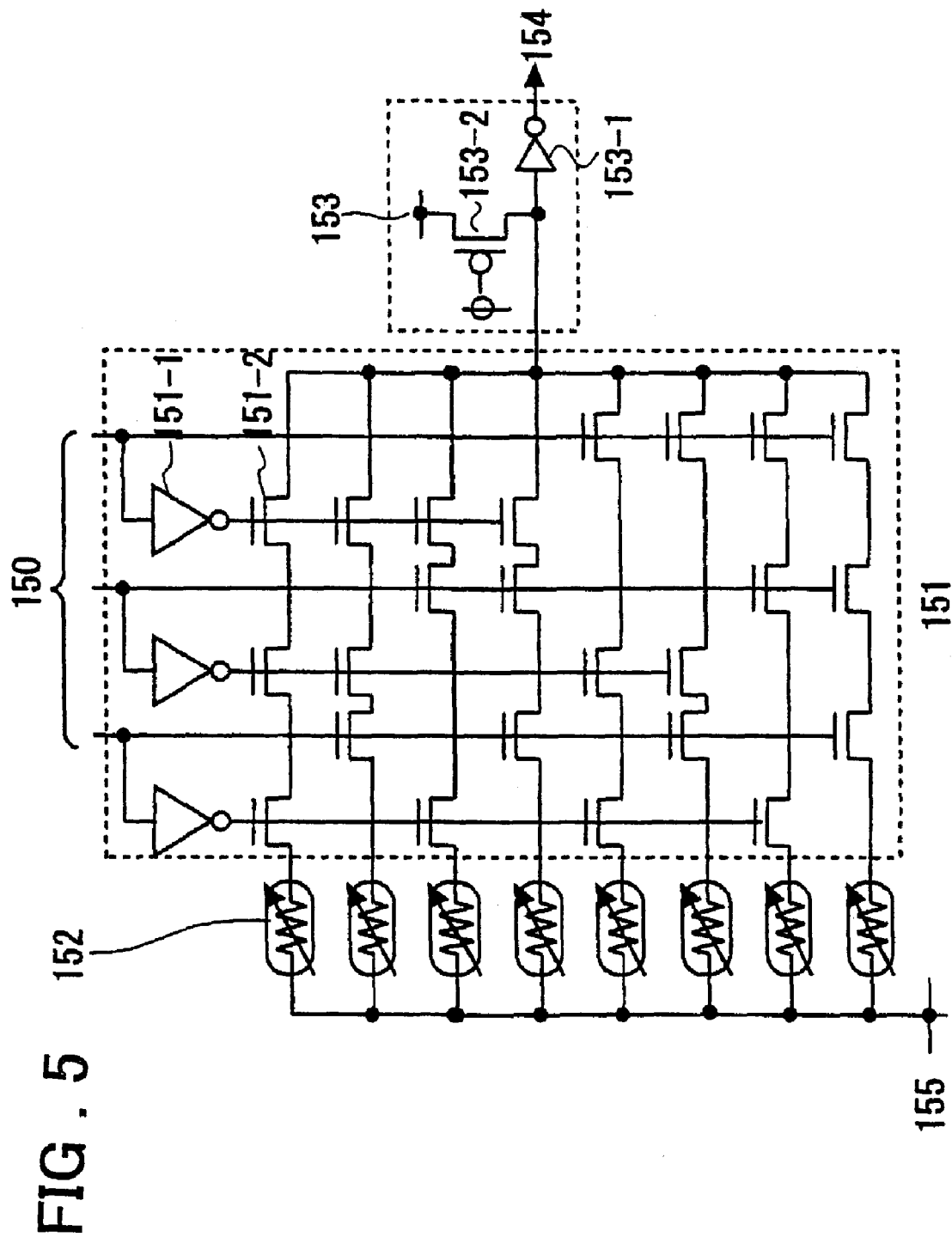
FIG. 5 is a diagram showing the structure of an embodiment of a programmable logic circuit employing a switch element according to the present invention.

FIG. 5 shows the structure of an embodiment of a programmable logic circuit of the present invention, employing a switch element of the present invention.

Referring to FIG. 5, a semiconductor integrated circuit of the present embodiment includes a plural number of input terminals 150, a selector circuit 151, a plural number of switch elements 152, a sense circuit 152, a sense circuit 153, and an output terminal 154. The switch elements 152 are each formed by the via 103, shown in FIGS. 1 and 3, or by the switch element 118, shown in FIGS. 2 and 4, formed in an interconnection layer, and the electrical conductivity across two terminals thereof may be changed.

The selector circuit 151 comprises eight rows of pass transistors 151-2, in association with eight switch elements 152, with each row being formed by serially connected three pass transistors 151-2 across the outputs of the switch elements 152 and inputs of the sense circuit 153, in which, for each of the three inputs 150, two columns of pass transistors 151-2 receive at gates thereof an inverted signal of the input 150 by an inverter 153-1 and a non-inverted signal. The pass transistors 151-2 are disposed in an array format. If the three input signals 150 are "000", an output of the switch element 152 of the first row is selected and transmitted to the sense circuit 153 and, if the three input signals 150 are "001", an output of the switch element 152 of the second row is selected and transmitted to the sense circuit 153, and so forth, such that, if the three input signals 150 are "111" an output of the switch element 152 of the eighth row is selected and transmitted to the sense circuit 153. An output of the selector circuit 151 is supplied the inverter 153-1 of the sense circuit 153. A p-channel MOS transistor 153-2 is connected across an input 153-1 and a power supply.

In the circuit shown in FIG. 5, the selector 151 selects one of switch elements 152, conforming to the input logic, based on the combination of the logic of the input 150. If the electrical conductivity of the selected switch element 152 is high or low, the selected switch element is connected to a fixed potential 155 or opened, respectively.

The sense circuit 153 discriminates these states to output "1" or "0". For example, the switch elements 152 prescribe the high electrical conductivity state and the low electrical conductivity state to "0" and "1" respectively, such that the electrical conductivity is set in advance. The logic function between the input and the output is set, depending on the programmed contents. In programming the switch elements 152, the switch element to be programmed is selected by a selector, and the proper voltage is applied from the sense circuit to apply a voltage across the two terminals of the selected switch element to change the electrical conductivity. In case the switch element 152 is a three-terminal switch element 118, a suitable voltage is applied to the gate terminal 116 to change the electrical conductivity.

Figure 6:
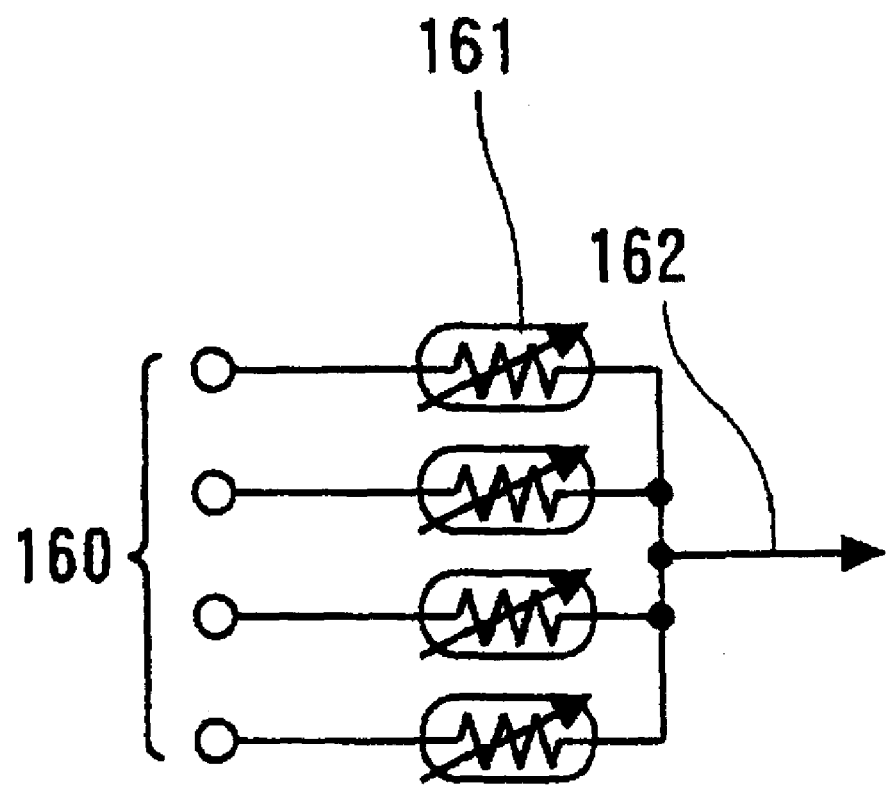
FIG. 6 is a diagram showing the structure of an embodiment of a programmable selector circuit employing a switch element according to the present invention.

FIG. 6 shows the structure of an embodiment of a programmable selector circuit employing a switch element embodying the present invention. Referring to FIG. 6, the selector circuit of the present embodiment includes a plural number of input/output terminals 160, a plural number of switch elements 161, and an input/output terminal 162. The switch elements 161 are formed as an interconnection layer, as 103 of FIG. 1 or 118 of FIG. 2, to permit the electrical conductivity across the two terminals to be changed.

In the circuit shown in FIG. 6, an optional one of the plural the electrical conductivity of one of the input/output terminals 160 may be connected to the input/output terminal 162 by raising the electrical conductivity of the selected input/output terminal and by lowering that of other switch elements 161. By so doing, a selector may select and output one of a plural number of inputs, or a signal may be output to an optional one of plural signal lines. If it is desired to raise the electrical conductivity across the optionally selected one of the input/output terminals 160 of the selector circuit and the input/output terminal 162, a preset voltage is applied to the optionally selected one of the input/output terminals 160, while another voltage is applied to other ones of the input/output terminals 160. At this time, the input/output terminal 162 is open-circuited, or is biased to a preset voltage via a transistor or a resistor.

Figure 7:
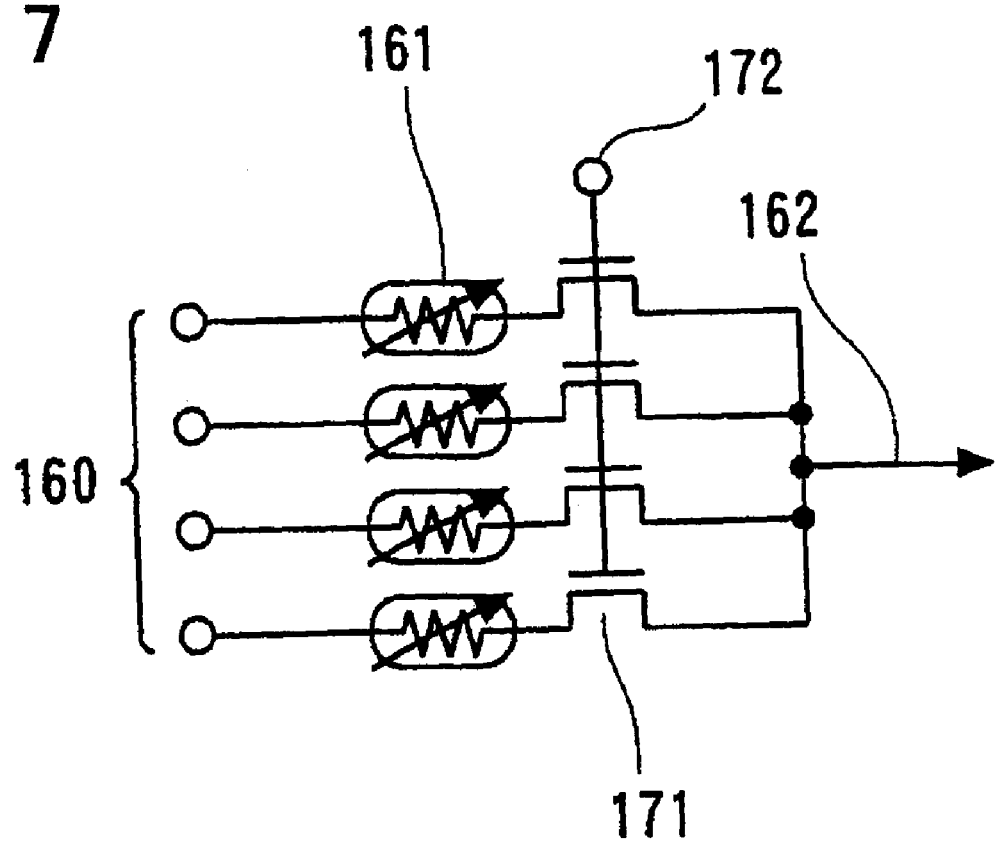
FIG. 7 is a diagram showing the structure of a modification of a programmable selector circuit employing a switch element according to the present invention.

FIG. 7 shows the structure of a modification of the present invention. In the present embodiment, a control gate is added to the selector shown in FIG. 6. Referring to FIG. 7, the selector circuit according to the present embodiment includes a plural number of input/output terminals 160, a plural number of switch elements 161, a plural number of transistors 171, a control input 172 and an input/output terminal 162.

In the circuit of FIG. 7, it is possible to turn off the transistor 171, by a signal applied from the control input 172, so as not to apply the voltage or the current to the switch elements 161. By so doing, the measly transistor 171 connected to the switch element 161 which is desired to be programmed may be turned on, with other transistors 171 being turned off, for selectively programming the switch element 161. The transistors 171 may be arranged across the switch elements 161 and the input terminal 160. The control input 172, connected to the gate terminal of the transistor 171 may be connected common for all transistors, or distinct control inputs may be connected to the respective transistors.

Figure 8:
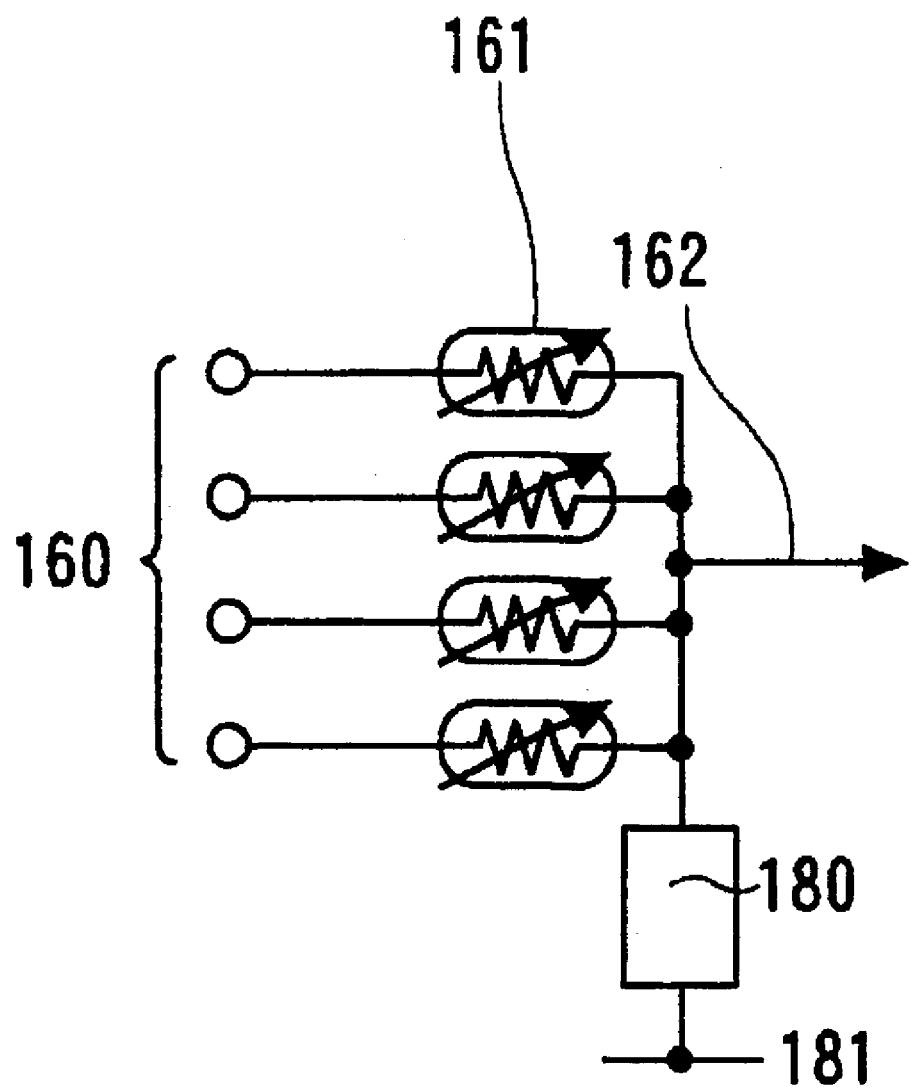
FIG. 8 is a diagram showing the structure of another modification of a programmable selector circuit employing a switch element according to the present invention.

FIG. 8 shows the structure of another modification of the present invention. In the present embodiment, a bias circuit is added to the selector circuit of FIG. 6 or 7. Referring to FIG. 8, the selector circuit of the present embodiment includes a plural number of input/output terminals 160, a plural number of switch elements 161, a circuit 180 made up by transistors, resistors or combination thereof, a constant voltage source 181 and an input/output terminal 162.

The circuit of FIG. 8 is configured for applying an optimum voltage across two terminals of the switch element 161 in programming the switch elements 161. For example, the switch element 161 is turned on when a positive voltage and a negative voltage are applied to the input/output terminals 160 (this state being referred to as 'forward bias'), while being turned off when the voltage applying state is the opposite of the above state (this state being referred to as 'reverse bias'). It is assumed that a voltage of 1V is applied to one of the input/output terminals 160, a voltage of 0V is applied to the other ones of the input/output terminals 160, with the input/output terminal 162 being open-circuited and with the constant voltage source 181 being 0V. In this case, the input/output terminal 162 is grounded at 0V through the resistor or the transistor 180, and 1V is applied from the input terminal 160 to one of the switch elements 161 (labeled switch element A), and hence a forward voltage is applied to the switch element A which is thereby turned on. Then, 1V is applied from the input terminal 160 via switch element A to the input/output terminal 162 to raise the potential thereat. Since a reverse bias is applied to the switch elements other than the switch element A, these other switch elements are turned off. By adding a circuit which will set the voltage at the input/output terminal 162 to a proper value, the electrical conductivity of an optional switch element may be made higher. Such a programming method is also possible in which the resistor or the transistor 180 is also added to the input/output terminal 160 to impart the bias voltage to the input/output terminal 160.

Figure 9:
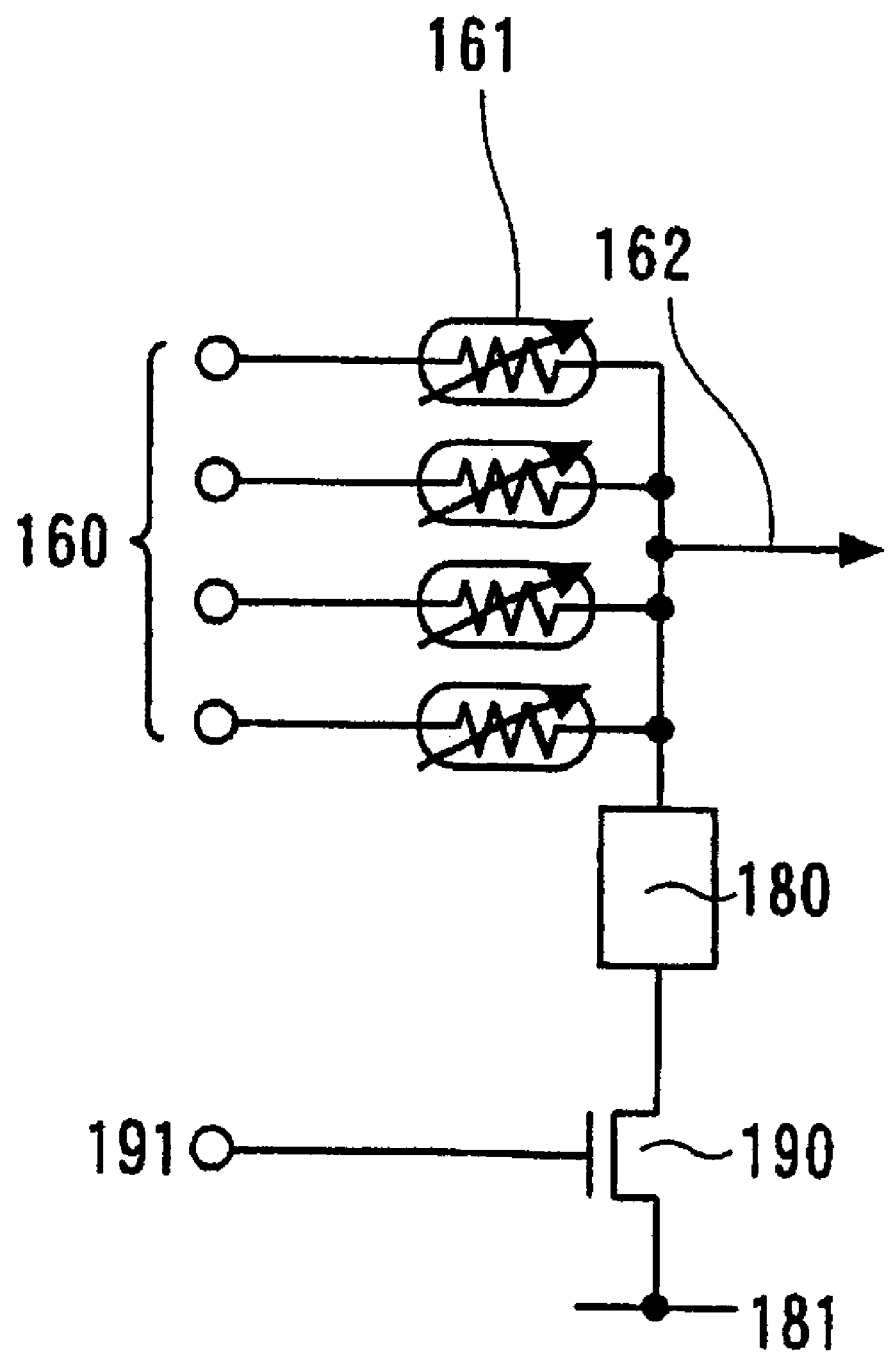
FIG. 9 is a diagram showing the structure of yet another modification of a programmable selector circuit employing a switch element according to the present invention.

FIG. 9 shows the structure of a further modification of the present invention. In the present embodiment, a control gate is added to the selector circuit of FIG. 8. Referring to FIG. 9, the selector circuit of the present embodiment includes a plural number of input/output terminals 160, a plural number of switch elements 161, a circuit 180 made up by a transistor, a resistor or combination thereof, a transistor 190, a constant voltage source 181, a control input 191 and an input/output terminal 162.

In the circuit shown in FIG. 9, the transistor 190 may be turned off by the control input 191. By so doing, the circuit 180 may be in operation so that, in programming the switch elements 161, a proper voltage will be applied, while the circuit 180 may be rendered inoperative, insofar as the selector operation is concerned, by turning the transistor 190 off during operation as a selector, thereby being able to make the circuit refrain from exercising influence on the operation of the selector.

Figure 10:
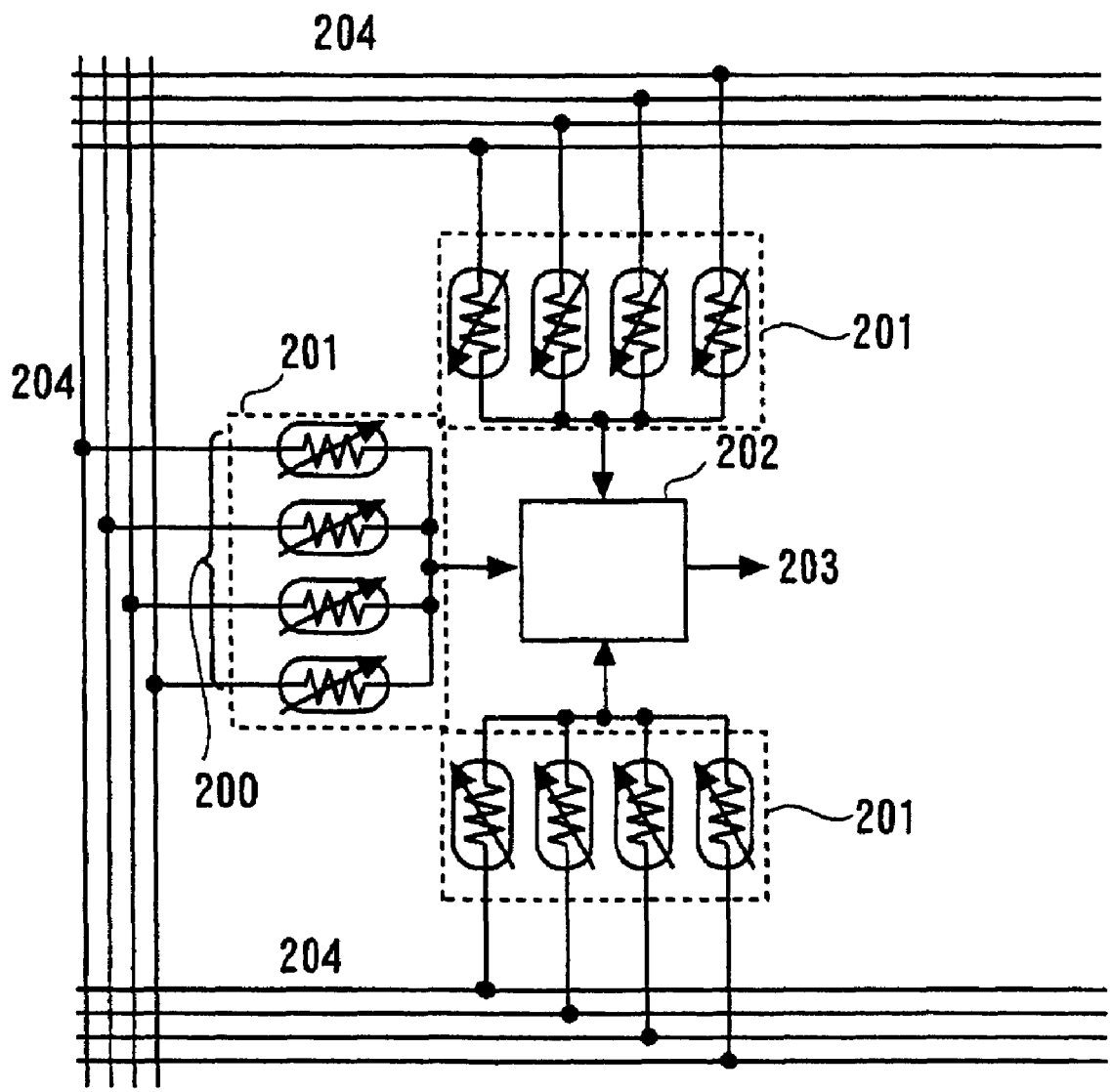
FIG. 10 is a diagram showing the structure of an embodiment of a logic circuit having a selector employing a switch element according to the present invention.

FIG. 10 shows, as a further modification of the present invention, one of examples of application of the selector circuits of the embodiments shown in FIGS. 6 to 9. Referring to FIG. 10, the semiconductor integrated circuit of the present embodiment includes a plural number of input terminals 200, a selector circuit 201, such as one described above, a logic circuit 202, an output terminal 203, and a global wiring 204. The global wiring 204 is a wire, with a length from tens of μm to several mm, and is used for connection to other logic circuits.

In the circuit shown in FIG. 10, one of the input terminals 200 is connected by the selector circuit 201 to one of the input terminals of the logic circuit 202. The operation of an output 203 of the logic circuit is changed depending on which one of the input terminals thereof is selected by the selectors 201. In this manner, connection may be changed to the logic circuit 202 and to the global wiring 204 connected to other logic circuits.

Figure 11:
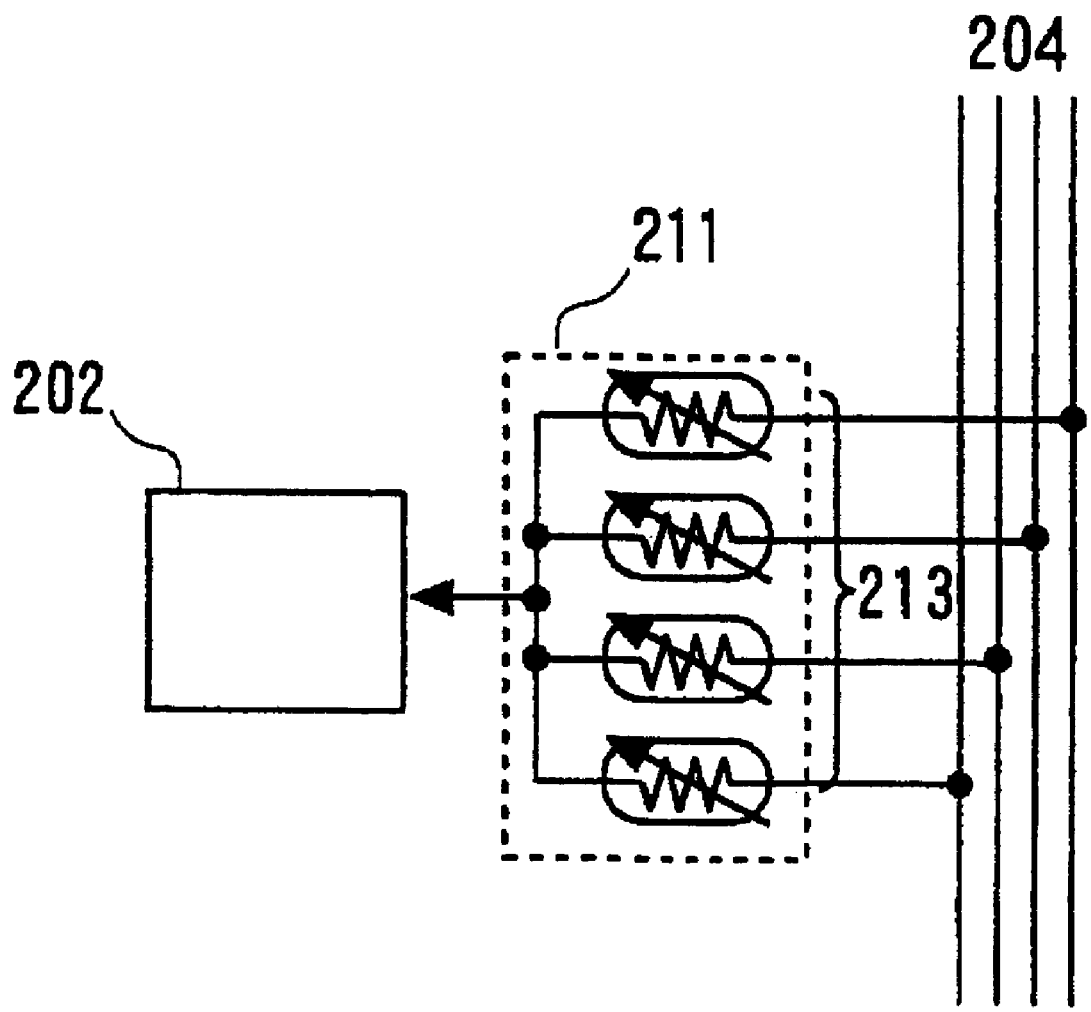
FIG. 11 is a diagram showing the structure of a modification of a logic circuit having a selector employing a switch element according to the present invention.

FIG. 11 shows, as a further modification of the present invention, one of the examples of application of the selector circuit of the present invention shown in FIGS. 6 to 9. Referring to FIG. 11, a semiconductor integrated circuit of the present embodiment includes a selector circuit 211, a logic circuit 202, a plural number of output terminals 213, and a global wiring 204. The global wiring 204 is a wire, with a length from tens of μm to several mm, and is used for connection to other logic circuits. In the circuit shown in FIG. 11, an output of the logic circuit 202 may be propagated by the selector 211 to an optionally selected one or more of the wires of the global wiring 204 of the logic circuit 202.

Figure 12:
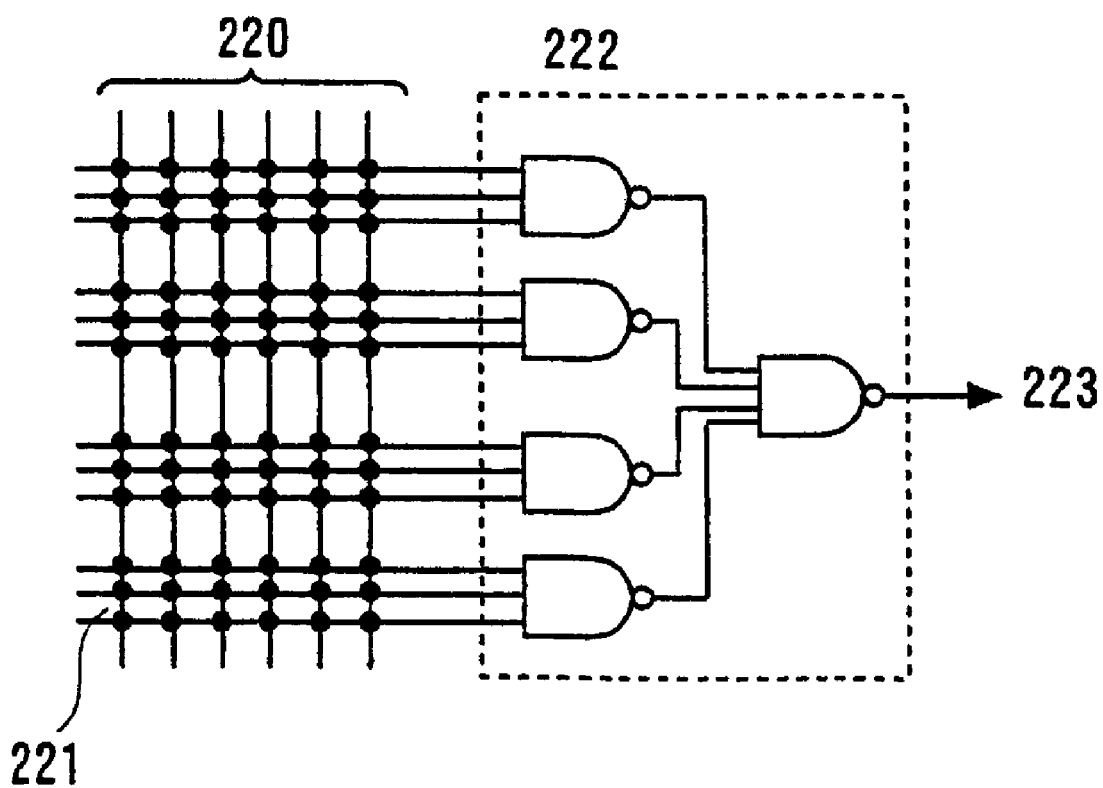
FIG. 12 is a diagram showing the structure of an embodiment of a PLD (Programmable Logic Device) having a selector and a logic gate employing a switch element according to the present invention.

FIG. 12 shows the structure of an embodiment of a programmable logic circuit (semiconductor integrated circuit) employing a switch element of the present invention. Referring to FIG. 12, the present embodiment includes a plural number of input terminals 220, a plural number of switch elements 221, a logic gate 222 and an output terminal 223. If the number of the input terminals 220 is M and the total number of the input terminals of the logic gate 222 is N, the switch elements 221 are arranged at the points of intersections of the matrix array of the wiring, with the total number of the switch elements 221 being M×N.

The switch elements 221 are formed in the interconnection layer, as are the vias 103 of FIG. 1 or the switch elements 118 of FIG. 2, and are designed so that the electrical conductivity across two terminals thereof may be changed.

With the circuit, shown in FIG. 12, the logic function between the input and the output may be changed by the logic circuit (logic gate) 222, comprised of a regular array of simple gates, such as NANDs or inverters, and by the switch elements 221, capable of changing the connection of input/output signals.

FIGS. 13A to 13D show an illustrative structure of the circuit. FIG. 13 shows an example of a semiconductor integrated circuit, employing the interconnection structure of the present invention, and in which the logic function is made programmable. Referring to FIG. 13, the semiconductor integrated circuit of the present embodiment includes a switch matrix 400, NAND gates 401 to 404, inverters 405 to 408, a switch matrix 409, and a switch matrix 410. The points of intersection of the wires of the wiring of each of the switch matrixes 400, 409, 410 are each provided with a switch element of the structure shown in FIG. 1 or 2.

Out of these points of intersection, those in which the vertical wires and the horizontal wires are interconnected by switch elements are represented by black dots 411. Those points of intersection not denoted by the black points 411 are those in which the switch elements interconnecting the vertical and horizontal wires are open-circuited and hence are not in the connecting states.

Figure 13A:
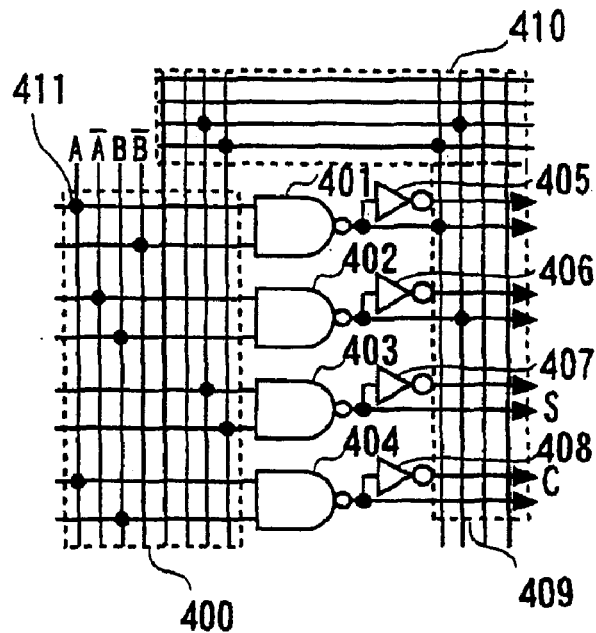
FIG. 13 is a diagram showing an example of a semiconductor integrated circuit, with a programmable logic function, employing a switch element according to the present invention, FIGS. 13A and 13B showing a half-adder and an equivalent circuit thereof and FIGS. 13C and 13D showing a flip-flop and an equivalent circuit thereof.
Figure 13B:
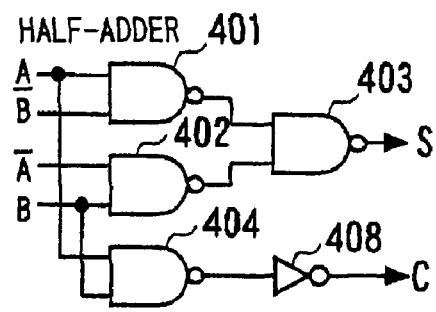

FIG. 13A shows an example in which a half-adder is constructed using this semiconductor integrated circuit. By properly programming the switch matrixes 400, 409 and 410, it is possible to change the connection of the logic gates 401 to 408 to construct a circuit equivalent to the half-adder shown in FIG. 13B.

Figure 13C:
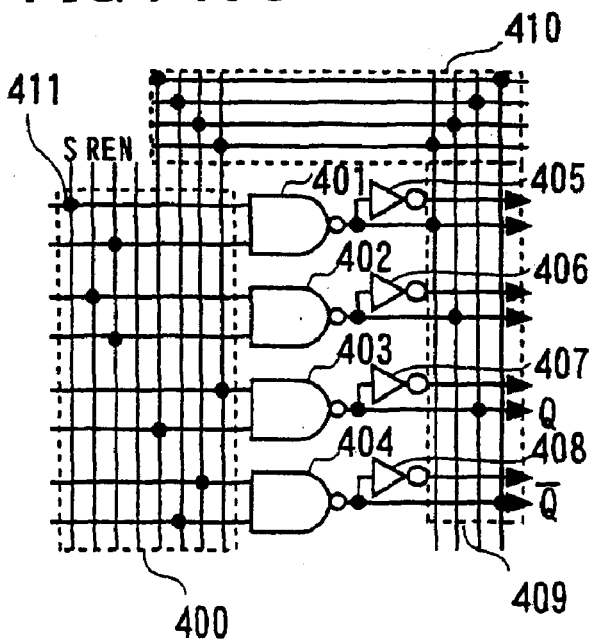
Figure 13D:
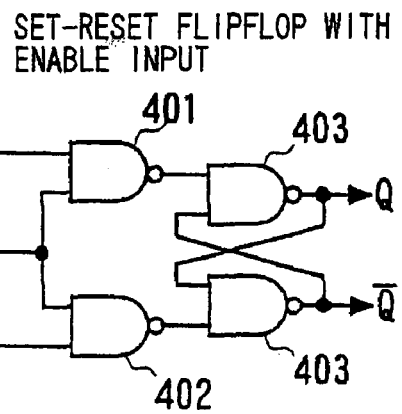

FIG. 13C shows an example in which a set-reset flip-flop with an enable input is constructed using this semiconductor integrated circuit. By properly programming the switch matrixes 400, 409 and 410, it is possible to change the connection of the logic gates 401 to 408 to construct a circuit equivalent to the set-reset flip-flop with an enable input shown in FIG. 13D.

Figure 14:
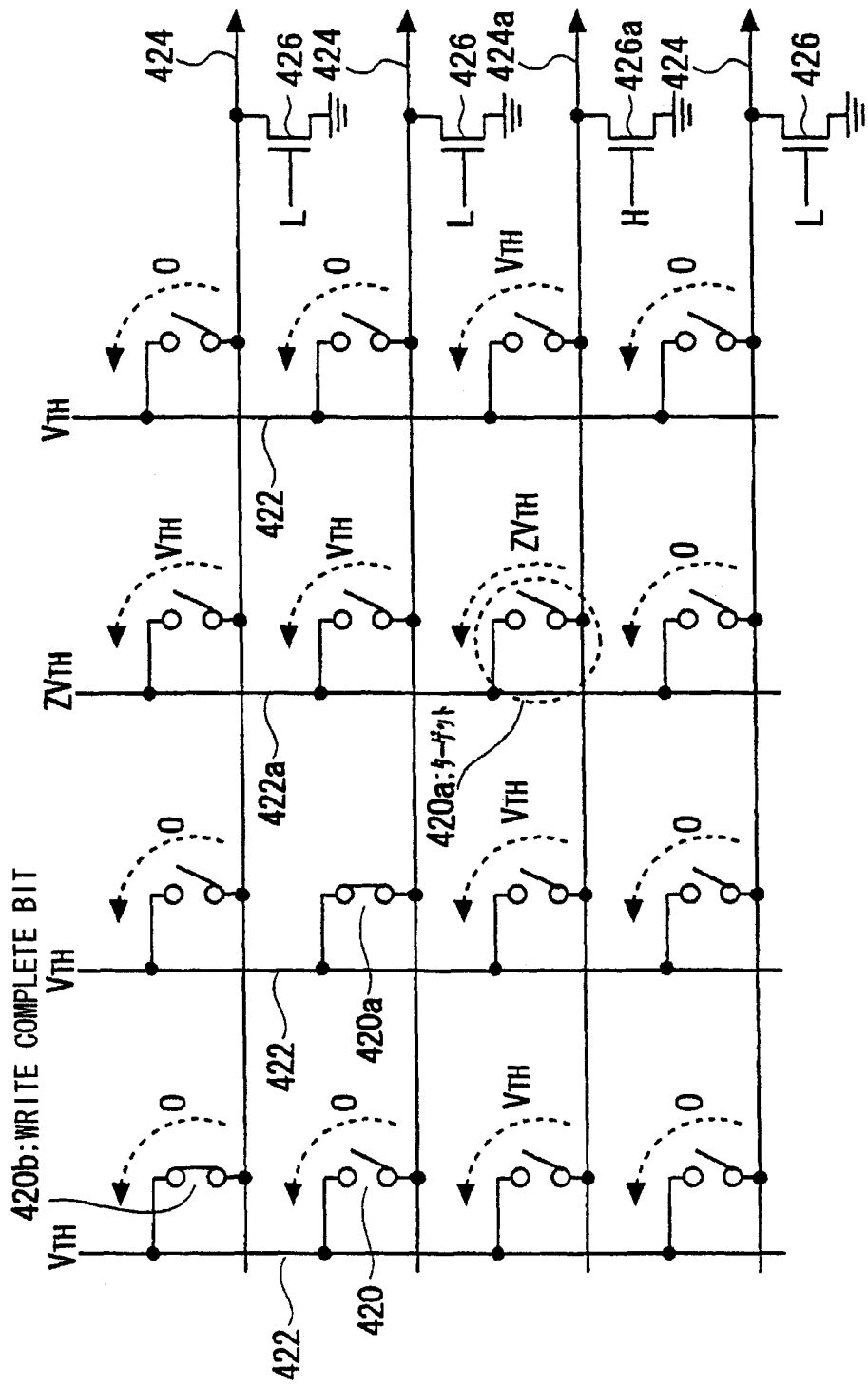
FIG. 14 illustrates an example of a method for changing the connection of a switch matrix of the semiconductor integrated circuit shown in FIG. 13.

FIG. 14 illustrates a typical method for changing the connection of the switch matrixes 400, 409 and 410 of the semiconductor integrated circuit shown in FIG. 13. Referring to FIG. 14, the switch matrix includes horizontal wires 424, vertical wires 422, switch elements 420 and transistors 426 for setting the horizontal wires 424 at a constant potential. The switch elements 420 are the switch elements formed in the interconnection layer shown in FIG. 1 or 2, with the number of the switch elements 420 being equal to the number of the points of intersection of the vertical and horizontal wires. For example, if the number of the vertical wires 422 is m and that of the horizontal wires 424 is n, a number of the switch elements arranged is equal to the number of the points of intersection of the vertical and horizontal wires. It is now assumed that the switch elements are off in the initial state. It is also assumed that, when a positive voltage is applied to one of the terminals of the switch element connected to the vertical wire 422 and a negative voltage is applied to the other terminal thereof connected to the horizontal wire 424, the potential difference across the two terminals is larger than a threshold value $V_{TH}$, the switch element in question transfers to an ON state.

If, with the circuit shown in FIG. 14, a target switch element 420a is set from the off-state to the on-state, a voltage higher than the threshold voltage $V_{TH}$ (herein a voltage of $2V_{TH}$) is applied to a vertical wire 422a connected to the switch element 420a. A horizontal wire 424a, connected to the switch element 420a, is grounded by turning a transistor 426 on. Since the voltage $2V_{TH}$, higher than the threshold voltage $V_{TH}$, is applied across both terminals of the target switch element 420a, the switch transfers to the on-state. At this time, a voltage lower than the threshold voltage $V_{TH}$ (herein a voltage of $V_{TH}$) is applied to the vertical wires 422 not connected to the target switch element 420a. On the other hand, the voltage $V_{TH}$ of the vertical wires 422 is propagated to the horizontal wires 424, not connected to the switch element 420a, because the transistors are off. Hence, $2V_{TH}$ and $V_{TH}$ are applied to both terminals of the devices, connected to the vertical wire 422a and the horizontal wires 424, so that the voltage across these terminals is $V_{TH}$. Since this voltage does not exceed the threshold voltage $V_{TH}$, the switch state is not changed. The voltage $V_{TH}$ and 0V are applied to both terminals of the devices connected to the vertical wires 422 and to the horizontal wire 424a, so that the voltage across these terminals is again $V_{TH}$. Since this voltage does not exceed the threshold voltage $V_{TH}$, the switch state is not changed. The voltage $V_{TH}$ is applied to both terminals of the devices connected to the vertical wires 422 and to the horizontal wires 424, the voltage across these terminals is zero, and hence the switch state is not changed. In this manner, only the state of the optionally selected switch element 420a may be changed to the on-state.

Figure 15:
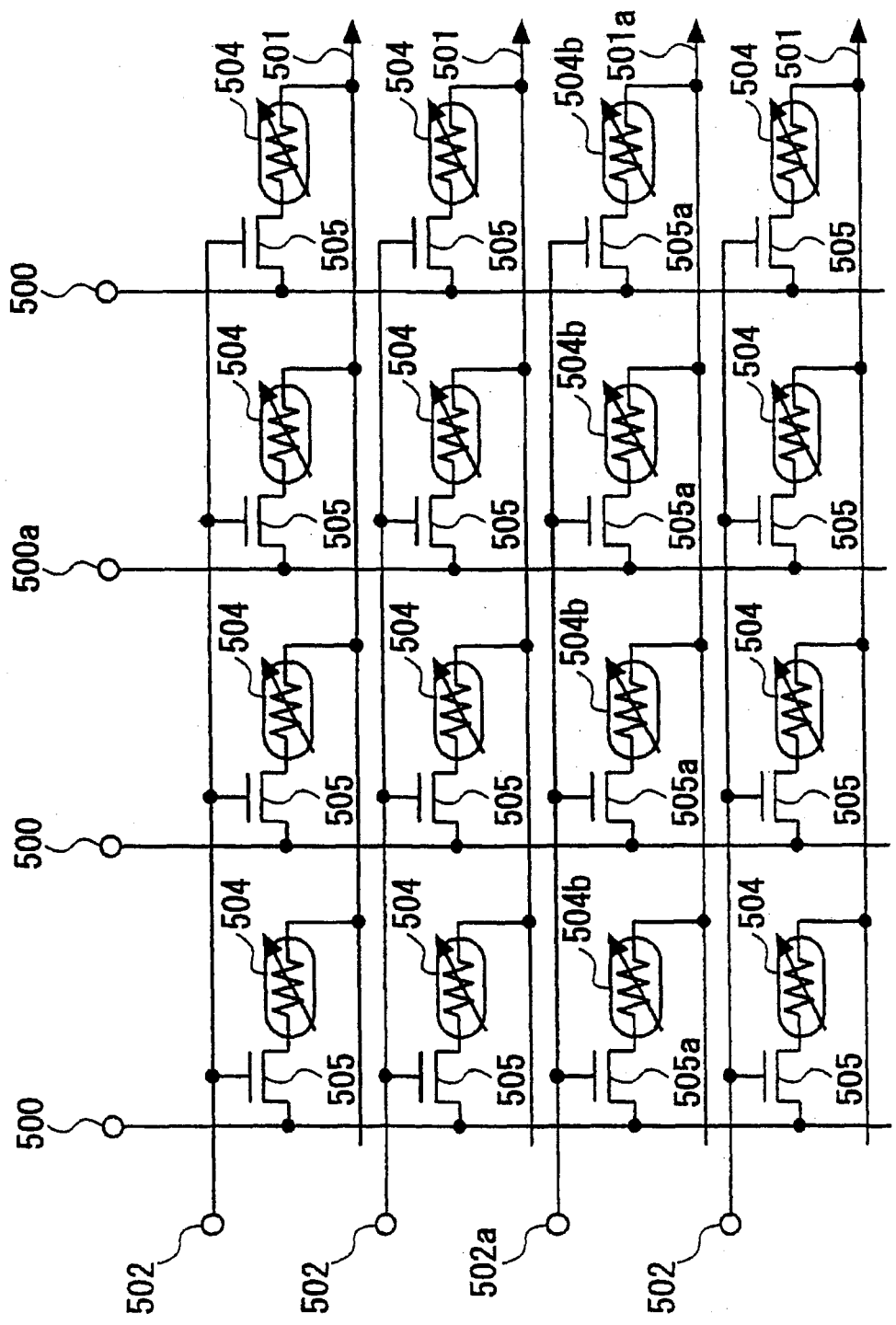
FIG. 15 illustrates an example of a method for changing the connection of a switch matrix of the semiconductor integrated circuit shown in FIG. 13.

FIG. 15 shows a typical method for changing the connection of the switch matrixes 400, 40 and 410 of the semiconductor integrated circuit shown in FIG. 13. Referring to FIG. 15, the switch matrix shown includes horizontal wires 501, vertical wires 500, switch elements 504, transistors 505 connected in series across the vertical wires 500 and the switch elements 504, and control lines 502 for controlling the gate terminals of the transistors 505. The switch elements 504 are the switch elements 103 or 118, formed in the interconnection layers shown in FIG. 1 or 2, with the number of the switch elements 504 being equal to the number of the points of intersection of the vertical and horizontal wires. For example, with the number of the vertical wires equal to m and the number of the horizontal wires equal to n, the number of the switches provided is m×n. It is assumed that the switch element is changed to an on-state when a positive voltage is applied to the one of the two terminals thereof connected to the vertical wires 500 and a negative voltage is applied to the other terminal thereof connected to the horizontal wires 501, and that the switch element is changed to an off-state when the state of voltage application is reversed.

If, in the circuit shown in FIG. 15, a target switch element 504a is turned on to connect a vertical wire 500a to a horizontal wire 501a, the voltage on the order of 1V is applied to the vertical wire 500a, connected to the switch element 504a. The vertical wires 500, not connected to the switch element 504a, are grounded. Moreover, the voltage from the control terminal 502a is applied to the gate of the transistor 505a, connected to the switch element 504a, to turn the transistor 505a on. Other control terminals 502 are grounded. The voltage applied across the vertical wire 500a and the vertical wire 500 neighboring thereto is subjected to resistance division by the target switch element 504a and the switch elements 504b other than the target switch element 504a, such that a forward voltage and a reverse voltage are applied to the switch element 504a and to the switch elements 504b, respectively. The switch element 504a, supplied with the forward bias, is changed to an on-state, while the switch element 504b, supplied with the reverse bias, is changed to an off-state. After transition to the off-state of the totality of the switch elements 504b, supplied with the reverse bias, the horizontal wires 501a may be grounded to apply the forward bias further to the switch elements 504b.

Since the switch element 504a and the switch elements 504b are turned on and off, respectively, in this manner, the optionally selected wires 500a, 501a are connected to each other. Since the control line 502 is grounded at this time, the transistor 505 is off, and no voltage is applied across both terminals of the switch element 504, with the impedance of the switch element 504 not being changed. Hence, the switch elements connected to the other horizontal wires 501 remain unaffected.

Figure 16:
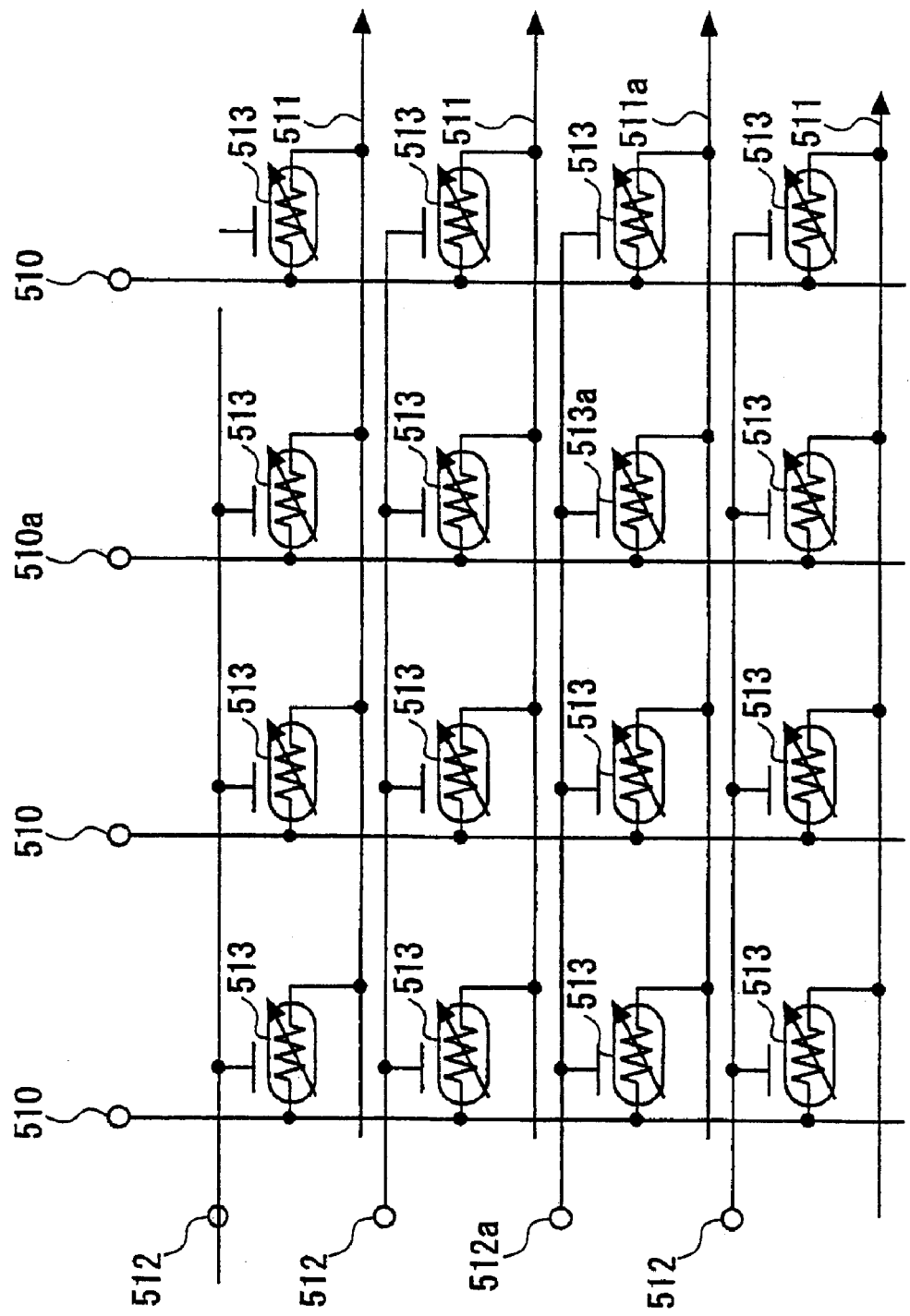
FIG. 16 illustrates an example of a method for changing the connection of a switch matrix of the semiconductor integrated circuit shown in FIG. 13.

FIG. 16 illustrates the method for changing the connection of the switch matrixes 400, 409 and 410 of the semiconductor integrated circuit shown in FIG. 13. Referring to FIG. 16, the switch matrix shown includes horizontal wires 511, vertical wires 510, switch elements 513, and control lines 512 for controlling the gate terminals of the switch elements 513. The switch elements 513 are the switch elements 118, formed in the interconnection layers shown in FIG. 2, with the number of the switch elements 118 being equal to the number of the points of intersection of the vertical and horizontal wires. For example, with the number of the vertical wires equal to m and the number of the horizontal wires equal to n, the number of the switches provided is m×n.

It is assumed that, in case a positive voltage is applied to one of three terminals of the switch element 513, connected to the control line 512, that is, a gate terminal, and a negative voltage is applied to at least one of the terminals connected to the vertical wire 510 and the terminals connected to the horizontal wire 511, the switch element 513 is transferred to the on-state, and that, if the state of voltage application is reversed, the switch element 513 is transferred to the off-state.

If, in the circuit shown in FIG. 16, the target switch element 513a is turned on to interconnect the vertical wire 510a and the horizontal wire 511a, the vertical wire 510a, connected to the switch element 513a, is grounded. A voltage on the order of 1V is applied to the vertical lines 510 not connected to the switch element 513a. A voltage on the order of 1V is applied to the control terminal 512a connected to the switch element 513a, while other control terminals 512 are open-circuited. The positive voltage then is applied to the control gate of the switch element 513a, and the terminal connected to the vertical wire 510a is grounded, so that the switch element 513a is turned on. The voltage on the order of 1V is applied to both the control gate and the vertical wire, and hence the state of the switch element 513b is not changed. The switch elements 513, connected to the control lines 512, have the control terminals open-circuited, and hence no electrons are exchanged at the control terminals, so that the state of the switch elements 513 is not changed. With the switch element 513a turned on, in this manner, the optionally selected wire 510a, 511a may be connected to each other.

Figure 17A:
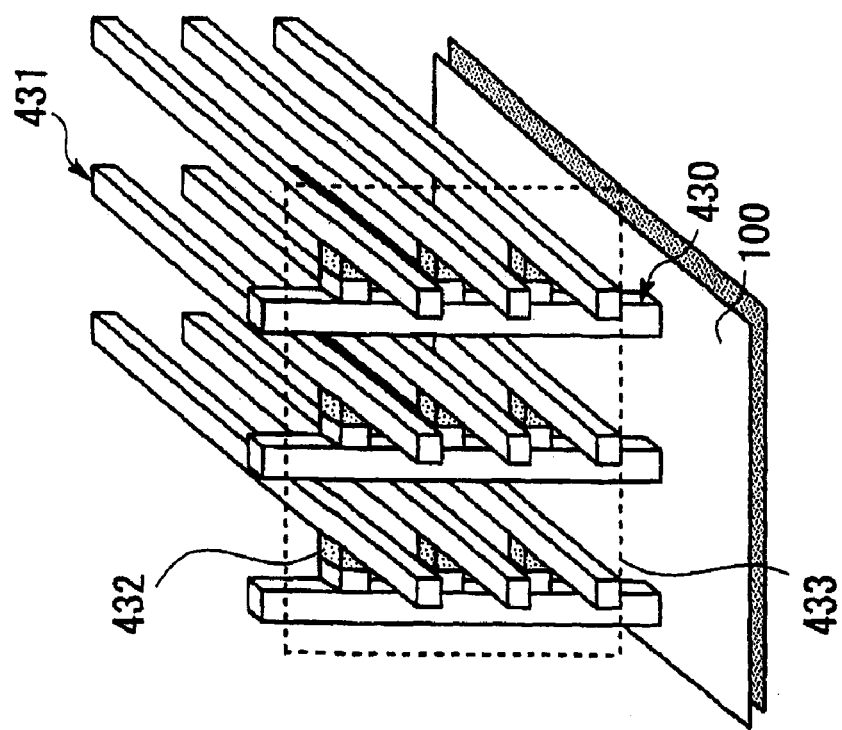
FIG. 17 is a diagram showing an embodiment of a three-dimensional set-up of a switch matrix of the semiconductor integrated circuit shown in FIG. 13.
Figure 17B:
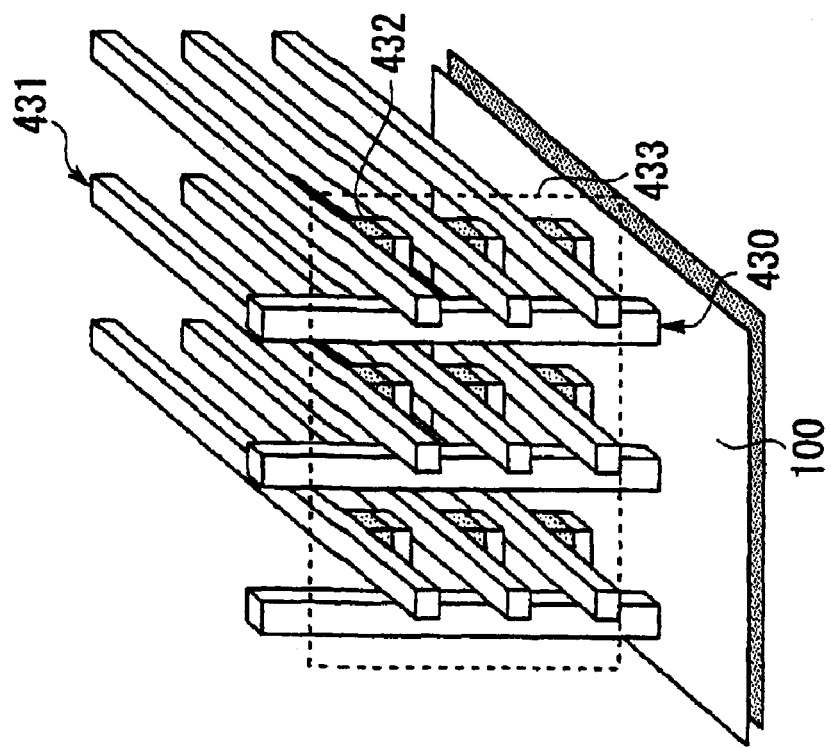

FIGS. 17A and 17B show an embodiment of a three-dimensional structure of the switch matrixes 400, 409 and 410 of the semiconductor integrated circuit shown in FIG. 13. Referring to FIGS. 17A and 17B, the switch matrix includes a semiconductor substrate 100, wires 431 formed thereon, and switch elements 432 for interconnecting (shorting) or open-circuiting the wires. The switch elements 432 are arranged two-dimensionally or three-dimensionally on the interconnection layer to from a switch matrix 433 on a plane distinct from the plane of the semiconductor substrate 100. In FIG. 13, the logic gates 401 to 408 are formed on the semiconductor substrate 100. In FIG. 17A and FIG. 17B, the switch elements 432 are arranged along the vertical direction between the wires 431 of the different interconnection layers, and between the vertical and horizontal wires (on the same interconnection layer), respectively.

Figure 18:
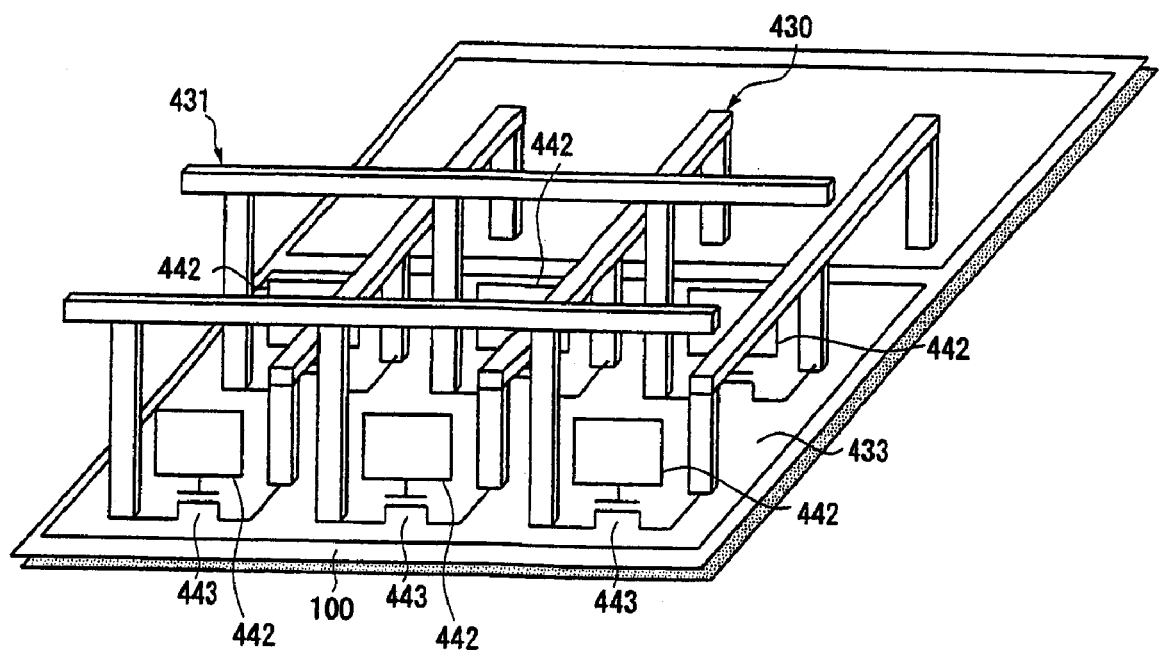
FIG. 18 is a diagram showing an example of a three-dimensional structure of a switch matrix according to a Comparative Example.

FIG. 18 depicts an example of the three-dimensional structure of a switch matrix representing a Comparative Example (in which any structure of the present invention is not adopted). Referring to FIG. 18, the switch matrix 433 includes a semiconductor substrate 100, a wire 431, a memory device 442, formed on the semiconductor substrate 100, and a pass transistor 443 formed on the semiconductor substrate 100. The switch matrix is in need not only of the interconnection layer, but also of a memory circuit or pass transistors on the semiconductor substrate, and is formed in a location distinct from a logic gate 430, thus excessively increasing the circuit area. The signal propagation delay is increased because of the large on-resistance of the pass transistors. Moreover, such problems may also be expected to be raised in future that leakage current of the circuitry formed on the semiconductor substrate becomes large or that the configuration information stored in the memory device is destroyed by soft error. From the above reason, the switch matrix of the present invention, shown in FIG. 17, is more favorable than the structure of the prior art in the area, delay, leak current or tolerance against soft error.

Figure 19:
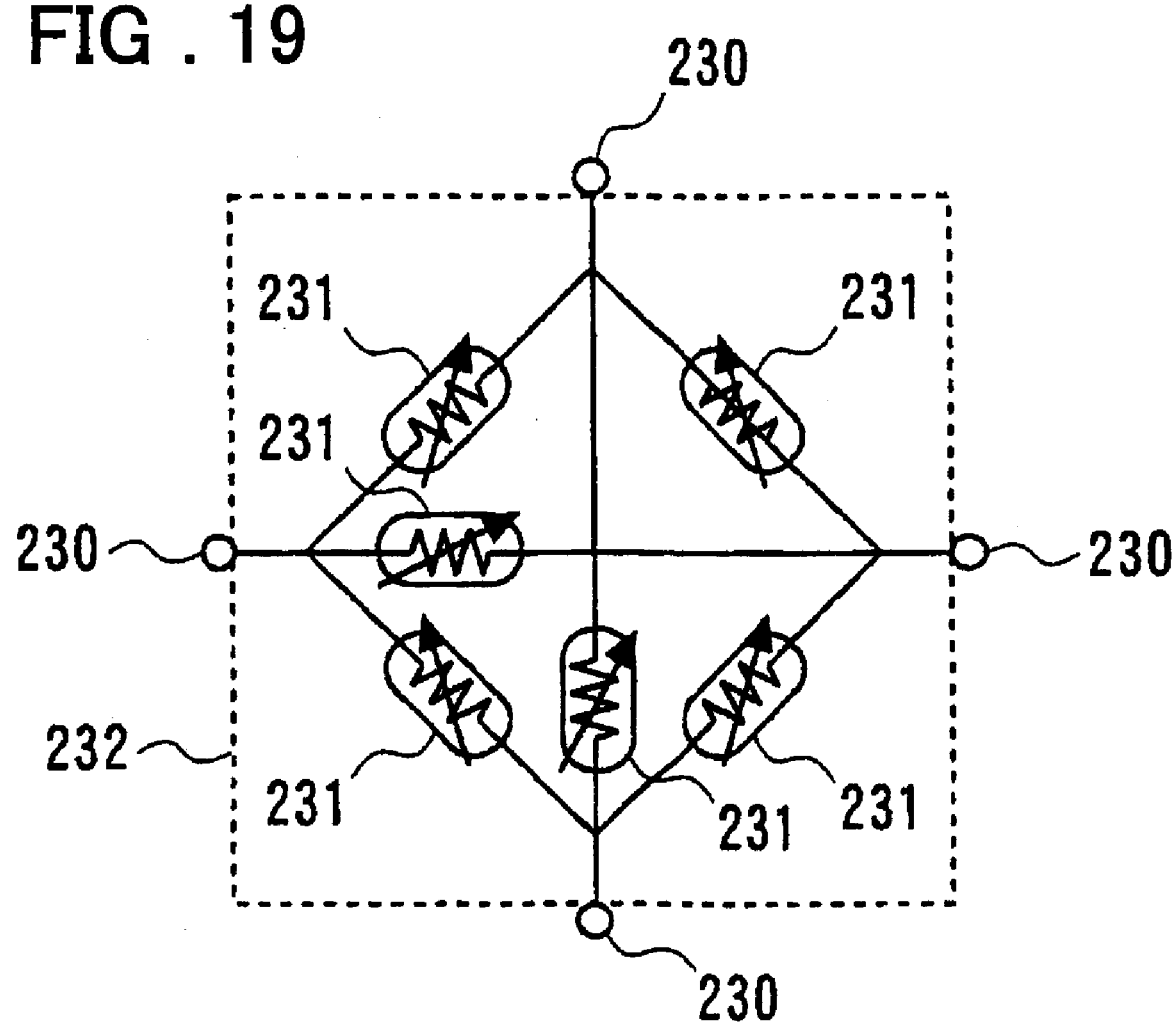
FIG. 19 is a diagram showing an embodiment of a programmable semiconductor integrated circuit employing an interconnection structure according to the present invention.

FIG. 19 shows an embodiment of a switch box exploiting the interconnection structure of the present invention. Referring to FIG. 19, the switch box of the present embodiment includes a plural number of input/output terminals 230, and a plural number of switch elements 231 interconnecting two of the input/output terminals 230. The switch elements 231 are formed as an interconnection layer, as are 103 of FIG. 1 or 118 of FIG. 2, so that the electrical conductivity across the two terminals may be changed.

The circuit shown in FIG. 19 interconnects an optional input/output terminal to another optional input/output terminal by turning on an optional switch element. In addition, a signal supplied from one terminal may be output to plural nodes of wires by turning on plural switch elements.

The switch elements may be arranged for the totality or a fraction of combinations of two terminals as selected from the input/output terminals 230. FIG. 19 shows an example in which there are provided four input/output terminals 230 and the switch elements are provided for the totality of combinations of two terminals selected from these input/output terminals. When the switch elements are provided for the totality of combinations of the two of the N input/output terminals, the number of the switch elements needed is $_NC_2$.

Figure 20:
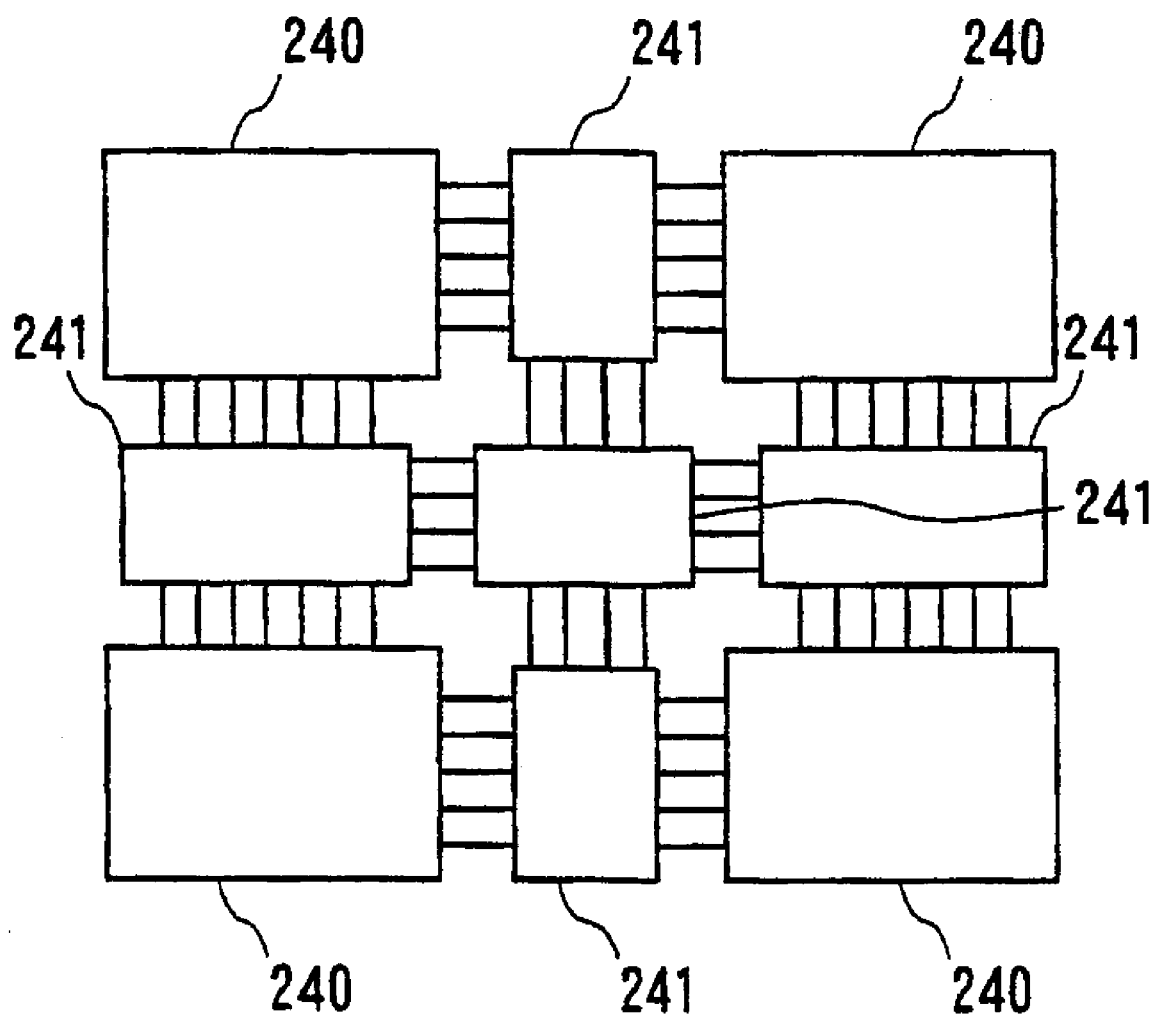
FIG. 20 shows an embodiment of a programmable semiconductor integrated circuit exploiting the interconnection structure of the present invention.

FIG. 20 shows an embodiment of a programmable semiconductor integrated circuit exploiting the interconnection structure of the present invention. Referring to FIG. 20, the semiconductor integrated circuit of the present embodiment includes a plural number of logical blocks 240 and switch boxes 241 for interconnecting the logical blocks.

The logic blocks 240 represent an embodiment configured so that the logical function between the input and the output may optionally be programmed by the combination of the logic gate and the programmable switches of FIG. 12 and the lookup table of FIG. 5. The switch boxes 241 are each formed by a set of the selectors of FIG. 6 or the switch boxes of FIG. 19, and may be used for connecting an optional input/output terminal to another input/output terminal. By optionally interconnecting logical blocks, each having programmed an optional logic function, it is possible to implement a semiconductor integrated circuit having implemented a desired function.

Figure 21A:
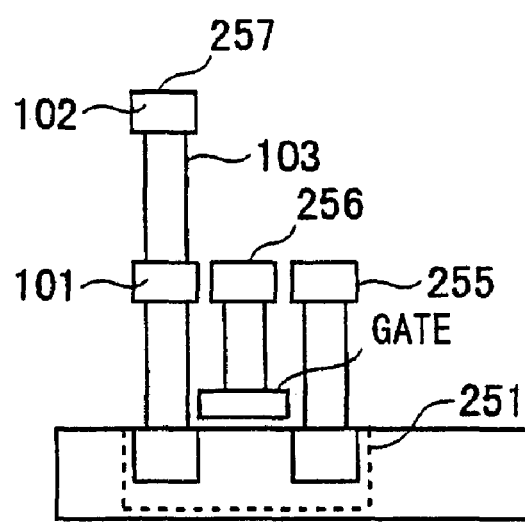
FIG. 21 shows the structure of an embodiment of a memory cell employing the interconnection structure according to the present invention, FIG. 21A showing the cross-sectional structure thereof and FIG. 21B showing the circuit structure thereof.
Figure 21B:
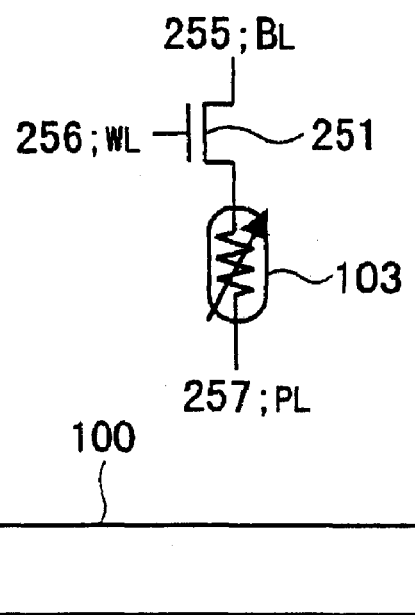

FIGS. 21A and 21B show the structure of an embodiment of a memory cell exploiting the interconnection structure of the present invention. FIG. 21A shows a cross-sectional structure, and FIG. 21B shows a circuit structure. Referring to FIGS. 21A and 21B, the memory cell of the present embodiment includes a semiconductor substrate 100 and, as components formed on this semiconductor substrate 100, a transistor 251, a first interconnection layer 101, a second interconnection layer 102, a via 103, the electrical conductivity of which may be changed (two-terminal switch element), a bit line 255, a word line 256 and a plate line 257.

The via 103, the electrical conductivity of which may be changed (two-terminal switch element), contains an electrolytic material, such as metal sulfide, as explained with reference to FIG. 1. By the voltage applied across the terminals, or the current flowing through the terminals, metal materials may be precipitated or dissolved in the vicinity of the terminals to vary the electrical conductivity across the terminals. One of the terminals of the via 103, the electrical conductivity of which may be changed, is connected to the source terminal or to the drain terminal of the transistor 251. The source terminal or the drain terminal of the transistor 251, not connected to the via 103, is connected to the bit line 255 or to the plate line 257. The bit line or the plate line 257, not connected to the transistor 251, is connected to the one of the terminals of the via 103 not connected to the transistor 251. The gate terminal of the transistor 251 is connected to the word line 256.

If, in the semiconductor integrated circuit, having a plural number of these memory cells, the electrical conductivity of the via of each memory cell is programmed at the outset, and the voltage of the word line 256 of a given memory cell is acted upon to turn the transistor 251 on and, in this state, an optimum voltage is applied across the bit line 255 and the plate line 257, the programmed information can be read out.

In programming, the voltage on the word line 256 of an optional memory cell is acted upon to turn on the transistor 251 and, in this state, a suited current is applied across or a suited current is caused to flow through the bit line 255 and the plate line 257, to vary the electrical conductivity of the via 103. That is, a memory circuit for information storage may be implemented by exploiting the interconnection structure of the present invention.

Figure 22A:
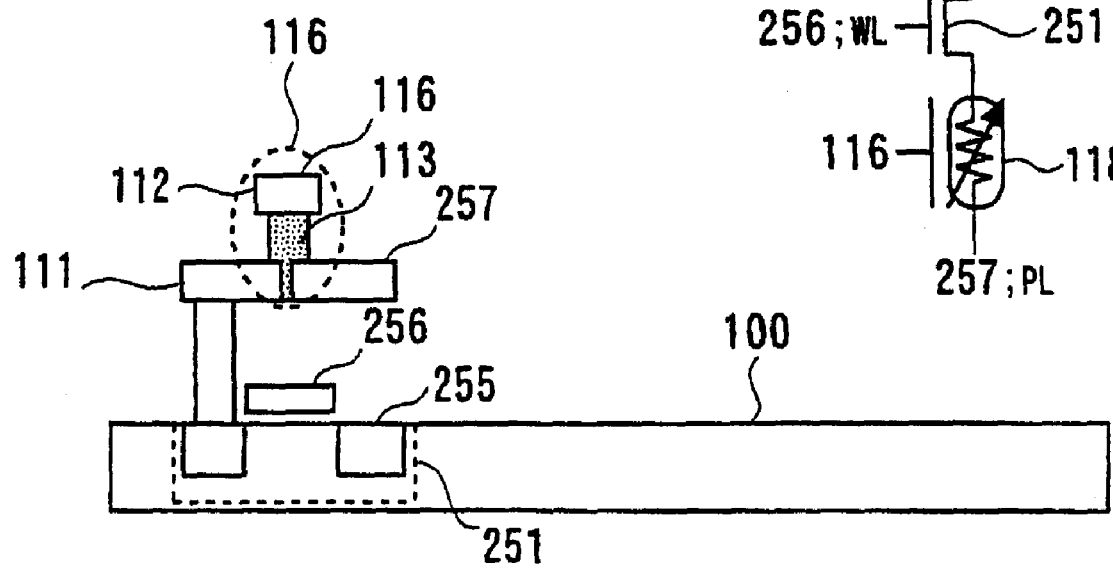
FIG. 22 shows the structure of a modification of a memory cell employing the interconnection structure according to the present invention, FIG. 22A showing the cross-sectional structure thereof and FIG. 22B showing the circuit structure thereof.
Figure 22B:
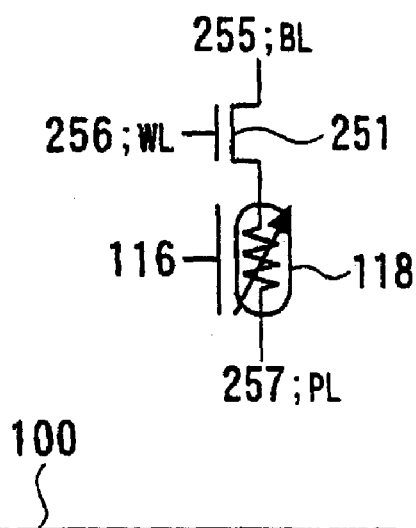

FIGS. 22A and 22B show the structure of a modification of the memory cell exploiting the interconnection structure of the present invention. FIG. 22A shows a cross-sectional structure and FIG. 22B shows a circuit structure. Referring to FIGS. 22A and 22B, the memory cell of the present embodiment includes a semiconductor substrate 100 and, formed on this semiconductor substrate 100, a transistor 251, a first interconnection layer 111, a second interconnection layer 112, an electrolyte material 113, containing e.g. metal oxide, a gate terminal 116 for controlling the amount of metal precipitates in the electrolyte material 113, a bit line 255, a word line 256 and a plate line 257.

The electrolyte material 113 and the gate 116 are each provided with the function of shorting or open-circuiting two wires of the first interconnection layer 111, as shown in FIG. 2. The electrolyte material 113 contains e.g. metal sulfide and, by the voltage applied across the terminals or by the current flowing therethrough, it is possible to precipitate or dissolve the metal material in the vicinity of the terminals to vary the electrical conductivity across the terminals. One of the terminals, contacted with the electrolyte material 113, is connected to the source terminal or to the drain terminal of the transistor 251. The source terminal or the drain terminal of the transistor 251, not connected to the terminal contacted with the electrolyte material 113, is connected to the bit line 255 or to the plate line 257. The bit line or the plate line 257, not connected to the transistor 251, is connected to the one of the terminals contacted with the electrolyte material 113 and which is not connected to the transistor 251. The gate terminal of the transistor 251 is connected to the word line 256.

In the semiconductor integrated circuit, having a plural number of the above-described memory cells, it is possible to pre-program the electrical conductivity of the electrolyte material 113 of each memory cell to act on the voltage of the word line 256 of an optional memory cell to turn on the transistor 251 to detect the electrical conductivity across the bit line 255 and the plate line 257 in this state to read out the programmed information.

During programming, an optimum voltage may be applied across the bit line 255, plate line 257 and the gate terminal 116, or an optimum current may be caused to flow therethrough to vary the electrical conductivity of the electrolyte material 113. Hence, a memory circuit for information storage may be achieved by application of the interconnection structure.

Figure 23:
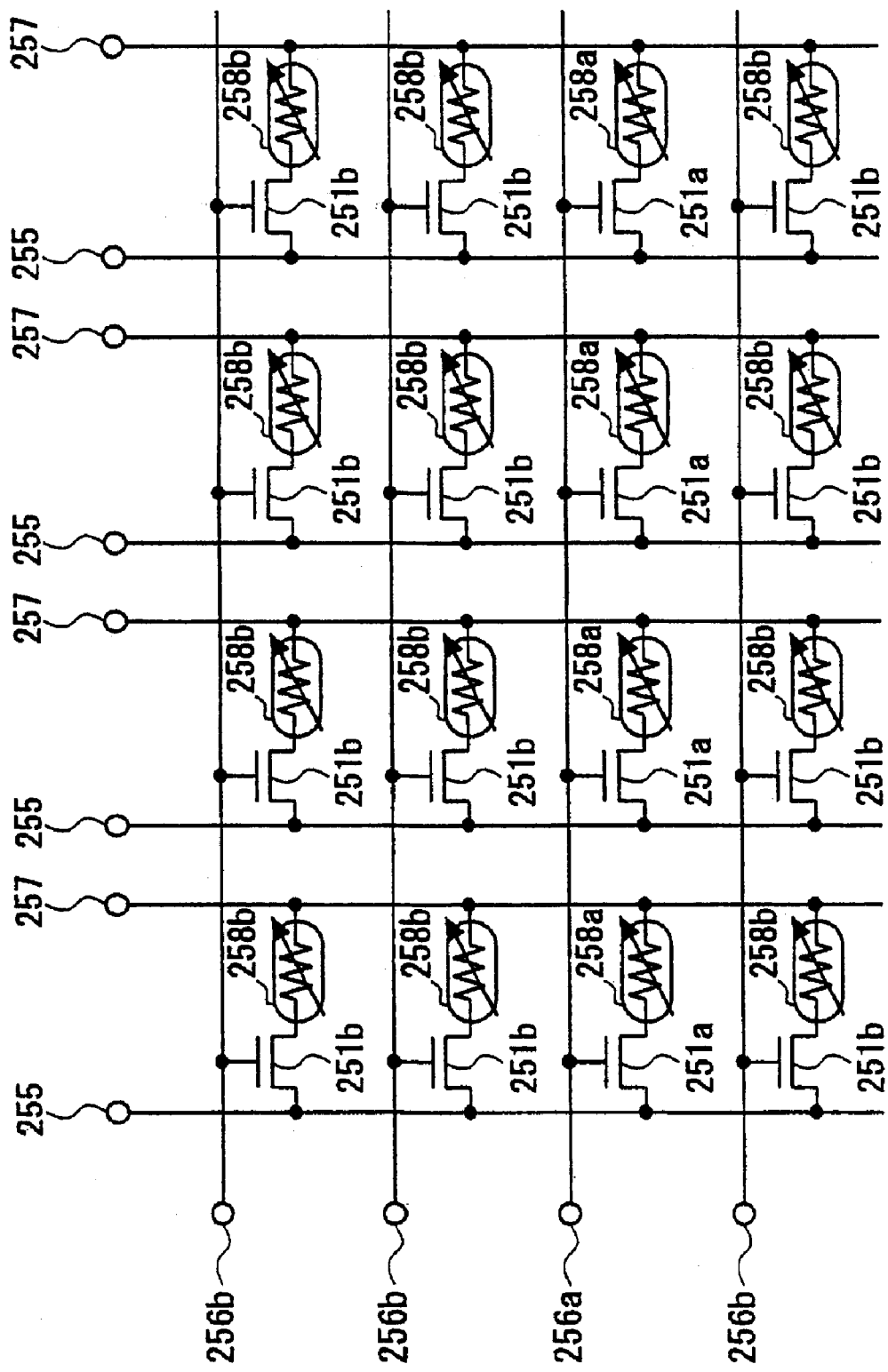
FIG. 23 is a diagram showing the structure of a memory cell array employing a memory cell according to the present invention.

FIG. 23 shows the structure of an embodiment of a memory cell array employing a memory cell of the present invention. Referring to FIG. 23, this memory cell array includes a bit line 255, a word line 256, a switch element 258, an access transistor 251 and a plate line 257. The switch element 258 and the access transistor 251 make up a memory cell, shown in FIG. 21 or 22, with the number of the of the switch element 258 and the access transistor 251 being equal to the number of the points of intersection of the bit lines and word lines. For example, with the number m of the bit lines 255 and that n of the word lines 256, m×n switches are arranged in a matrix configuration.

In the circuit shown in FIG. 23, the memory cell information can be rewritten by varying the impedance of the switch element of the target memory cell. In the present embodiment, a voltage on the order of 1 to 2V is applied to a word line 256a. An access transistor 251a then is turned on and the voltage at the bit line 255 and that at the plate line 257 are applied across two terminals of the switch element 258a. If a forward bias or a reverse bias is applied to the switch element, the impedance of the switch element 258a becomes smaller or larger, respectively. Since the other word lines 256b are grounded, the access transistors 251b are off, such that no voltage is applied across the two terminals of the switch elements 258b, with the impedance not being changed.

In this manner, it is possible to change only the impedance of the memory cell connected to an optionally selected word line.

In reading out the information written in this memory cell, the voltage on the order of 1 to 2V is applied to the word line 256a to which is connected the memory cell of interest to turn on the access transistor 251a. The plate line 257 is set to the ground voltage and the bit line 255 is pre-charged to a voltage on the order of 1 to 2V. If the impedance of the switch element 258a is high, the voltage of the order of 1 to 2V appears on the bit line 255. If conversely the impedance of the switch element 258a is low, the voltage close to 0V appears on the bit line 255.

In this manner, the information written in the memory cell of the selected word line may be read out by detecting the voltage on the bit line. Since the totality of the access transistors 251b of the non-selected memory cells are off, the state of the switch elements 258b does not affect the readout operations.

In the memory cell array, shown in FIG. 23, all of plural memory cells, connected to a given bit line 255, are connected to a common plate line 257, thus in a manner different from the aforementioned switch matrix. That is, although the electrical conductivity across the bit line and the plate line, paired together, can be changed, but no two optional wires can be connected together.

Figure 24:
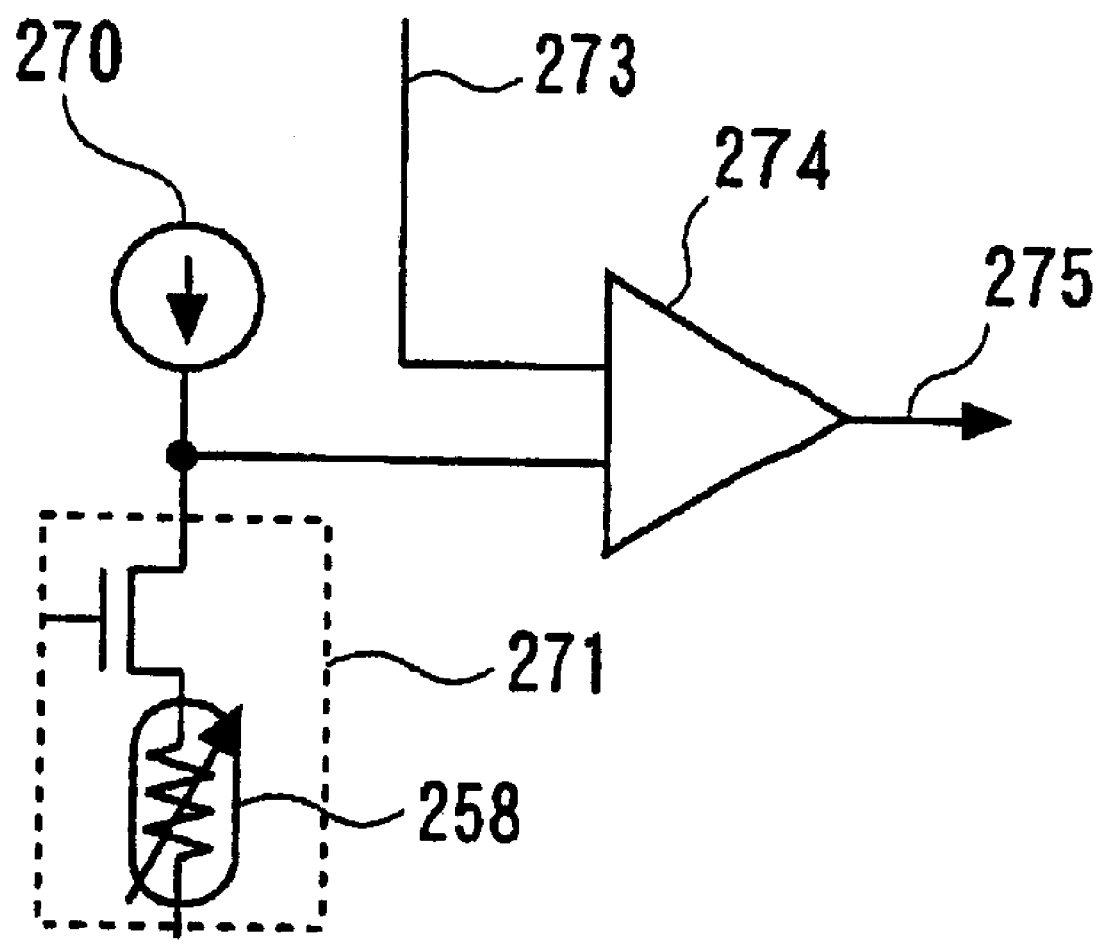
FIG. 24 is a diagram showing the structure of an embodiment of a write circuit or a readout circuit of a memory cell employing an interconnection structure according to the present invention.

FIG. 24 shows the structure of an embodiment of a memory cell write circuit or a memory cell readout circuit employing the interconnection structure of the present invention. Referring to FIG. 24, the write circuit or the readout circuit of the present embodiment includes a current source 270, a memory cell 271, having a switch element 258, a reference voltage 273, a voltage comparator 274, and an output terminal 275.

In the circuit shown in FIG. 24, the current is caused to flow through the memory cell 271. At this time, the voltage appearing at the memory cell 271 is changed with the electrical conductivity of the switch element 258 in the memory cell 271. The voltage comparator 274 compares the voltage appearing at the memory cell 271 with the reference voltage 273 to check whether the voltage at the memory cell 271 is higher or lower than the reference voltage 273. For example, if desired to raise the electrical conductivity of the switch element 258 to a desired value, the current may be caused to flow from the current source 270 to the memory cell 271 to gradually raise the electrical conductivity of the switch element 258, the voltage appearing at the memory cell 271 being gradually lowered. When the voltage appearing at the memory cell 271 becomes smaller than the reference voltage 273, the value at the output terminal 275 of the voltage comparator 274 is changed. Hence, it may be verified that the electrical conductivity of the memory cell 271 has been raised to the desired value.

If conversely it is desired to lower the electrical conductivity of the memory cell 271, the timing at which the voltage at the memory cell 271 becoming higher than the reference voltage 273 is higher than the reference voltage 273 is detected to verify that the desired electrical conductivity has been reached. Thus, by employing the circuit of the present invention, it may be verified whether or not the electrical conductivity of the memory cell has been programmed to a desired value.

Figure 25:
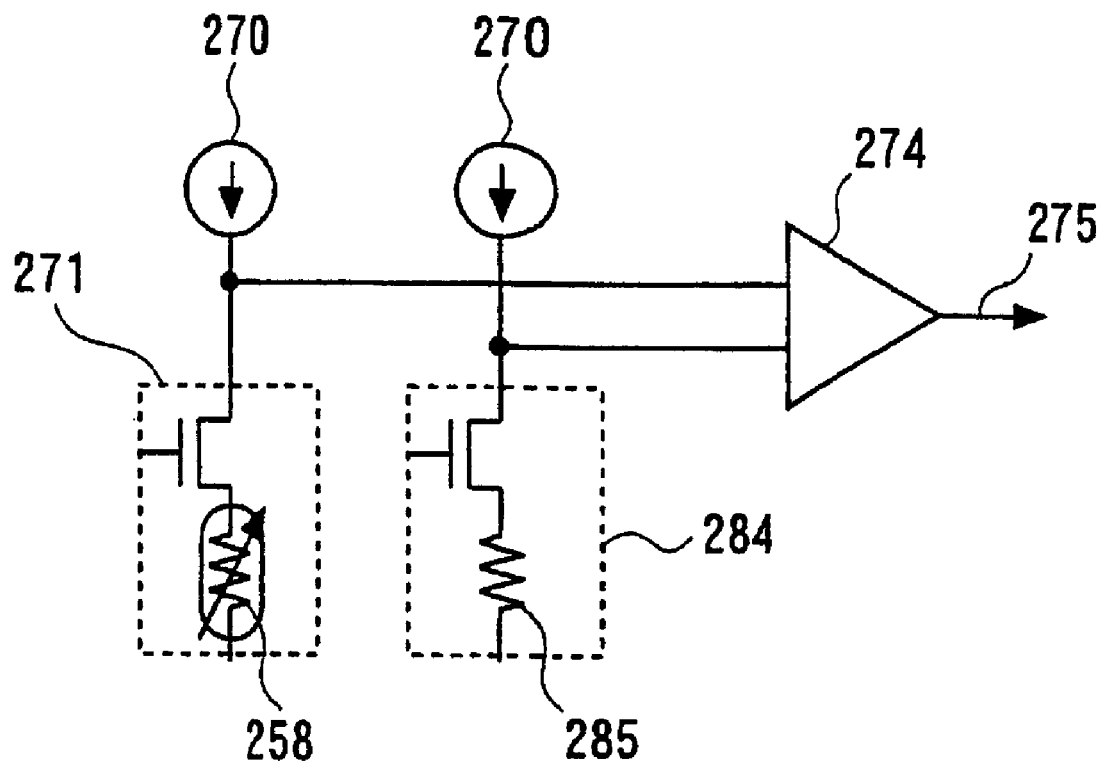
FIG. 25 is a diagram showing the structure of a modification of a write circuit or a readout circuit of a memory cell employing an interconnection structure according to the present invention.

FIG. 25 shows an embodiment of a structure in the write or readout circuit of the memory cell of FIG. 24 for generating the reference voltage in a replica memory cell. Referring to FIG. 25, the write or readout circuit of the memory cell of the present embodiment includes two current sources 270, a memory cell 271 having a switch element 258, a replica memory cell 284 having a constant electrical conductivity 285, such as resistor or transistor, a voltage comparator 274, and an output terminal 275. The replica memory cell 284 has a structure in which the switch element 258 of the memory cell 271 is replaced by an element 285 of a constant electrical conductivity.

With the circuit, shown in FIG. 25, it is possible to determine which of the electrical conductivity of the memory cell 271 and that of the replica memory cell 284 is higher, by causing the same current to flow through both the memory cell 271 having the switch element 258 and the replica memory cell 284 having the constant electrical conductivity and by checking the relative magnitude of the voltages appearing at the memory cell 271 and the replica memory cell 284. For example, by setting the electrical conductivity of the replica memory cell 284 to a value operating as a target in programming the memory cell 271, it may be verified whether or not the electrical conductivity of the memory cell 271 has reached a target value. By providing a plural number of replica memory cells 284 of different values of the electrical conductivity, it is possible to compare the electrical conductivity of plural replica memory cells of different values of the electrical conductivity to that of the memory cell 271, such that, by allocating the difference in the electrical conductivity to the analog information or to the multi-valued information, it is possible to identify the analog information or the multi-valued information. The impedance of the resistor 285 of the replica memory cell 284 is preferably set so as to be larger and smaller than the on-resistance and the off-resistance of the switch element 258, respectively.

Figure 26:
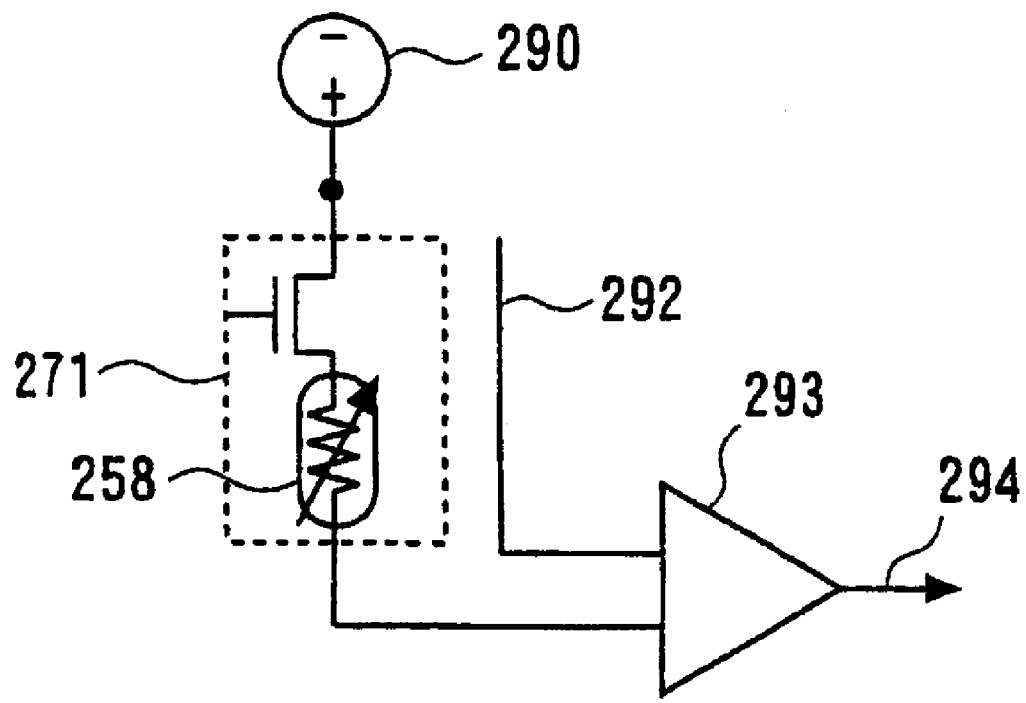
FIG. 26 is a diagram showing the structure of another modification of a write circuit or a readout circuit of a memory cell employing an interconnection structure according to the present invention.

FIG. 26 shows a modification of a structure in the write or readout circuit of the memory cell employing the interconnection structure of the present invention. Referring to FIG. 26, the write or readout circuit of the memory cell of the present embodiment includes a voltage source 290, a memory cell 271 having a switch element 258, a reference current 292, a current comparator 293, and an output terminal 294.

In the circuit shown in FIG. 26, the voltage is applied from the voltage source 290 to the memory cell 271, such that the current flows in dependence upon the electrical conductivity of the switch element 258. It is possible to determine by the current comparator 293 whether the current is larger than the reference current 292, in order to determine whether or not the electrical conductivity of the switch element is larger than a desired value of the electrical conductivity.

Figure 27:
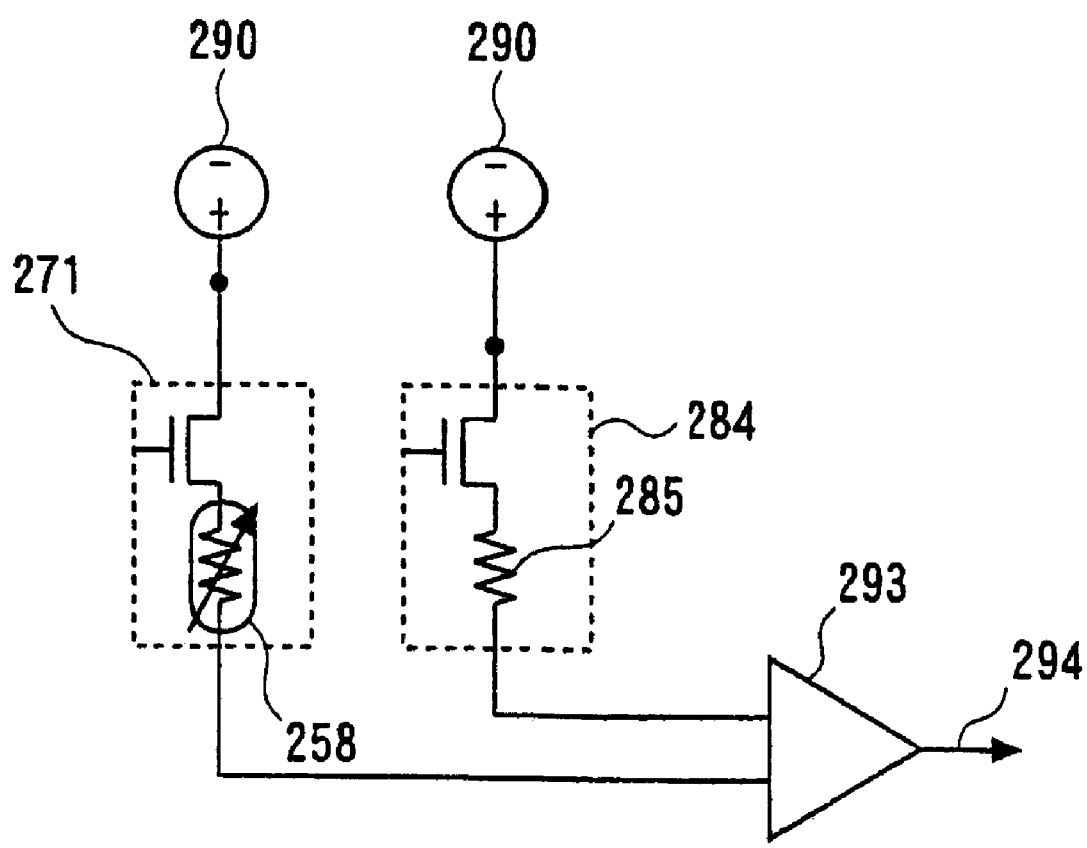
FIG. 27 is a diagram showing the structure of yet another modification of a write circuit or a readout circuit of a memory cell employing an interconnection structure according to the present invention.

FIG. 27 shows an example of generating the reference current by the replica memory cell in the write or readout circuit of the memory cell of FIG. 26. Referring to FIG. 27, the write or readout circuit of the memory cell of the present embodiment includes two current sources 290, a memory cell 271 having a switch element 258, a replica memory cell 284 having a constant electrical conductivity 285, such as resistor or transistor, a voltage comparator 293, and an output terminal 294.

In the circuit shown in FIG. 27, the same voltage is applied to the memory cell 271 and to the replica memory cell 284 to compare the relative magnitudes of the currents flowing therethrough to verify whether or not the electrical conductivity of the memory cell 271 is larger than that of the replica memory cell 284. By arranging a device of a target electrical conductivity to the replica memory cell 284, it may be verified whether or not the electrical conductivity of the replica memory cell 284 has reached the target value. By having the electrical conductivity of the memory cell 271 associated with the analog information or the multi-valued information, providing a plural number of the replica memory cells of different values of the electrical conductivity, and by comparing the values of the electrical conductivity of these replica memory cells to the electrical conductivity of the memory cell 271, it is possible to handle the electrical conductivity of the memory cells to identify the analog information or the multi-valued information.

Figure 28:
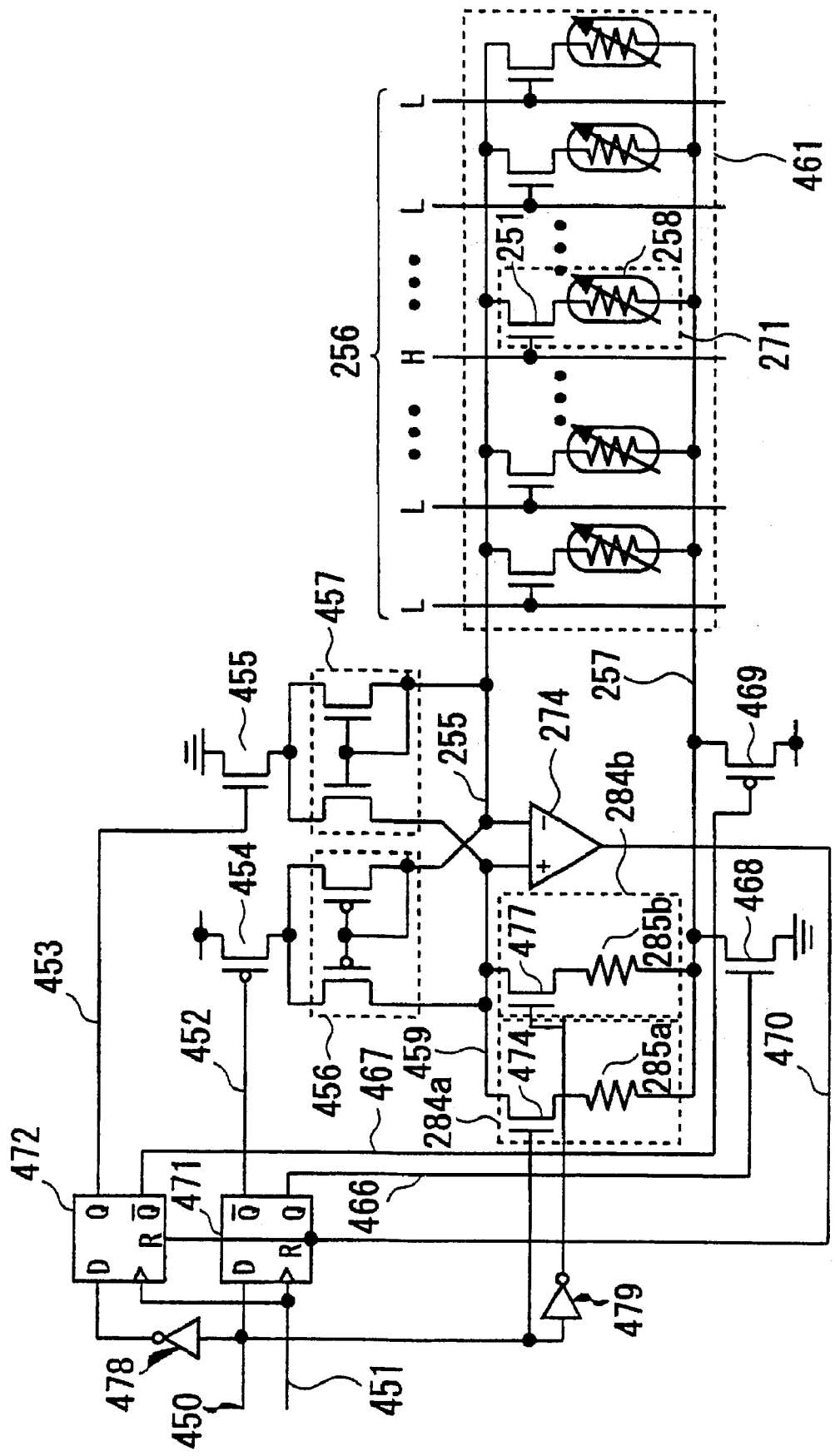
FIG. 28 is a diagram showing an example of a detailed circuit structure of a write circuit for a memory shown in FIG. 25.

FIG. 28 shows an example of a detailed circuit structure of a write circuit for the memory shown in FIG. 25 and a memory cell array. Referring to FIG. 28, the memory circuit includes a D type flip-flop 471 with an asynchronous reset input, a data terminal D and a clock terminal of which are supplied with a data input 450 and with a write pulse 451, respectively, and which outputs a non-inverted output (Q) 466 and an inverted output (/Q) 452, a D type flip-flop 472 with an asynchronous reset input, a data terminal D and a clock terminal of which are supplied with an inverted version of the data input 450 from an inverter 478, and with a write pulse 451, respectively, and which outputs a non-inverted output (Q) 453 and an inverted output (/Q) 467, a pMOS switch (transistor) 454, a source of which is connected to a power supply and a gate of which is supplied with the inverted output (/Q) 452 of the D type flip-flop 471, and an nMOS switch 455, the source of which is grounded and the gate of which is supplied with the non-inverted output (Q) 453 of the D type flip-flop 472. The memory circuit includes a pMOS current mirror circuit 456, connected to the drain of the pMOS switch 454, and an nMOS current mirror 457, connected to the drain of the nMOS switch 455.

A memory cell array 461 is made up by a bit line 255, a reference line 459, a plate line 257, and a plural number of memory cells 271. The memory cell 271 includes an access transistor 251 and a switch element 258. The access transistor 251 has a gate connected to a word line, while having one of the source and the drain connected to a bit line and having the other of the source and the drain connected to one terminal of the switch element 258. The other terminal of the switch element 258 is connected to the plate line 257.

The memory write circuit includes two replica memory cells (see FIG. 25), that is, a first replica memory cell 284a and a second replica memory cell 284b. The first replica memory cell 284a includes a dummy access transistor 474 and a reference resistor 285a, while the second replica memory cell 284b includes a dummy access transistor 477 and a reference resistor 285b. The sources or the drains of a dummy access transistor 474 of the first replica memory cell 284a and a dummy access transistor 477 of the second replica memory cell 284b are connected in common to the reference line 459, while the gates thereof are supplied with a data input 450 and with an inverted version of the data input 450 from an inverter 479. The first or second terminals of the switch element 285a of the first replica memory cell 284a and the switch element 285b of the second replica memory cell 284b are connected in common to the plate line 257, while the second or first terminals thereof are connected to the drain or source of the dummy access transistors 474, 477. An n-MOS switch 468 is inserted across the plate line 257 and the ground, the gate of which is supplied with the non-inverted output 466 of the D type flip-flop 471. With the nMOS switch on, the plate line 257 is connected to the ground potential. A p-MOS switch 469 is inserted across the plate line 257 and the power supply VDD. The gate of the p-MOS switch 469 is supplied with the inverted output 467 of the D type flip-flop 472. With the p-MOS switch on, the plate line 257 is at a power supply potential. The reference line 459 is connected to the drains of one transistors (transistors having the sources and the drains connected together) of the transistor pairs of a current mirror circuit 456 and an nMOS current mirror circuit 457. The bit line 255 is connected to the drains of the other transistors of the transistor pairs of a current mirror circuit 456 and an nMOS current mirror circuit 457. The current flowing through the bit line 255 connected to the selected memory cell 271 is set so as to be equal to the current flowing through the reference line 459 connected to the selected memory cell 271 (mirror current). The voltage comparator 274 compares the voltage at the bit line 255 and that at the reference line 459 and has an output connected to a reset terminal R of each of the D type flip-flops 471 and 472.

The switch element 258 is formed in an interconnection layer shown in FIGS. 1 and 2. The dummy access transistors 474 and 477 are of the same characteristics as those of the access transistor 251 of the memory cell 271. The reference resistors 285a and 285b are of resistance values as target values in setting the resistance values of the switch element 258 of the memory cell 271, with the impedance of the reference resistor 285b being larger than that of the reference resistor 285a. The operation of the write circuit shown in FIG. 28 is now explained.

In case the write operation is carried out in the circuit shown in FIG. 28, as "1" is set in the data input 450, programming is made so that the impedance of the switch element 258 will be lower than the resistance value of the reference resistance. For example, if the data 450 is set to "1", and a rising edge is entered to the write pulse input 451, the output 452 is set to "0" and an output 466 is set to "1". The pMOS switch 454 is then turned on and the current is supplied to a pMOS current mirror circuit 456. The n-MOS switch 468 is turned on so that the plate line 257 is at a ground potential.

The access transistor 251 of the memory cell 271, selected by the word line 256 (with the selected word line 256 being at high level, with other word lines being at low level), is turned on, with the current supplied from the pMOS current mirror circuit 456 flowing through the bit line 255, access transistor 251 of the memory cell 271 and the switch element 258 into the plate line 257. On the other hand, when the data 450 is set to "1", the access transistor 474 of the first replica memory cell 284a is turned on to select the first replica memory cell 284a.

At this time, the forward bias is applied to the switch element 258 of the selected memory cell 271, so that the impedance of the selected memory cell 271 becomes gradually smaller.

The current supplied from the pMOS current mirror circuit 456 flows through the reference line 459 into the replica memory cell 284a. The pMOS current mirror circuit 456 causes the same current as that flowing into the memory cell 271 to flow into the replica memory cell 284a through the reference line 459, so that, if the impedance of the resistor (reference resistor 285a) is smaller than the impedance of the switch element 258 of the memory cell 271, the voltage of the reference line 459 becomes smaller than the voltage of the bit line 255, whereas, if the impedance of the resistor (reference resistor 285a) is larger than the impedance of the switch element 258 of the memory cell 271, the voltage of the reference line 459 becomes larger than the voltage of the bit line 255.

Thus, the forward bias is applied to the switch element 258 of the memory cell 271, the impedance of the switch element 258 of the memory cell 271 becomes gradually smaller and, as the impedance of the switch element 258 of the memory cell 271 is lower than the impedance of the reference resistor 285a, the output 470 of the voltage comparator 274 is "1".

The output of the D type flip-flop 471 then is reset, the inverted output (/Q) 452 is "1", while the non-inverted output (Q) 466 is "0", the pMOS switch 454 is turned off and the current supply to the bit line 255 is halted, at the same time that the n-MOS switch 468 is turned off and the plate line 257 is open-circuited to terminate the programming of the switch element 258.

If conversely the data 450 is set to "0" and the rising edge is entered to the write pulse input 451, the non-inverted output 453 of the D type flip-flop 472 is "1", while the inverted output 467 is set to "0". The nMOS switch 455 is turned on to activate the nMOS current mirror 457. This turns on the p-MOS switch 469 to supply the current to the plate line 257.

The access transistor 251 of the memory cell 271, optionally selected by the word line 256, is in an on-state, so that the current supplied from the p-MOS switch 469 through the plate line 257 flows into the bit line 255 through the switch element 258 and the access transistor 251 of the selected memory cell 271 into the bit line 255.

Since the reverse bias is applied to the switch element of the memory cell 271, the impedance of the switch element 258 becomes gradually larger.

On the other hand, the current flows from the selected second replica memory cell 284b (the dummy access transistor 477 is turned on with the data input 450: "0") through the reference line 459 to the nMOS current mirror 457. This nMOS current mirror 457 tries to cause the same current as that flowing through the memory cell 271 to flow into the second replica memory cell 284b. Thus, if the impedance of the reference resistor 285b is larger than that of the switch element 258, the voltage at the reference line 459 becomes smaller than that of the bit line 255 and, if conversely the impedance of the reference resistor 285b is smaller than that of the switch element 258, the voltage at the reference line 459 becomes larger than that of the bit line 255.

Thus, if the reverse bias is applied to the switch element 258 of the memory cell 271, and the impedance of the switch element 258 is gradually increased and has become larger than the impedance of the reference resistor 285b, the output 470 of the voltage comparator 274 becomes "1". This resets the output of the D type flip-flop 472, the non-inverted output 453 is "0", the inverted output 467 is "1", the p-MOS switch 469 is turned off and the current supply to the plate line 257 ceases, at the same time that the nMOS switch 455 is turned off and the bit line 255 is open-circuited to terminate the programming for the switch element 258.

If, with the circuit structure shown in FIG. 28, the write operation is carried out as "1" is set in the data input 450, the impedance of the switch element 258 is set to the impedance of the reference resistor 285a. If the write operation is carried out as "0" is set in the data 450, the impedance of the switch element 258 is set to the impedance of the reference resistor 285b.

With the use of the circuit shown in FIG. 28, the switch element 258 may be set to high accuracy to an optional impedance value, thus giving rise to merits such as writing the multi-valued information, releasing the stress to the devices due to the write operation or to guaranteed programming operations for devices exhibiting marked fluctuations in characteristics.

Figure 29:
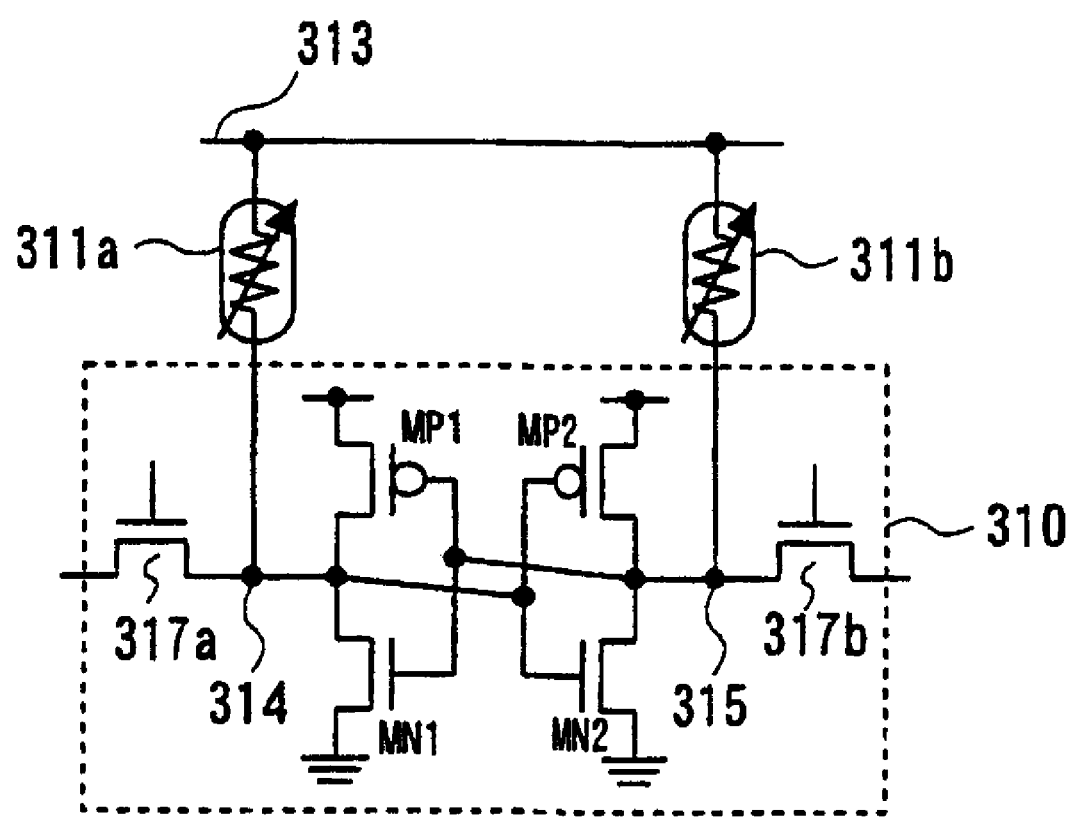
FIG. 29 is a diagram showing an embodiment of the structure of a memory cell employing an interconnection structure according to the present invention.

FIG. 29 shows an embodiment of a memory cell structure employing the interconnection structure of the present invention. Referring to FIG. 29, the memory cell of the present invention includes an SRAM cell 310, having a flip-flop composed of two cross-connected inverters (a pMOS transistor MP1, an nMOS transistor MN1, a pMOS transistor MP2 and an nMOS transistor MN2), two switch elements 311a and 311b and a control line 313. The reference numerals 317a and 317b denote access transistors, the gates of which are connected to a word line, not shown. When the word line is at a high potential, the access transistors 317a and 317b are turned on to connect the flip-flop to a bit line pair, not shown. The switch elements 311a and 311b are of the structure of 103 of FIG. 1 or 118 in FIG. 2 and provided with an inner electrolyte material or a chalcogenide material. The on-resistance of the switch elements 311a and 311b is higher than the on-resistance of the pMOS transistors MP1 and MP2 forming the two inverters.

When supplied with the current, the circuit of FIG. 29 operates as a normal SRAM. When the power supply is off, the information is stored in the switch elements 311 as the electrical conductivity. When the power supply is again on, the voltage levels at nodes 314 and 315 are set, based on the difference in the electrical conductivity of the switch elements 311. It is assumed for example that, with the power supply on, the terminals 314 and 315 are at a high level (power supply voltage) and at a low level (ground potential), respectively. The control line 313 is then set to a potential intermediate between the power supply voltage and the ground voltage to apply the forward bias and the reverse bias to the switch elements 311a and 311b, respectively. Should the power supply be turned off in this state, the stored contents in the SRAM cell are lost. However, the high electrical conductivity state and the low electrical conductivity state are kept in the switch elements 311a and 311b, respectively.

When the power supply is again turned on, the voltage on the control line 313 is set so as to be equal to the power supply voltage. Since this connects the terminals 314 and 315 of the SRAM cell to the power supply with high electrical conductivity and low electrical conductivity, respectively, the voltage at the terminal 314 and that at the terminal 315 of the SRAM cell are out of equilibrium with each other. This non-equilibrium is amplified based on the cross-connection of the inverters of the SRAM cell, until ultimately the nodes 314, 315 are set to "H" and "L", respectively.

Thus, with the memory cell of the present invention, the state of storage is maintained even if the power supply is turned off, such that, when the power supply is again turned on, the original storage state of the SRAM cell may be recovered.

Since the switch elements 311 are formed in the interconnection layer, a non-volatile memory may be realized without increasing the memory cell area as compared to the normal SRAM cell.

Figure 30:
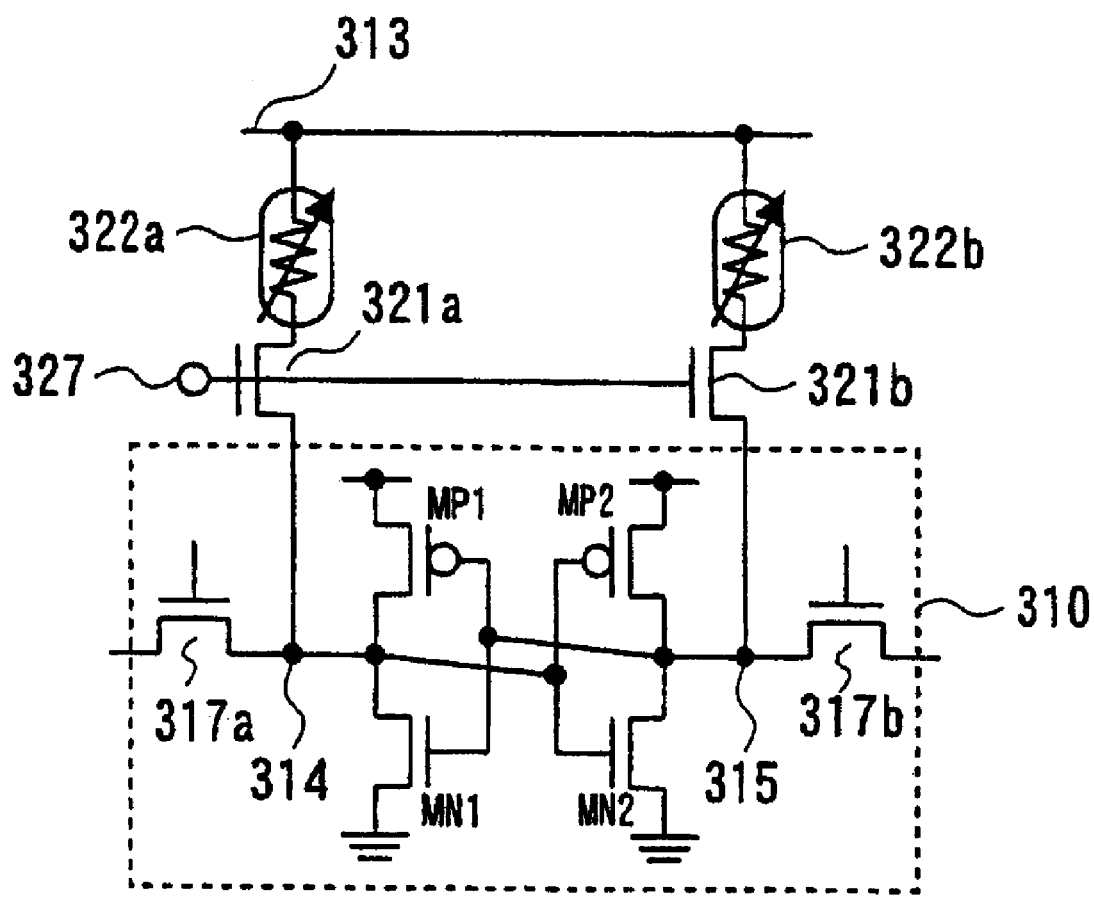
FIG. 30 is a diagram showing a modification of the structure of a memory cell employing an interconnection structure according to the present invention.

FIG. 30 shows the structure of a modification of a memory cell employing an interconnection structure of the present invention. Referring to FIG. 30, the memory cell of the present invention includes an SRAM cell 310, two transistors 321a and 321b, two switch elements 322a and 322b, and a control line 313 for applying the bias voltage. The switch elements 322a and 322b are of the structure of 103 of FIG. 1 or 118 in FIG. 2 and provided with an inner electrolyte material or a chalcogenide material.

The operation of the circuit of FIG. 30 is the same as that of the circuit shown in FIG. 29. When the power supply is turned on, the circuit operates as a routine SRAM and, when the power supply is turned off, the switch elements 322 change the electrical conductivity to store the information. When the power supply is again turned on, the original stored contents are re-written.

However, the circuit of FIG. 30 differs from the circuit of FIG. 29 in that transistors 321a and 321b are provided across the nodes 314 and 315 and the switch elements 322a and 322b.

During the normal operation, these transistors 321a and 321b may be turned off so that the switch elements 322 do not affect the operation. Directly before turning off the power supply, the transistors 321a and 321b are turned on to write the information in the switch elements 322a and 322b. When the power supply is again turned on, the transistors 321a and 321b are turned on until the storage state is re-written in the SRAM cell 310 to produce voltage unbalance between the modes 314 and 315, based on the difference in the electrical conductivity of the switch elements 322a and 322b. This voltage unbalance is amplified by the flop-flop (made up of cross-connected inverters) of the SRAM cell, until ultimately the nodes 314 and 315 are set to the original storage state. In this manner, with the memory cell of the present invention, it is possible to realize an SRAM cell capable of holding the storage, even after the power supply is turned off, and also capable of restoring the original storage state when the power supply is again turned on.

Figure 31:
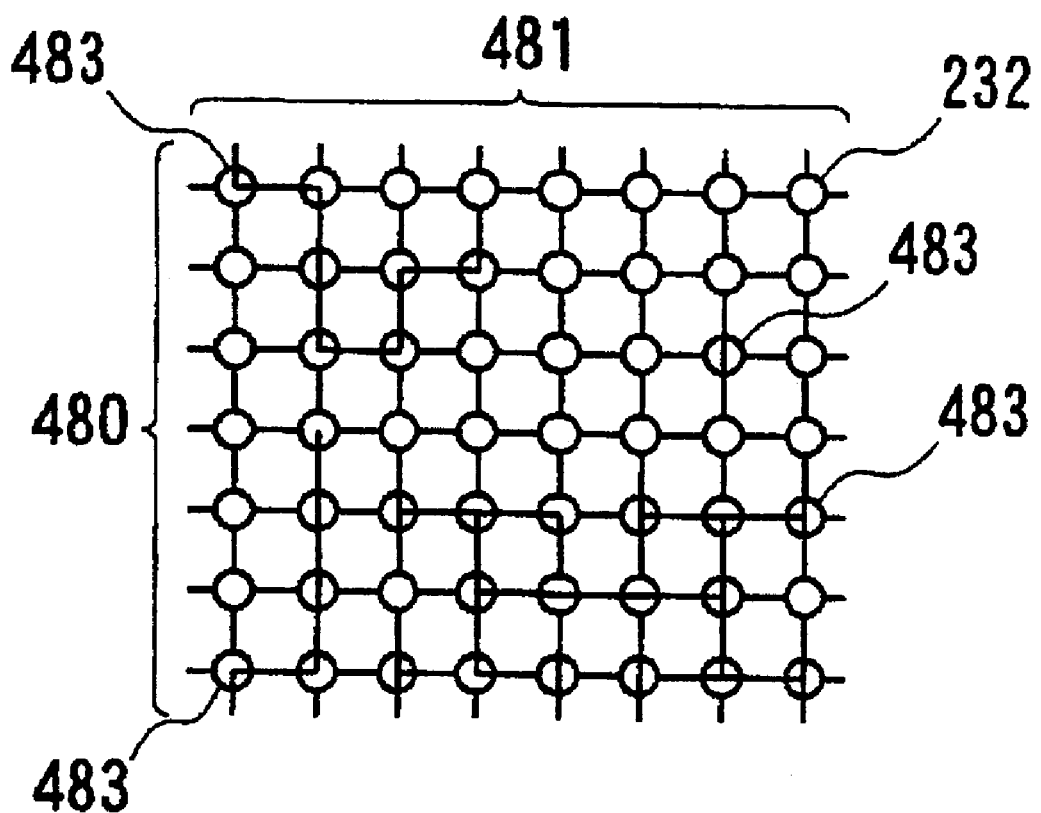
FIG. 31 is a diagram showing an embodiment of an interconnection structure according to the present invention.

FIG. 31 shows an embodiment of an interconnection structure of the present invention. Referring to FIG. 31, the interconnection structure of the present invention includes a horizontal wire 480, a vertical wire 481 and switch elements 232 arranged at the points of intersection of the horizontal wire 480 and the vertical wire 481 (for example, 232 of FIG. 19). Similarly to the switch element 103 of FIG. 1 or to the switch element 118 of FIG. 2, each switch element 232 includes a switch element formed in an interconnection layer, and may optionally be switched to one of four directions for connection. An optional connection 483 may be made subject to programming of the switch element 232.

Figure 32:
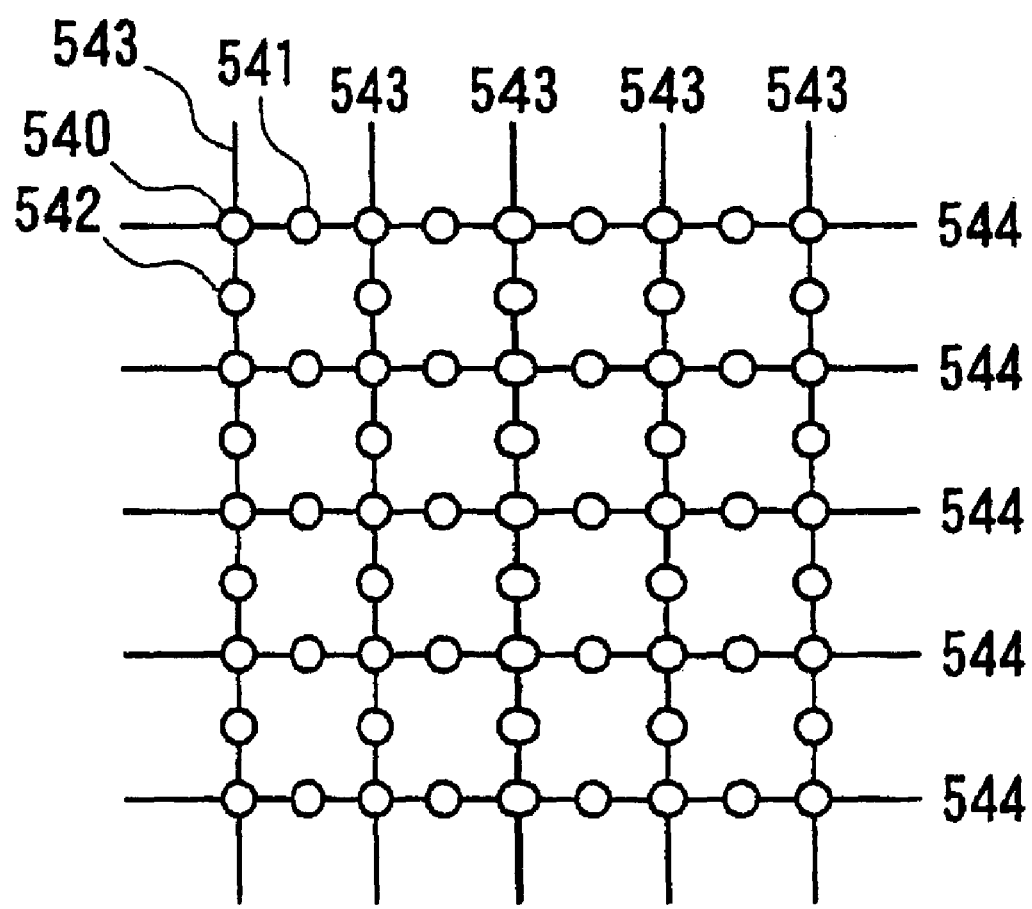
FIG. 32 is a diagram showing a modification of an interconnection structure according to the present invention.

FIG. 32 shows another embodiment of an interconnection structure of the present invention and the arrangement of the switch elements. Referring to FIG. 32, the interconnection structure of the present invention includes a vertical wire 543, a horizontal wire 544, switch elements 540 arranged at the points of intersection of the vertical wire 543 and the horizontal wire 544, switch elements 541 arranged in the horizontal wire 544 and switch elements 542 arranged in the vertical wire 543. In FIG. 32, the switch elements 540 to 542 are of the structure shown in FIG. 1 or 2. There are occasions where the vertical wire 543 and the horizontal wire 544 are formed in different interconnection layer or in the same interconnection layer. When the vertical wire 543 and the horizontal wire 544 are arranged in respective different interconnection layers, the switch elements 541 interconnecting the wires of the horizontal wire 544, and the switch elements 542 interconnecting the wires of the vertical wire 543, are of a structure shown in FIG. 2, while the switch elements 540, interconnecting the wires of the vertical wire 543 and the horizontal wire 544, are in the form of vias interconnecting the different interconnection layers, as shown in FIG. 1.

If the vertical wire 543 and the horizontal wire 544 are formed in the same interconnection layer, the switch elements 540, 541 and 542 are configured as shown in FIG. 2. By the layer structure shown, and the arrangement of the switch elements, it is possible to construct an integrated circuit capable of programming the optional interconnection shown in FIG. 31. The switch element between the wires of the same interconnection layer, may be on the order of 1 µm to 10 mm, insofar as the first and second interconnection layers are concerned. In case the wire resistance of the layer differs, the separation between the switch elements is set to a larger value for an interconnection layer having smaller wire resistance than for an interconnection layer having larger wire resistance. The separation between the vertical wire 543 and the horizontal wire 544 may be set e.g. to 1 µm to 10 µm.

Figure 33:
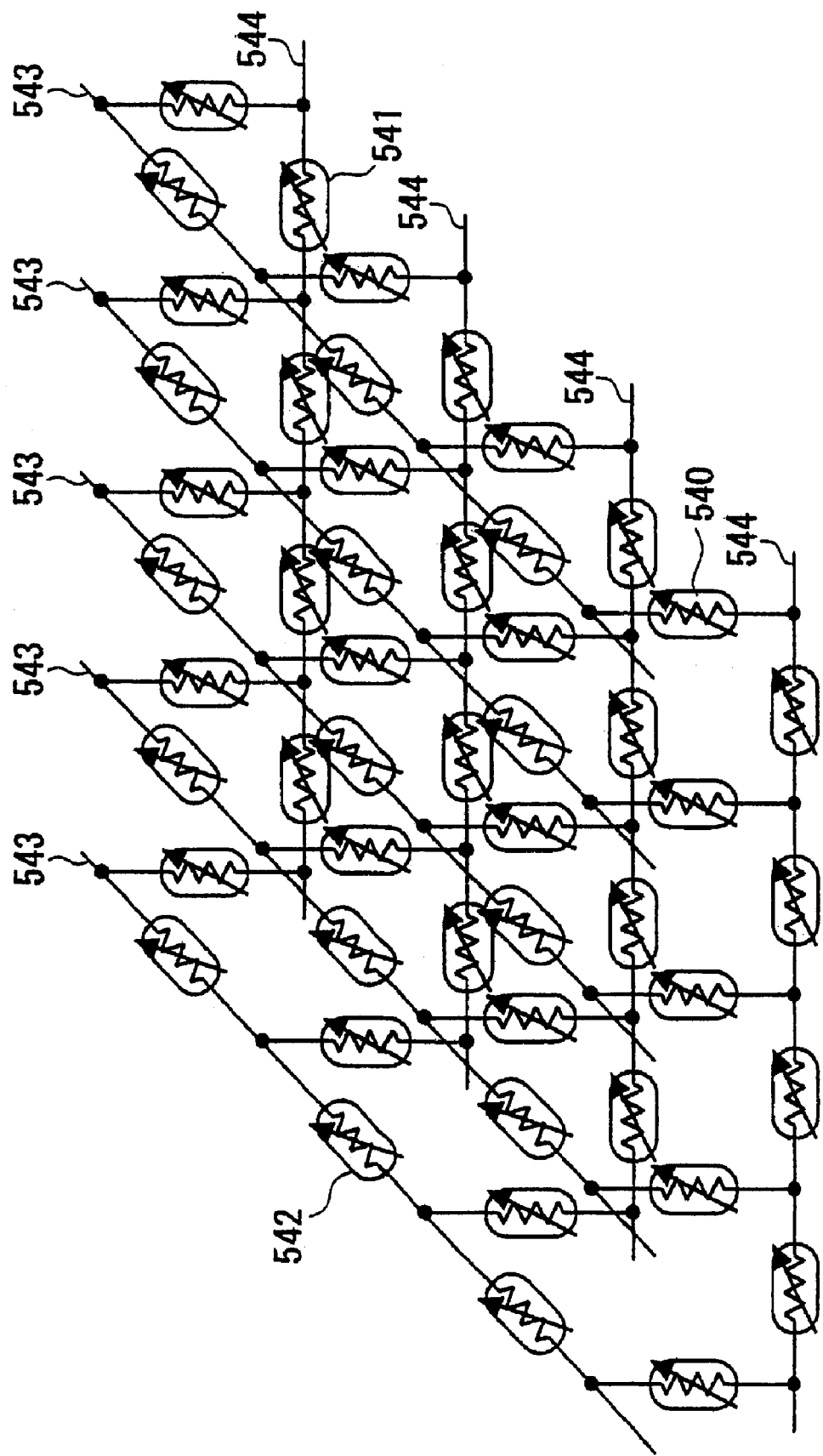
FIG. 33 shows a switch array and an interconnection structure of FIG. 32.

FIG. 33, showing an interconnection structure of FIG. 32 and the switch array, is a three-dimensional representation of an illustrative structure in which the vertical wire 543 and the horizontal wire 544 are arranged in different layers.

Figure 34:
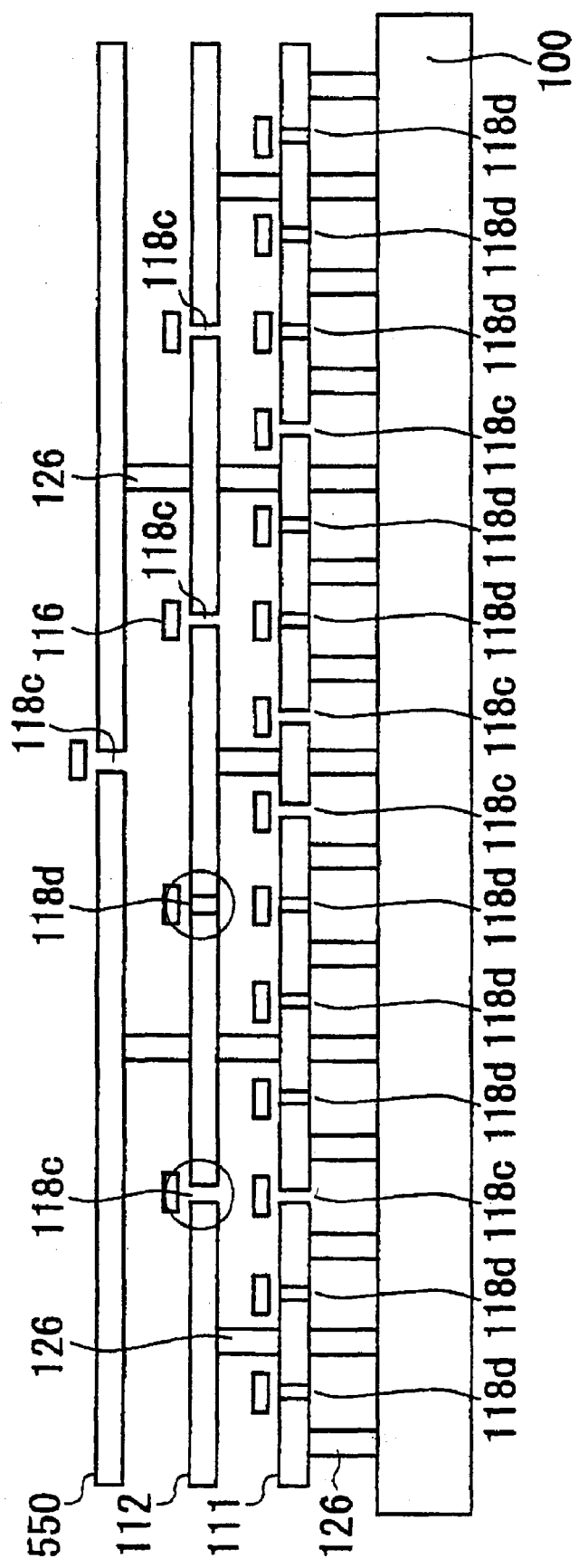
FIG. 34 is a diagram showing an embodiment of the cross-section of the present invention.

FIG. 34 shows an embodiment of the cross-section of the interconnection structure of the present invention. Referring to FIG. 34, the interconnection structure of the present invention includes a semiconductor substrate 100, a via 126 interconnecting the semiconductor substrate and the interconnection layer or the different layers of the interconnection layer, interconnection layers 111, 112 and 150, a switch element 118 formed in the interconnection layer, and a control gate 116 for controlling the electrical conductivity of the switch elements. The switch element is of the structure shown in FIG. 2 and is so designed that an on-state 118d or an off-state 118c may optionally be set by controlling the voltage of the control gate 116.

In general, in the interconnection layer of an integrated circuit, a layer close to the semiconductor substrate is used as local interconnection, whilst a layer closer to the upper surface is used as a global interconnection. In this manner, the wiring of the integrated circuit forms a hierarchical structure having different signal propagating distances from layer to layer.

In the interconnection structure of the present invention, in which connection (on) and opening (off) of the wiring may be optionally programmed, it is possible to optionally program the hierarchical interconnection structure. By exploiting this characteristic, a non-wasteful optimum circuit structure may be achieved.

Figure 35:
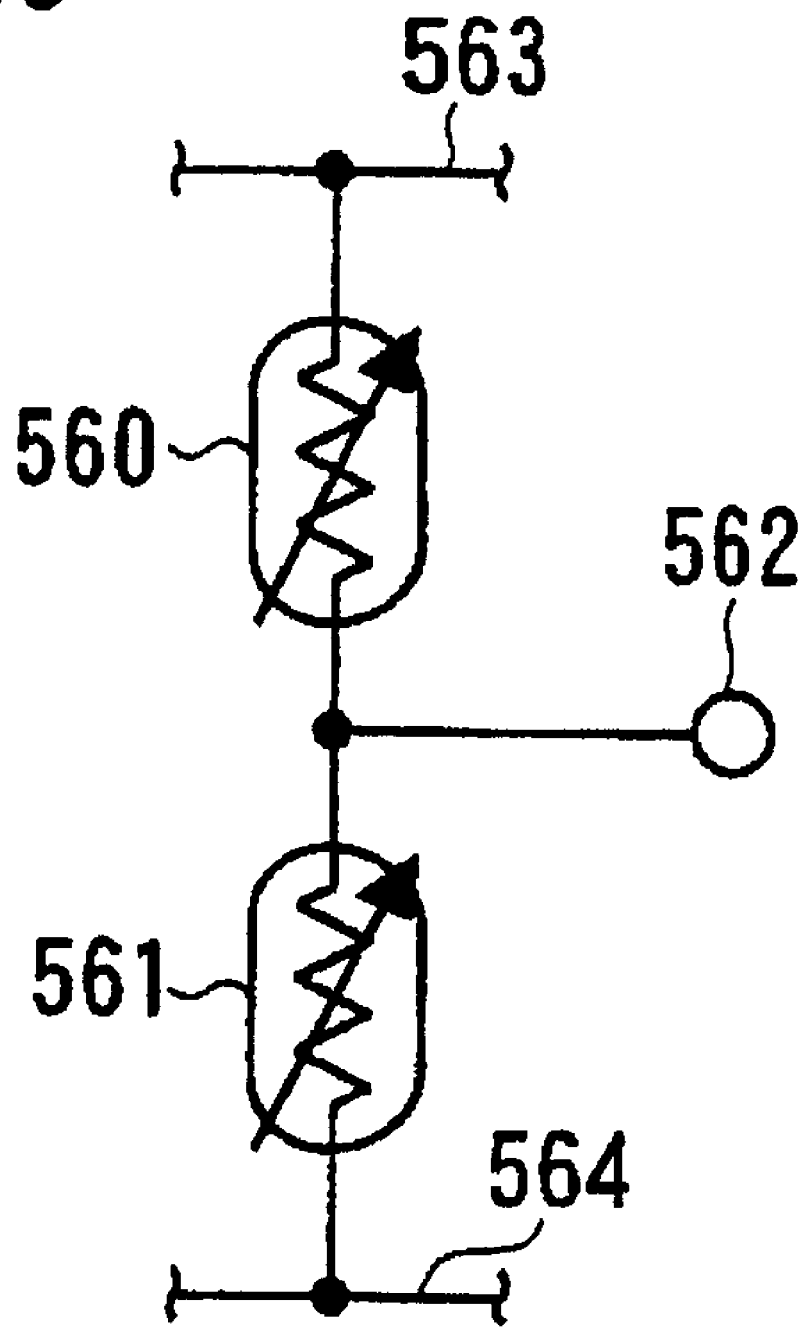
FIG. 35 is a diagram showing the structure of an embodiment of a memory cell employing an interconnection structure according to the present invention.

FIG. 35 shows an embodiment of a memory cell structure employing the interconnection structure of the present invention. Referring to FIG. 35, this memory cell includes a first switch element 560, a second switch element 561, an input/output terminal 562, a first voltage source 563 and a second voltage source 564. The switch elements 561 and 562 are the switch elements shown in FIG. 1 or 2. The switch elements 561 and 562 are both turned on when a negative voltage and a positive voltage are applied to upper and lower terminals ('forward bias'), while being turned off when the state of voltage application is reversed ('reverse bias'). The voltage of the first voltage source 563 is set so as to be higher than the voltage of the second voltage source.

If, in the circuit shown in FIG. 35, a voltage higher than the voltage of the first voltage source 563 is applied to the input/output terminal 562, the forward bias is applied to the first switch element 560. Since the reverse bias is applied to the second switch element 561, the switch elements 560 and 561 are turned on or off, respectively. If, in this state, the input/output terminal 562 is opened, the voltage of the first voltage source 563 appears at the input/output terminal 562. If conversely the voltage lower than the second voltage source 564 is input to the input/output terminal 562, the forward bias is applied to the second switch element 561. Since the reverse bias is applied to the switch element 560, the switch elements 561 and 560 are turned on or off, respectively. If, in this state, the input/output terminal 562 is opened, the voltage of the second voltage source 564 appears at the input/output terminal 562. If, with the input/output terminal 562 opened, the power supply is turned off, the two switch elements are able to maintain the then prevailing state. If it is assumed that the voltage of the first voltage source 563 corresponds to the logical value "1" and the voltage of the second voltage source 564 corresponds to the logical value "0", the circuit operates as a no-volatile memory circuit.

Figure 36:
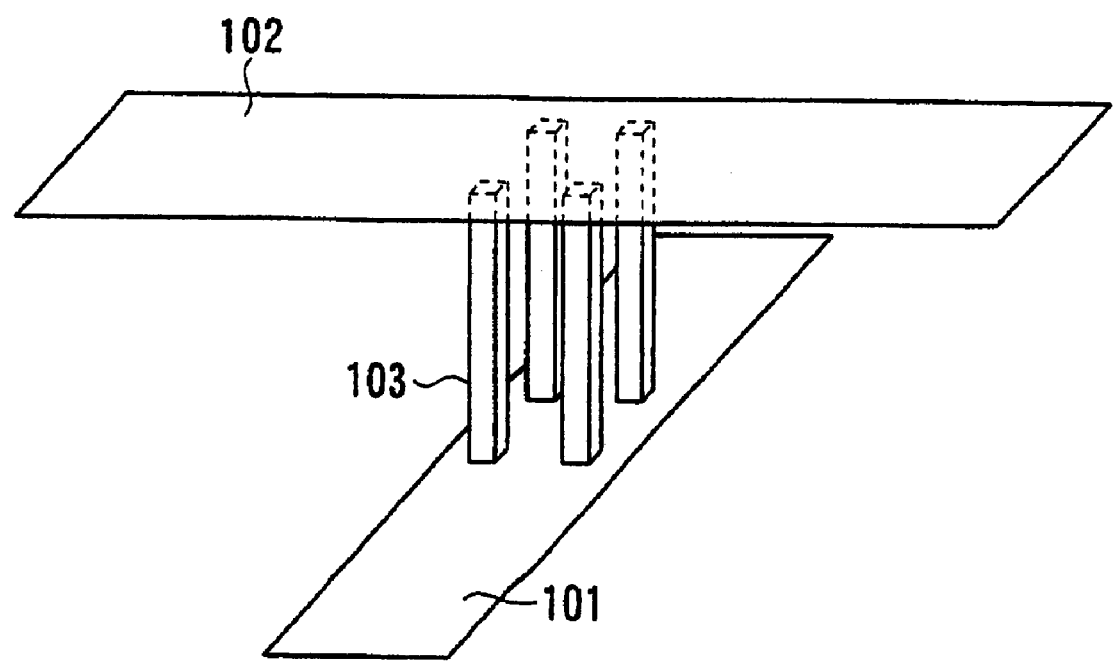
FIG. 36 schematically shows a three-dimensional set-up of an example in which two different interconnection layers are connected to each other using a switch element according to the present invention.

FIG. 36 schematically shows a three-dimensional structure of the interconnection structure comprised of an interconnection of two different interconnection layers. Referring to FIG. 36, the interconnection structure of the present invention includes a first interconnection layer 101, a second interconnection layer 102 and a plural number of switch elements 103 interconnecting the first interconnection layer 101 and the second interconnection layer 102. By providing plural parallel-connected switch elements 103, instead of only one switch element, not only is the resistance against the stress by current (electro-migration) improved, but also the operation is not halted even if one or more of the switch elements are destroyed. In addition, the production yield may be prohibited from being lowered due to device defects.

Alternative Embodiment

Figure 38:
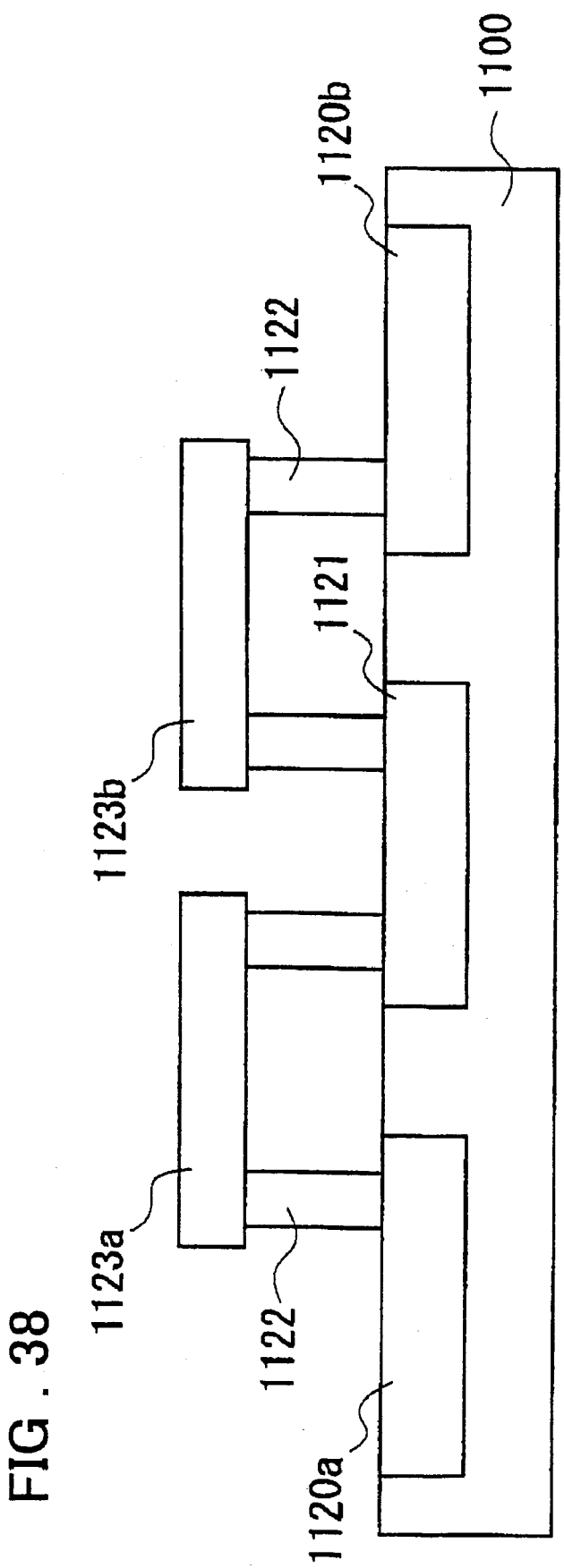
FIG. 38 is a diagram showing the structure of an integrated circuit formed on a semiconductor substrate according to a modification of the present invention.

FIG. 38 depicts a modification of the interconnection structure of the present invention. Specifically, FIG. 38 shows a re-configurable switch circuit used e.g. in FPGA. Referring to FIG. 38, the re-configurable switch circuit is made up by a semiconductor substrate 1100, an electronic circuit 1120, such as logic circuit, a arithmetic circuit, an analog circuit or a memory, formed on the substrate, a switch circuit 1121 for changing the connection across two terminals to on or off, a contact or via 1122 for connecting the electronic circuit 1120 and the switch circuit 1121, and an interconnection 1123. If the programming is such that the switch circuit 1121 is on, the electronic circuits 1120a, 1120b are interconnected, whereas, if the programming is such that the switch circuit 1121 is off, the interconnection across the electronic circuits 1120a, 1120b is interrupted.

Figure 39B:
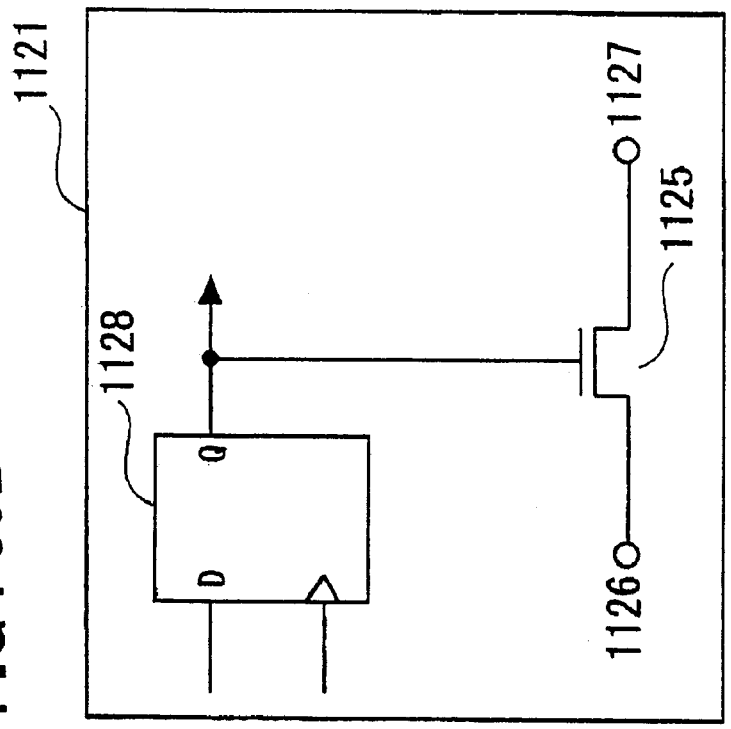
FIG. 39 is a diagram showing the structure of a conventional programmable switch circuit.
Figure 39A:
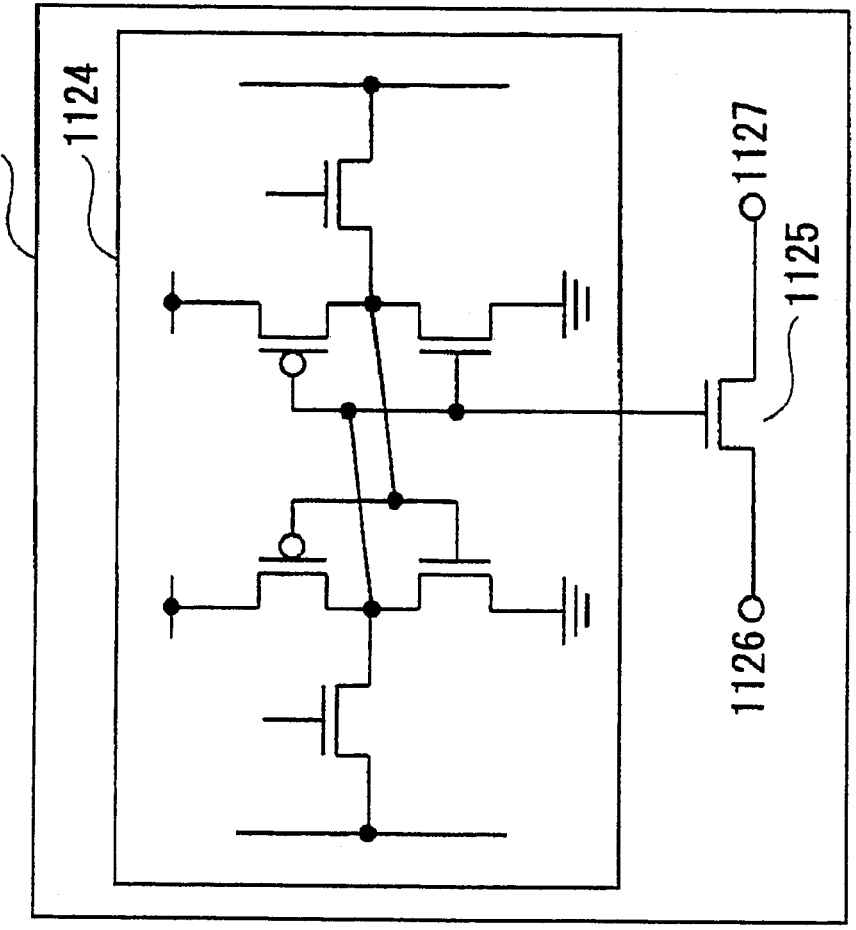

FIG. 39 shows an illustrative structure of the switch circuit 1121 of FIG. 38. FIG. 39A shows an example in which the switch circuit 1121 is constructed by an SRAM (static random access memory) 1124 and a pass transistor 1125 and FIG. 39B shows an example in which the switch circuit 1121 is constructed by a flip-flop circuit 1128 and a pass transistor 1125.

In case the switch circuit 1121 is constructed by the circuit employing these transistors, the switch circuit 1121 needs to be constructed on the semiconductor substrate 1100, as shown in FIG. 38. In this case, the switch circuit takes up a constant area on the semiconductor substrate. In FPGA, the switch circuit in general takes up a space about one-half the area of the semiconductor substrate, thus increasing the chip area and hence the cost.

FIGS. 40A and 40B shows a structure of an embodiment of a re-configurable switch circuit according to the present invention. FIGS. 40A and 40B show a switch circuit employing a two-terminal device explained with reference to FIG. 1 and a switch circuit employing a three-terminal device explained with reference to FIG. 2, respectively.

Referring to FIG. 40A, the re-configurable switch circuit is made up by a semiconductor substrate 1100, an electronic circuit 1120, such as logic circuit, a arithmetic circuit, an analog circuit or a memory, formed on the substrate, a via 1103, having a switching function of changing the connection across two terminals to on or off, a contact or via 1122 for connecting the electronic circuit 1120 and the via 1103, and a wiring 1123. If the programming is such that the via 1103 is on, the electronic circuits 1120a and 1120b are interconnected, whereas, if the programming is such that the via 1103 is off, the interconnection across the electronic circuits 1120a and 1120b is interrupted.

Referring to FIG. 40B, the re-configurable switch circuit of the present embodiment is made up by a semiconductor substrate 1100, an electronic circuit 1120, formed thereon, such as a logic circuit, a arithmetic circuit, an analog circuit or a memory, an electrolyte material 1113 containing metal ions, a gate electrode 1116, arranged in contact with the electrolyte material, a contact 1122 and a wire 1123 for interconnecting the electrolyte material 1113 and the electronic circuit 1120. If a metal material is precipitated to a portion of the electrolyte material 1113 contacting with the wires 1123a and 1123b, the metal precipitates so formed are contacted with one another and the programming is such that the wires 1123a and 1123b are on, the electronic circuits 1120a and 1120b are connected to each other, whereas, if there is no sufficient quantity of metal precipitates in the electrolyte material to enable the connection between the wires 1123a, 1123b and the programming is such that the wires 1123a and 1123b are off, the connection between the electronic circuits 1120a and 1120b is interrupted.

By employing a re-configurable switch circuit of the embodiment, explained with reference to FIG. 40, the switching function between the wires may be provided without forming a circuit on the semiconductor substrate 1100. In the programmable semiconductor integrated circuit, such as FPGA, the chip area may be reduced appreciably and hence there may be provided a programmable semiconductor integrated circuit at a low cost.

Figure 41:
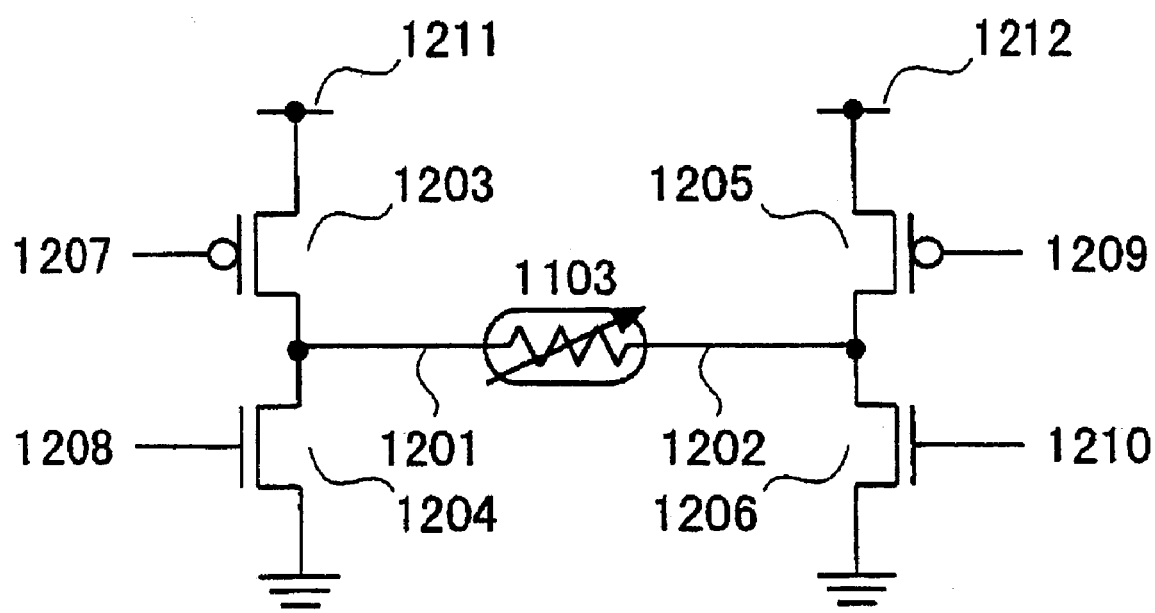
FIG. 41 is a diagram showing the structure of a programming circuit embodying the present invention.

FIG. 41 shows an embodiment of a circuit for programming the vias having the switching function as explained with reference to FIG. 1. This via is referred to below as a two-terminal switch element. Referring to FIG. 41, the programming circuit of the present embodiment is made up by a two-terminal switch element 1103, pMOS transistors 1203 and 1205, nMOS transistors 1204 and 1206, control input terminals 1207 to 1210, and voltage sources 1211 and 1212. The voltage supplied from the voltage sources 1211 and 1212 is set so as to be higher than the signal voltage used for propagating logic signals. The transistors 1203 to 1206 handle a voltage higher than that handled by the usual transistors handling logic signals, and hence are preferably a high voltage withstand type transistors. The two-terminal switch element 1103 is programmed so as to be on when the voltage at a terminal 1201, referred to below as an anode, is higher than that of a terminal 1202, referred to below as a cathode. This state is referred to below as the 'forward bias'. The two-terminal switch element 1103 is programmed so as to be off when the voltage at the anode 1201 is lower than that of the cathode 1202. This state is referred to below as the 'reverse bias'.

If the terminals 1207 and 1208 are set to a low level and the terminals 1209 and 1210 are set to a high level, a voltage is supplied from the voltage source 1211 to an anode 1201 of the switch element 1102, the cathode 1202 is grounded and the switch element 1103 is in the state of forward bias. If the voltage supplied from the voltage source 1211 is higher than the threshold voltage of the switch element 1103, the switch element 1103 is programmed to an on-state. If the terminals 1207 and 1208 are set to the high level and the terminals 1209 and 1210 are set to the low level, the anode 1201 of the switch element 1103 is grounded, the cathode 1202 is supplied with the voltage from the voltage source 1212 and the switch element 1103 is reverse biased. If the voltage supplied from the voltage source 1212 is higher than the threshold voltage of the switch element 1103, the switch element 1103 is programmed to an off-state.

With use of the circuit, shown in FIG. 41, the two-terminal switch element 1103 may be optionally programmed to an on-state or to an off-state.

An example of a programmable two-terminal device, so far used, is an antifuse. However, since the antifuse has no polarity, the programming circuit can be biased only in one direction.

The switch element has polarity to which attention should be directed in programming. Moreover, the switch element of the present invention is in need of re-programming. However, for re-programming, there is needed a circuit for applying the bias voltage from two directions.

The circuit shown in FIG. 41 is a basic circuit in exploiting the feature of the present switch that is re-programmable.

With the antifuse, a switch, once turned on, cannot be reverted to an off-state. With the switch of the present invention, a switch in the on-state may be reverted to the off-state by applying an optimum voltage thereto. If a voltage is applied across the terminals of a switch element, which is in the on-state, in order to set the switch element to the off-state, the current flows between the terminals.

With the switch element of the present invention, the on-resistance is usually low, so that, if it is attempted to apply the voltage across the terminals, the current flowing through the switch is increased. Thus, for restoring the switch state in the on-state to an off-state, the current flowing in the switch is increased. Thus, in order to restore the switch element from the on-state to the off-state, the transistors 1204 and 1205 of FIG. 41 need to be of high current driving capability. The switch of the present invention also differs from the antifuse programming circuit in this respect.

Figure 42:
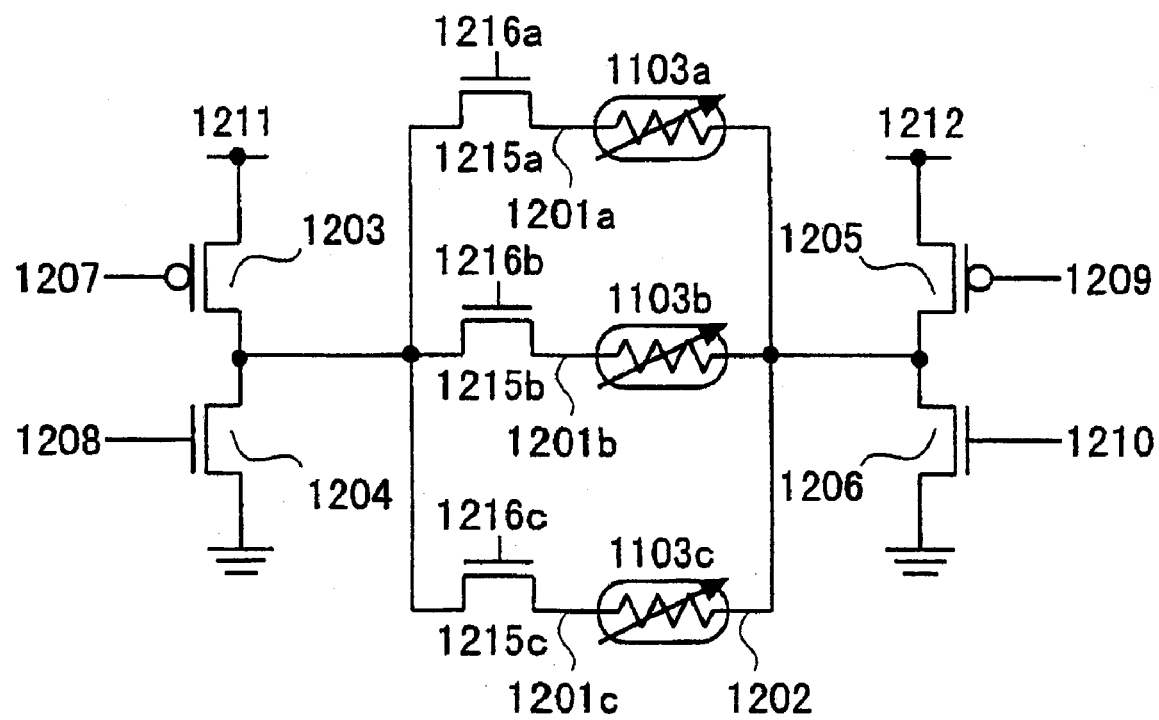
FIG. 42 is a diagram showing the structure of a programming circuit of plural two-terminal switch elements, connected in parallel, embodying the present invention.

FIG. 42 shows the structure of an embodiment of a circuit for programming the two-terminal switch element 1103. Referring to FIG. 42, the programming circuit of the present embodiment is made up by the two-terminal switch element 1103, pMOS transistors 1203 and 1205, nMOS transistors 1204 and 1206, control input terminals 1207 to 1210, voltage sources 1211 and 1212, a selecting transistor 1215 and a control input terminal 1216.

If the terminals 1207 and 1208 are set to the low level, the terminals 1209 and 1210 are set to the high level, the terminals 1216*a*, and 1216*c* are set to the low level, and the terminal 1216*b* is set to the high level, a voltage is supplied from the voltage source 1211 to an anode 1201*b* of the switch element 1103*b*, the cathode 1202 is grounded and the switch element 1103*b* is in the state of forward bias. If the voltage supplied from the voltage source 1211 is higher than the threshold voltage of the switch element 1103, the switch element 1103 is programmed to an on-state. Since selection transistors 1215*a* and 1215*c* are both in the off-state, the voltage from the voltage source 1211 is interrupted. Since no voltage is applied to the anode terminals 1201*a* and 1201*c* of the switch elements 1103*a* and 1103*c*, the switch state is not changed. If the terminals 1207 and 1208 are set to the high level, the terminals 1209 and 1210 are set to the low level, the terminals 1216*a* and 1216*c* are set to the low level and the terminal 1216*b* is set to the high level, the anode 1201*b* of the switch element 1103*b* is grounded, the cathode 1202 is supplied with voltage from the voltage source 1212 and the switch element 1103*b* is reverse biased. If the voltage supplied from the voltage source 1212 is higher than the threshold voltage of the switch element 1103, the switch element 1103*b* is programmed to an off-state.

With use of the circuit, shown in FIG. 42, the two-terminal switch elements 1103*a* to 1103*c*, connected parallel to each other, may be optionally programmed to an on-state or to an off-state.

Figure 43:
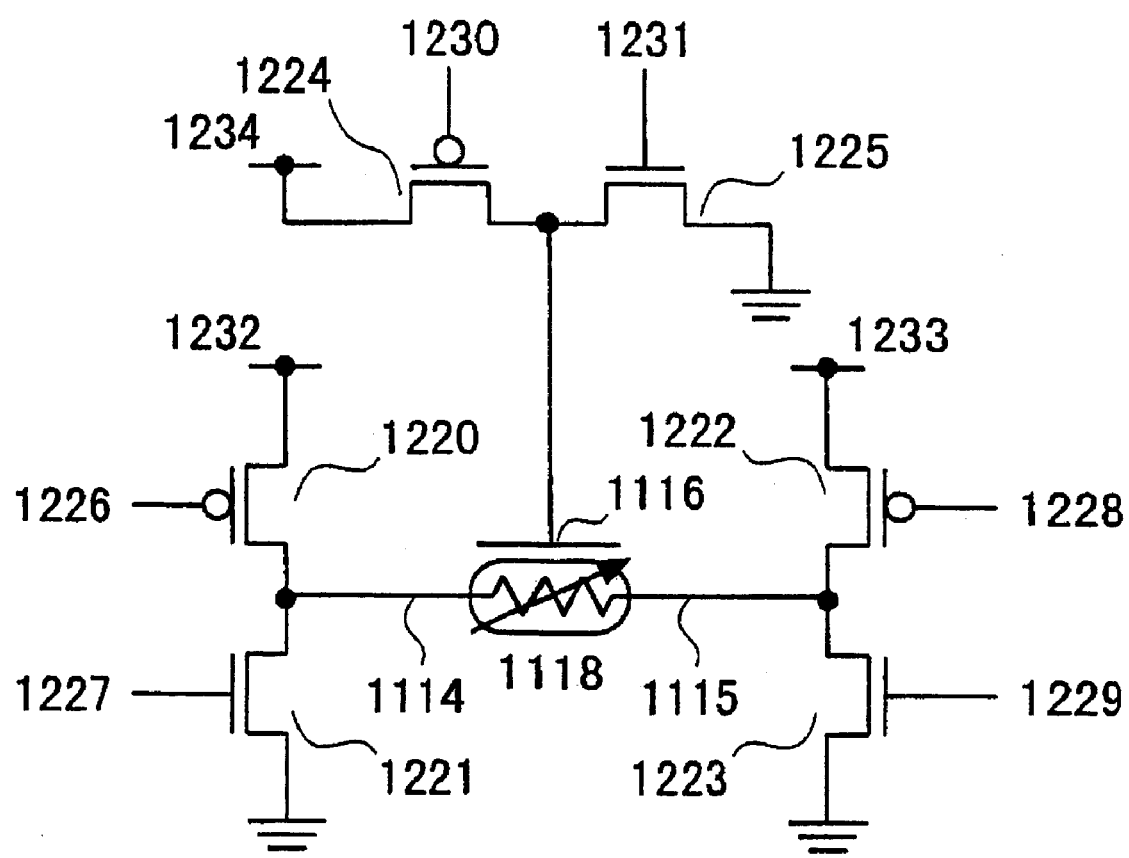
FIG. 43 is a diagram showing the structure of a programming circuit embodying the present invention.

FIG. 43 shows an embodiment of a programming circuit of a three-terminal switch element 1118, explained with reference to FIG. 2. Referring to FIG. 43, the programming circuit of the present embodiment includes the three-terminal switch element 1118, pMOS transistors 1220, 1222 and 1224, nMOS transistors 1221, 1223 and 1225, control input terminals 1226 to 1231, and voltage sources 1232 to 1234. It is assumed that the three-terminal switch element 1118 is programmed to an on-state when the voltage at a terminal 1116, referred to below as a 'gate' is higher than the voltage at terminals 1114 and 1115 (referred to below as 'source' and 'drain' respectively). This voltage state is referred to below as forward bias state. It is also assumed that the three-terminal switch element 1118 is programmed to an off-state when the voltage at the gate 1116 is lower than the voltage at the source 1114 and at the drain 1115. This voltage state is referred to below as reverse bias state.

If the terminals 1230 and 1231 are set to the low level and the terminals 1226 to 1229 are set to the high level, the gate 1116 of the switch element 1118 is supplied with the voltage from the voltage source 1234, the source 1114 and the drain 1115 are grounded, and the switch element 1118 is in the forward biased state.

If now the voltage supplied from the voltage source 1234 is higher than the threshold voltage of the switch element 1118, the switch element 1118 is programmed to the on-state. If the terminals 1230 and 1231 are set to H and the terminals 1226 to 1229 are set to the low level, the gate 1116 of the switch element 1118 is grounded, the source 1114 and the drain 1115 are supplied with the voltage from the voltage sources 1232 and 1233 and the switch element 1118 is in the reverse biased state.

If now the voltage supplied from the voltage sources 1232, 1233 is higher than the threshold voltage of the switch element 1118, the switch element 1118 is programmed to an off-state.

By employing the circuit, explained with reference to FIG. 43, the three-terminal switch element 1118 may be optionally programmed to the on- or off-state.

Figure 44:
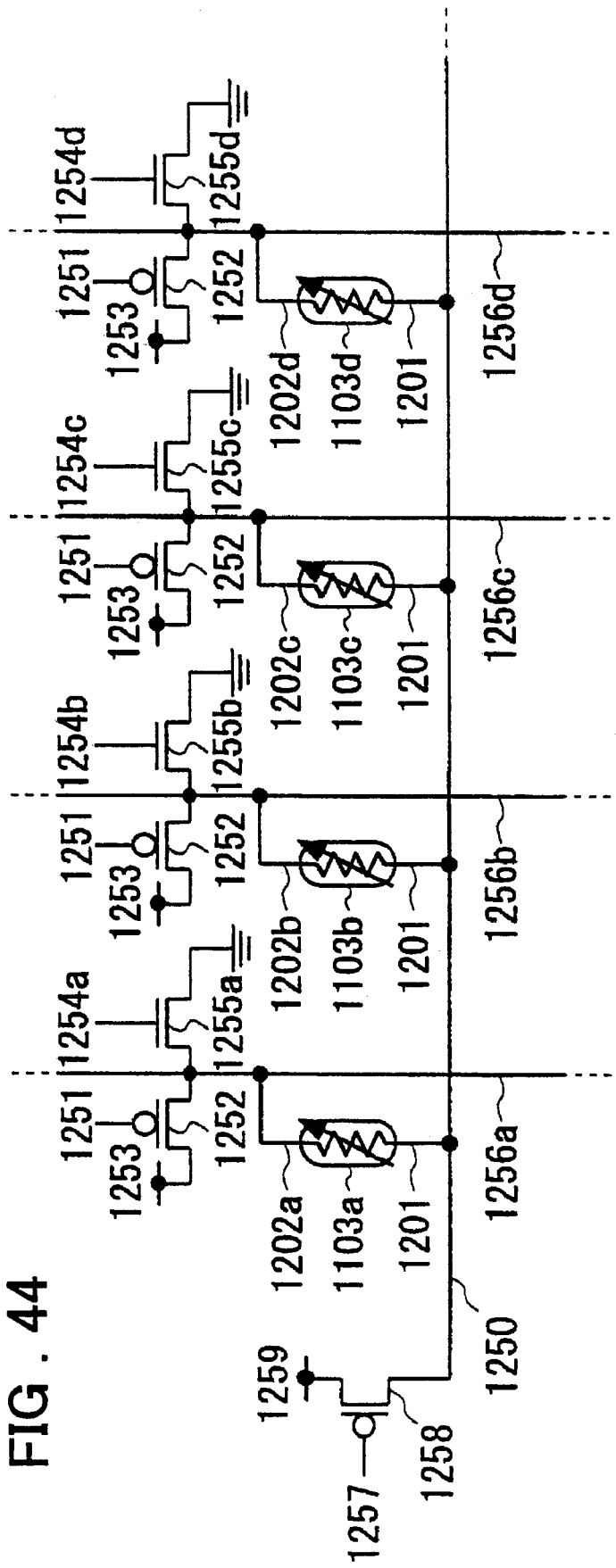
FIG. 44 is a diagram showing the structure of a programming circuit of plural two-terminal switch elements, connected in parallel, embodying the present invention.

FIG. 44 shows the structure of an embodiment of the circuit for programming plural two-terminal switch elements 1103 connected in parallel to each other. Referring to FIG. 44, the programming circuit of the present embodiment is made up by two-terminal switch elements 1103*a*, 1103*b*, 1103*c* and 1103*d*, pMOS transistors 1252 and 1258, an nMOS transistor 1255, control input terminals 1251, 1254*a*, 1254*b*, 1254*c*, 1254*d* and 1257, voltage sources 1253 and 1259, and wires 1250, 1256*a*, 1256*b*, 1256*c* and 1256*d*. The reference numeral 1201 denotes an anode terminal of the two-terminal switch element 1103 and the reference numerals 1202*a*, 1202*b*, 1202*c* and 1202*d* are cathode terminals of the switch elements 1103*a*, 1103*b*, 1103*c* and 1103*d*, respectively.

In the following, a case in which the switch element 1103*b* is programmed to an on-state is described. In the initial state, the input terminals 1251 and 1257 are at a high level, while the inputs 1254*a*, 1254*b*, 1254*c* and 1254*d* are at a low level. If the input level 1251 is set to the low level, a voltage is supplied from the voltage source 1253 through transistor 1252 to the wires 1256*a*, 1256*b*, 1256*c* and 1256*d*. The voltage supplied from the voltage source 1253 is labeled Vpp/2.

The input 1251 then is set to the high level and the input 1254b is set to the high level. The wire 1256b is grounded via transistor 1255b. By the operation up to this point, the voltage at the wires 1256a, 1256c and 1256d is Vpp/2, whilst the voltage at the wire 1256b is 0 (ground potential).

The input 1254b is restored to the low level and the input 1257 is set to the low level. By so doing, the voltage of the voltage source 1259 is supplied through the transistor 1258 to the anode 1201 of the two-terminal switch element 1103. With the voltage Vpp of the voltage source 1259, the voltage of the cathode terminals 1202a, 1202b, 1202c and 1202d is Vpp/2, so that the potential difference across two terminals of these switch elements is VPP/2. Since the voltage of the cathode terminal 1202b of the switch element 1103 is 0, the potential difference of Vpp is applied across two terminals of the switch element 1103b.

If it is assumed that the threshold voltage of the two-terminal switch element is intermediate between Vpp/2 and Vpp, the switch element 1103b is programmed to an on-state, because the potential difference across the two terminals thereof exceeds the threshold value. The switch elements 1103a, 1103c and 1103d are not changed in state because the potential difference across the two terminals thereof does not exceed the threshold value. Hence, an optionally selected one of plural switch elements, connected in parallel with one another, may be programmed to an on-state. The voltage used for propagating logic signals during the usual operation is preferably lower than the threshold voltage of the two-terminal switch element 1103.

Figure 45:
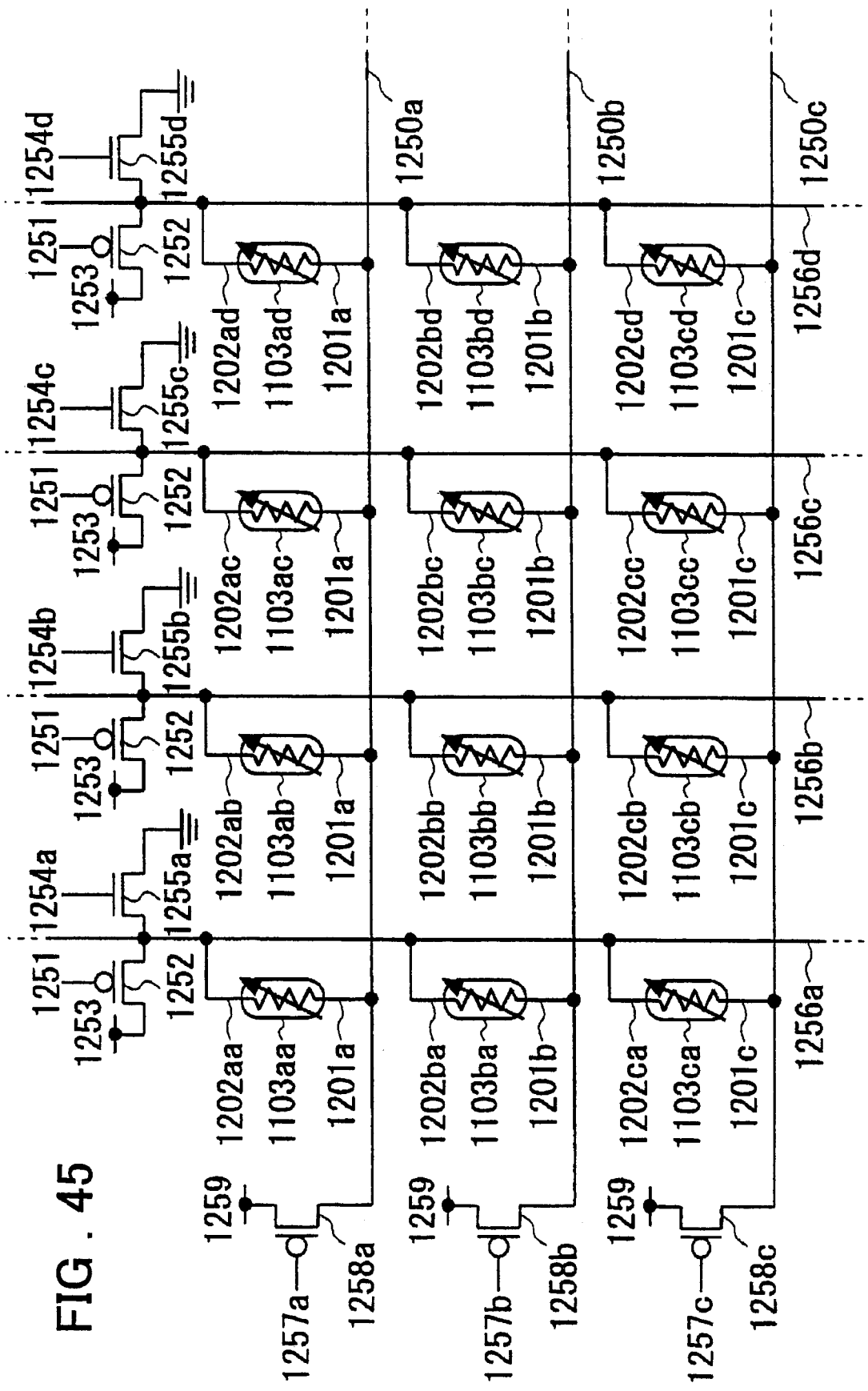
FIG. 45 is a diagram showing the structure of a programming circuit of a switch matrix embodying the present invention.

FIG. 45 shows the structure of an embodiment of a circuit for programming plural two-terminal switch elements, connected in juxtaposed rows and columns in a matrix array (referred to below as a 'switch matrix'). Referring to FIG. 45, a programming circuit of the present embodiment is made up by two-terminal switch elements 1103aa, 1103ab, 1103ac, 1103ad, 1103ba, 1103bb, 1103bc, 1103bd, 1103ca, 1103cb, 1103cc and 1103cd, pMOS transistors 1252, 1258a, 1258b and 1258c, nMOS transistors 1255a, 1255b, 1255c and 1255d, control input terminals 1251, 1254a, 1254b, 1254c, 1254d, 1257a, 1257b and 1257c, voltage sources 1253, 1259, and wires 1250a, 1250b, 1250c, 1256a, 1256b, 1256c and 1256d. The reference numeral 1201 is an anode terminal of the two-terminal switch element 1103 and the reference numeral 1202 is a cathode terminal of the switch element 1103.

In the following, a case in which the switch element 1103bb is programmed to an on-state is explained, as an example. In the initial state, the input 1251 and the inputs 1257a, 1257b and 1257c are at a high level, while the inputs 1254a, 1254b, 1254c and 1254d are at a low level. When the input 1251 is set to the L level, the wires 1256a, 1256b, 1256c and 1256d are supplied with voltage from the voltage source 1253 via transistors 1252. With the voltage Vpp/2, supplied from the voltage source 1253, the voltages at the wires 1256a, 1256b, 1256c and 1256d are all charged up to Vpp/2.

The input 1251 is set to the high level, and the input 1254b is set to the high level. By so doing, the wire 1256b is grounded via transistor 1255b. By the operation up to this point, the voltage at the 1256a, 1256c and 1256d is VPP/2, while the voltage at the wire 1256b is zero. If then the input 1254b is restored to the low level, and the input 1257b is set to the low level, the anodes 1201b of the two-terminal switch elements 103ba, 1103bb, 1103bc and 1103bd are supplied through transistor 1258b with the voltage from the voltage source 1259. With the voltage Vpp of the voltage source 1259, the voltage of the cathode terminals 1202ba, 1202bc and 1202bd of the switch elements 1103ba, 1103bc and 1103bd is Vpp/2, so that the potential difference across two terminals of these switch elements is VPP/2. Since the voltage of the cathode terminal 1202bb of the switch element 1103bb is 0, the potential difference of Vpp is applied across two terminals of the switch element 1103bb.

If it is assumed that the threshold voltage of the two-terminal switch element is intermediate between Vpp/2 and Vpp, the switch element 1103bb is programmed to an on-state, because the potential difference across the two terminals thereof exceeds the threshold value. The switch elements 1103ba, 1103bc and 1103bd are not changed in state because the potential difference across the two terminals thereof does not exceed the threshold value.

On the other hand, since the transistors 1258a and 1258c are not turned on, the voltage of the anode terminals 1201a and 1201c of the switch elements 1103aa, 1103ab, 1103ac, 1103ad, 1103ca, 1103cb, 1103cc and 1103cd is zero and the potential difference not less than Vpp/2 is not produced across the two terminals of these switch elements, so that the programmed state of these switches is not changed.

Hence, an optionally selected one of plural switch elements, connected in parallel with one another, may be programmed to an on-state. The voltage used for propagating logic signals during the usual operation is preferably lower than the threshold voltage of the two-terminal switch element 1103.

Figure 46:
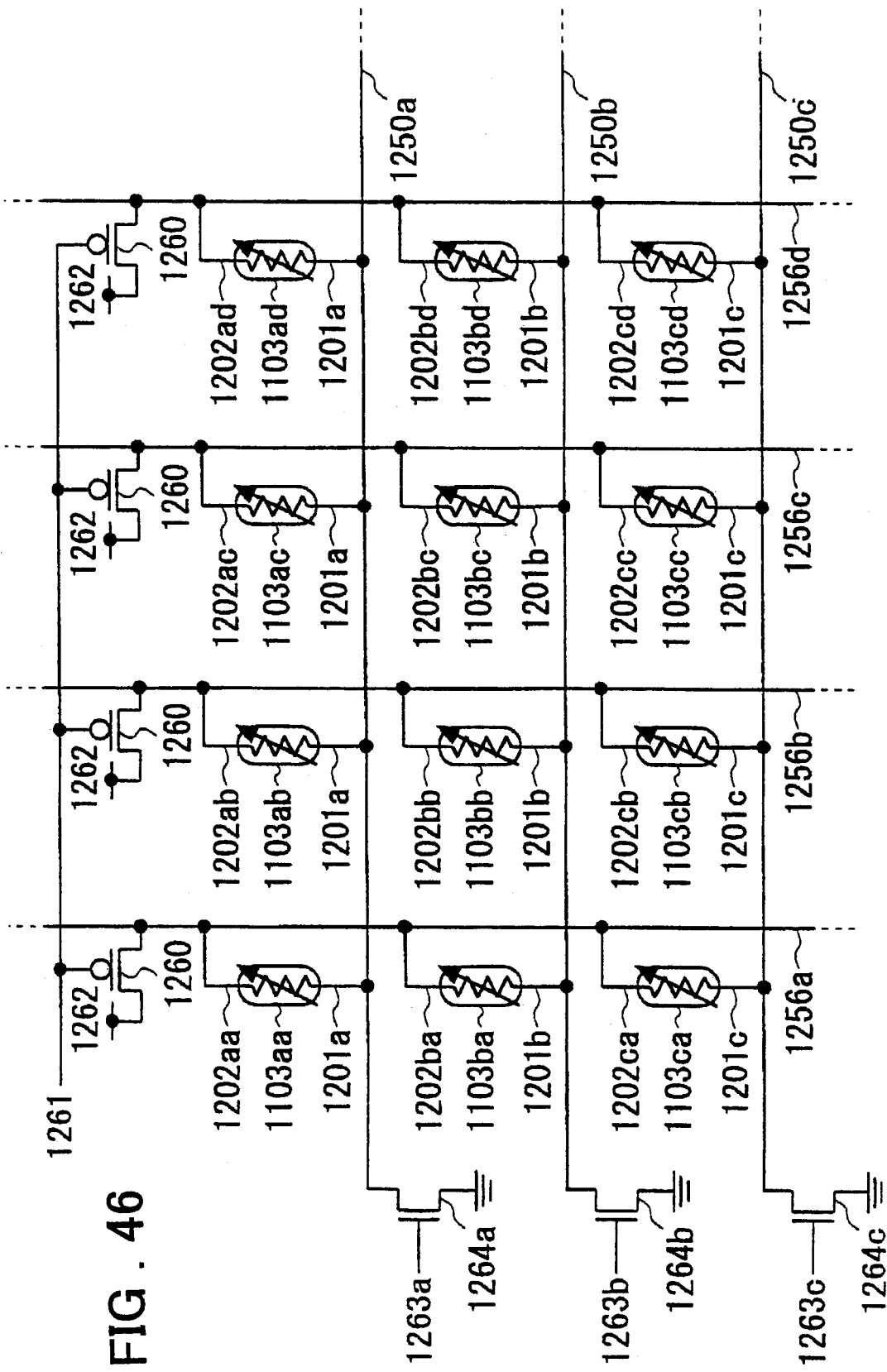
FIG. 46 is a diagram showing the structure of a programming circuit of a switch matrix embodying the present invention.

FIG. 46 shows the structure of an embodiment of a circuit for turning the state of connection of the switch matrix to an off-state. Referring to FIG. 46, the programming circuit of the present embodiment is made up by two-terminal switch elements 1103aa, 1103ab, 1103ac, 1103ad, 1103ba, 1103bb, 1103bc, 1103bd, 1103ca, 1103cb, 1103cc and 1103cd, pMOS transistors 1260, nMOS transistors 1264a, 1264b and 1264c, control input terminals 1261, 1263a, 1263b and 1263c, a voltage source 1262, and wires 1250a, 1250b, 1250c, 1256a, 1256b, 1256c and 1256d. The reference numeral 1201 is an anode terminal of the two-terminal switch element 1103 and the reference numeral 1202 is a cathode terminal of the switch element 1103.

In the initial state, the input terminal 1261 is at a high level, and the input terminals 1263a, 1263b and 1263c are all at a low level.

In the following, a case in which the switch elements 1103ba, 1103bb, 1103bc and 1103bd are programmed to an on-state is described, as an example. When the input terminal 1261 is set to the low level, and the input terminal 1263b is set to the high level, the wires 1256a, 1256b, 1256c and 1256d are supplied with voltage from the voltage source 1262 via transistors 1260. The cathode terminals 1202ba, 1202bb, 1202bc and 1202bd are supplied with the voltage of the voltage source 1262. The anode terminal 1201b is grounded via transistor 1264b.

In this state, the reverse bias is applied to the switch elements 1103ba, 1103bb, 1103bc and 1103bd. If the voltage across two terminals exceeds the threshold voltage, the switch elements 1103ba, 1103bb, 1103bc and 1103bd are programmed to an off-state.

If the totality of the switch elements 1103aa, 1103ab, 1103ac, 1103ad, 1103ba, 1103bb, 1103bc, 1103bd, 1103ca, 1103cb, 1103cc and 1103cd is to be programmed to an off-state, the input terminal 1261 is set to an L level, while the input terminals 1263a, 1263b and 1263c are set to a high level. The voltage of the voltage source 1262 is supplied through the transistor 1260 to the wires 1256a, 1256b, 1256c and 1256d, while the voltage of the voltage source 1262 is supplied to the cathode terminals 1202aa, 1202ab, 1202ac, 1202ad, 1202ba, 1202bb, 1202bc, 1202bd, 1202ca, 1202cb,

1202cc and 1202cd of all of the switch elements 1103. The anode terminals 1201a, 1201b and 1201c are grounded through transistors 1264a, 1264b and 1264c. In this state, the reverse bias is applied to the totality of the switch elements 1103. If the voltage across two terminals exceeds the threshold voltage, the switch elements 1103aa, 1103ab, 1103ac, 1103ad, 1103ba, 1103bb, 1103bc, 1103bd, 1103ca, 1103cb, 1103cc and 1103cd are programmed to an off-state.

Figure 47:
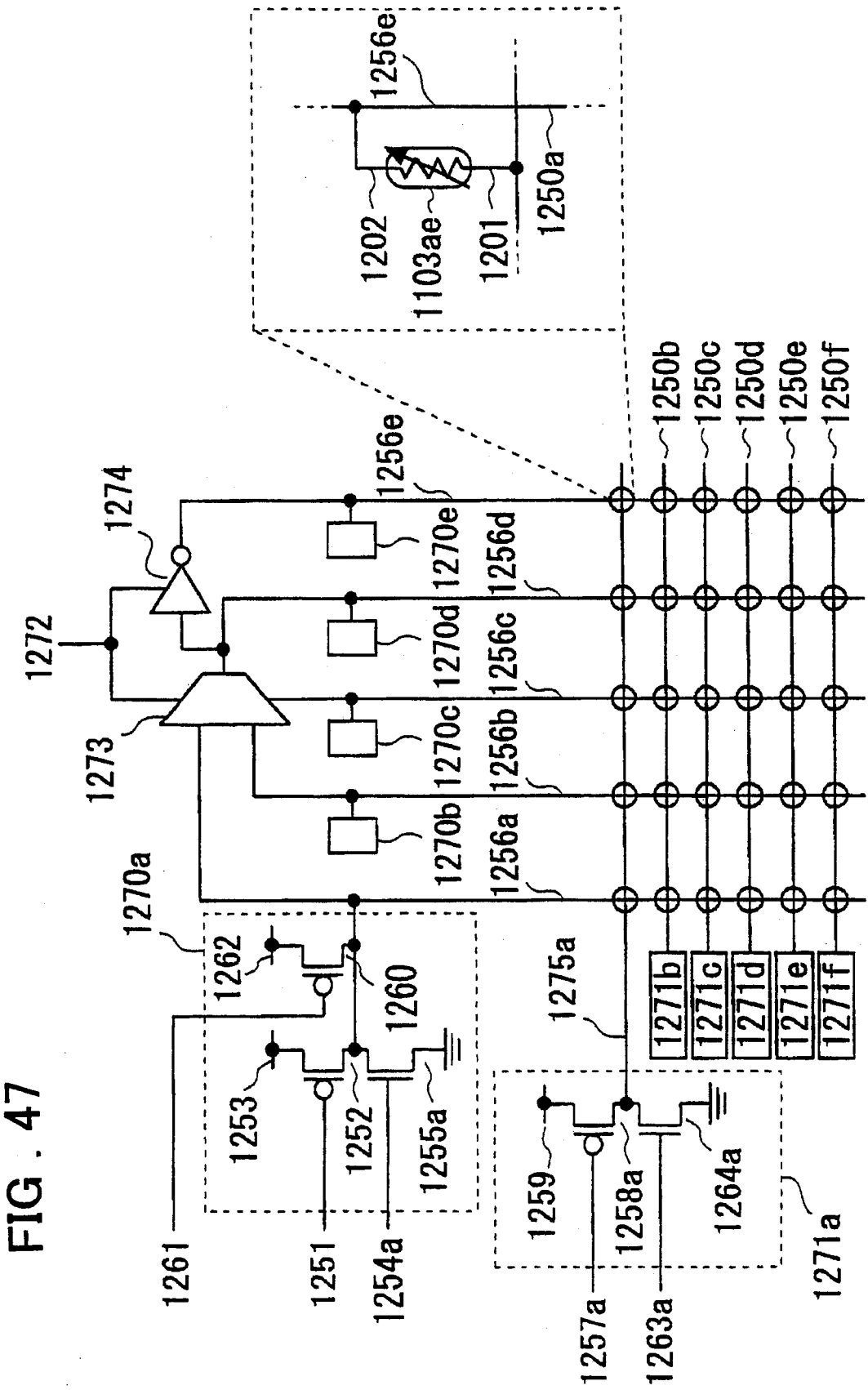
FIG. 47 is a diagram showing the structure of a programmable logic circuit employing a switch matrix embodying the present invention.

FIG. 47 shows an example of the structure of a programmable two-input logic circuit employing a switch matrix of the present invention and a programming circuit thereof. Referring to FIG. 47, the programmable logic circuit of the present embodiment includes programming circuits 1270 and 1271, first wires 1250a to 1250f, second wires 1256a to 1256e, a selector circuit 1273, an inverter 1274 and a control signal input terminal 1272. A two-terminal switch element 1103 is arranged at each point of intersection of the intersections 1250 and 1256. The anode terminal 1201 of the switch element 1103 is connected to one of the first wires 1250a to 1250f, while the cathode terminal 1202 of the switch element 1103 is connected to one of the second wires 1256a to 1256e. The programming circuits 1270 and 1271 correspond to the programming circuit and the erasure circuit, explained with reference to FIGS. 45 and 46, respectively.

When the logic value of the wire 1256c is low, the selector circuit 1273 outputs the logic value of 1256a to 1256d, whereas, when the logic value of the wire 1256c is high, the selector circuit 1273 outputs the logic value of 1256b to 1256d. The inverter 1274 outputs a value corresponding to the inverted logic value of 1256d to 1256e.

With the circuit of FIG. 47, any desired two-input logic functions may be implemented by changing the connection of the wires 1250 and 1256.

FIG. 48 shows an example of the circuit structure which has implemented AND, NAND, OR, NOR, XOR and NXOR, using selectors and inverters. For example, if the AND logic is implemented, 0 is selected and output in case the input A is at a low level, so that the output is at a low level. If the input A is at a high level, "B" is output. Hence, the high level is output only when the inputs A and B are both at a high level. The OR logic or the XOR logic may be implemented by changing the input values to the input terminals of the selector 1273.

It is assumed that, in the circuit of FIG. 48, the logic values A and B are given the wires 1250a and 1250b, respectively, with the wire 1250c being at a low level (logic value of 0) at all times. If, using the programming circuits 1270 and 1271, the two-terminal switch element 1103 is programmed so that the wire 1250a is connected to the wire 1256c, the wire 1250b is connected to the wire 1256b, the wire 1250c is connected to the wire 1256a, the wire 1250d is connected to the wire 1256d and the wire 1250e is connected to the wire 1256e, a high level appears on the wire 1256d only when the logic values A and B are both at a high level. This implements the AND logic.

It is assumed that, in similar manner, the logic values A and B are given the wires 1250a and 1250b, respectively, with the wire 1250f being at a high level (logic value of 1) at all times. If the two-terminal switch element 1103 is programmed so that the wire 1250a is connected to the wire 1256c, the wire 1250f is connected to the wire 1256a, the wire 1250c is connected to the wire 1256b, the wire 1256d is connected to the wire 1250d and the wire 1256e is connected to the wire 1250e, a high level appears on the wire 1256d when at least one of the logic values A and B is at a high level. This implements the OR logic.

With use of the two-terminal switch matrix and the programming circuit thereof, it is possible to construct a logic circuit capable of implementing optional two-input logic functions.

With the circuit shown in FIG. 47, it is preferred to use a three-state circuit, capable of providing a high-impedance state output, as the selector 1273 and the inverter 1274, so that, in programming the switch matrix, the outputs of the selector 1273 and the inverter 1274 are at a high impedance, by an input signal from the control input 1272, to render the signal level of the wires 1256d and 1256e immune from the effect due to the output of the three-state circuit.

Figure 49:
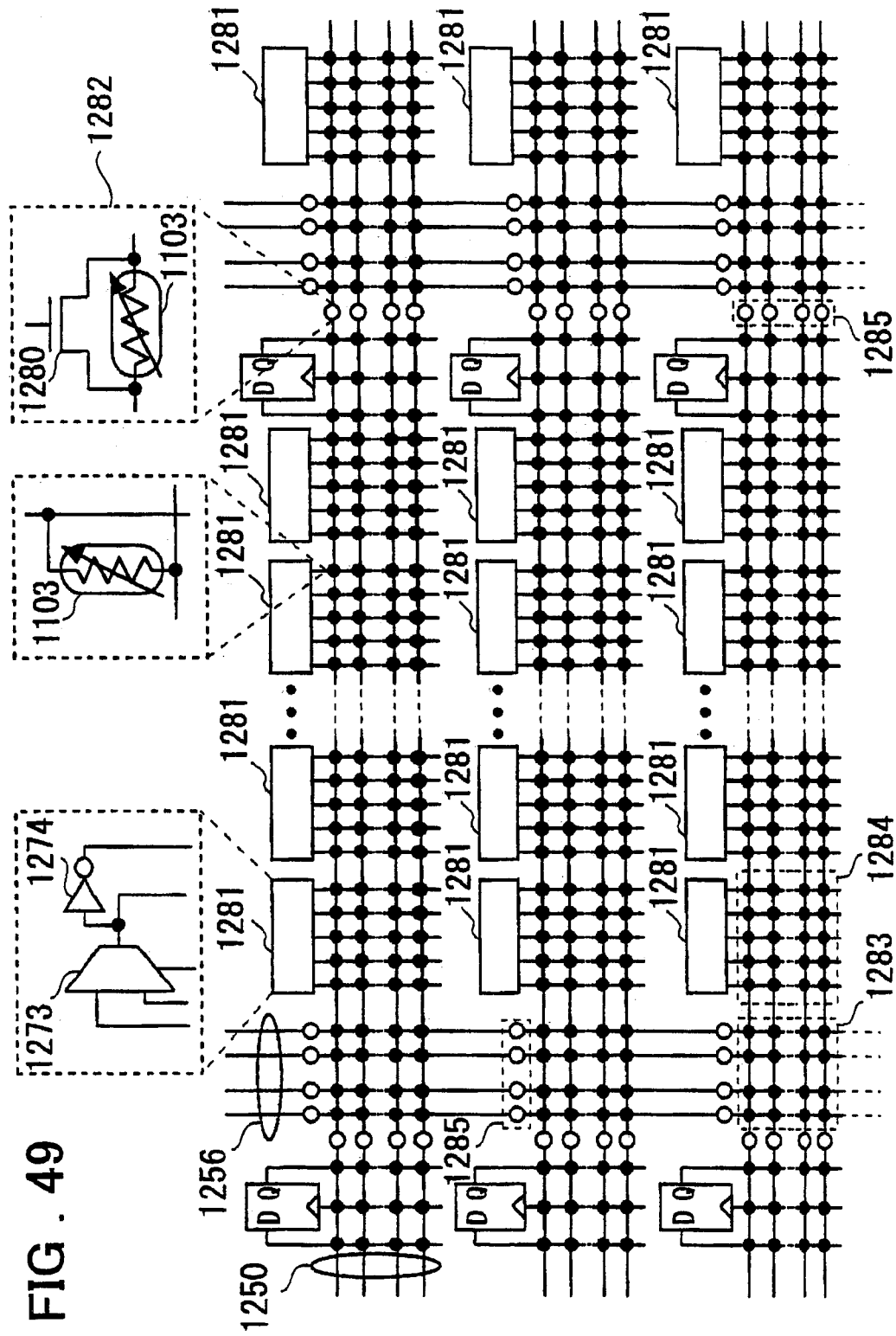
FIG. 49 is a diagram showing the structure of a field programmable logic circuit embodying the present invention.

FIG. 49 shows the structure of an embodiment of a field programmable logic circuit comprised of the combination of the two-terminal switch matrix of the present invention and the programmable logic circuit employing the witch matrix. Referring to FIG. 49, the field programmable logic circuit of the present embodiment is made up by a plural number of logic circuit 1281, each having the selector 1273 and the inverter 1274, a switch matrix 1283, including a vertical wire 1256, a horizontal wire 1250 and two-terminal switch elements 1103 and which is able to program each point of intersection of the vertical wire 1256 and the horizontal wire 1250 to an on-state or to an off-state, a switch matrix 1284, including a two-terminal switch terminal 1103 and which is able to program the on-state or the off-state of the connection of the respective terminals of the programmable logic circuit 1281, and a switch circuit 1282 capable of programming the connection of the wires of the vertical interconnection and 1256 the horizontal wire 1250 and the connection of the wires of the horizontal interconnection to an on-state or to an off-state.

The switch matrixes 1283 and 1284 are each of a structure in which the two-terminal switch element 1103 is arranged at each point of intersection of the vertical wires and the horizontal wires and the two terminals of the switch element 1103 are connected to the vertical wire and the horizontal wire.

The switch 1282 is of such a structure in which the two-terminal switch element 1103 is connected in parallel with the source and drain terminals of a pass transistor 1280.

By programming desired logic functions in the plural programmable logic circuits 1281, changing the connecting state of the switch matrixes 1283, 1284 and the switch 1285, and by optionally programming the interconnection of the plural programmable logic circuits 1281, it is possible to construct a logic circuit having a complex logic function.

Figure 50:
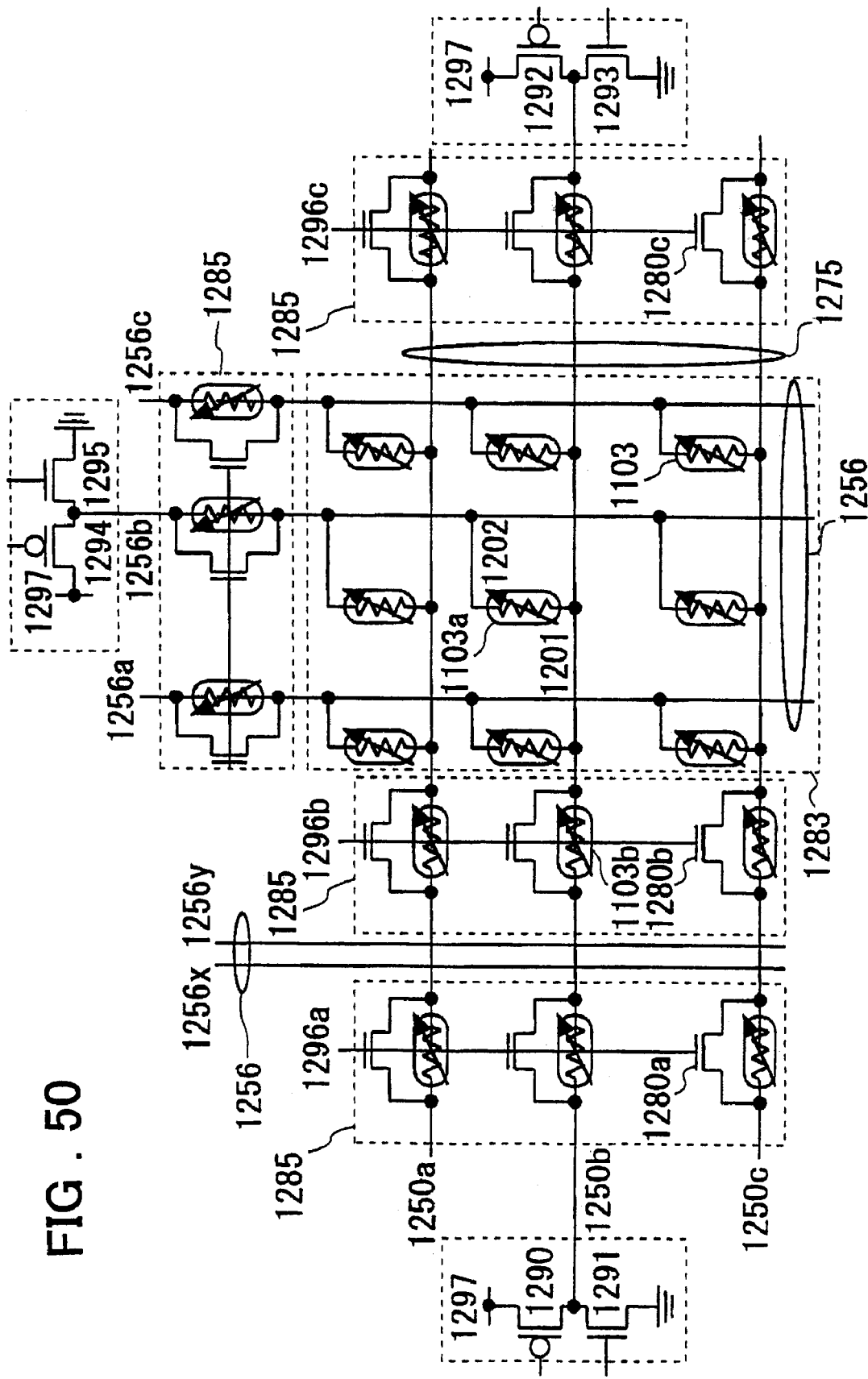
FIG. 50 is a diagram showing the structure of a switch circuit in the field programmable logic circuit embodying the present invention.

FIG. 50 illustrates a programming circuit of the switch 1285 and the switch matrix 1283 of the field programmable logic circuit shown in FIG. 49.

Referring to FIG. 50, the programming circuit of the field programmable logic circuit of the present embodiment is made up by a switch matrix 1283, a switch circuit 1285, a vertical wire 1256, a horizontal wire 1250, pMOS transistors 1290, 1292 and 1294, nMOS transistors 1291, 1293 and 1295, control signal input terminals 1296a, 1296b and 1296c, and a voltage source 1297. The voltage source 1297 has a voltage Vpp higher than the threshold voltage of the switch element 1103.

It is assumed that the switch element 1103a of the switch matrix 1283 is to be programmed to an on-state. The transistors 1290 and 1295 are set to an on-state, the transistors 1291, 1292, 1293 and 1294 are set to an off-state, and a voltage Vpp/2, one-half the voltage Vpp supplied from the voltage source 1297, is applied to the vertical wires 1256a, 1256b, 1256x and 1256y and to the horizontal wires 1250a, 1250c.

The control signal inputs 1296a, 1296b and 1296c are all set to a high level and the transistors 1280 are all turned on.

The voltage Vpp is then supplied from the horizontal wire 1250*b* to an anode terminal of the switch element 1103*a*, while the cathode terminal of the switch element 1103*b* is grounded via the vertical wire 1256*b*.

Since the voltage Vpp exceeding the threshold voltage is applied across the two terminals of the switch element 1103*a*, the switch element 1103*a* is programmed to an on-state. The voltage of Vpp/2 is applied to at least one of the terminals of the remaining switch elements, so that the switch connecting states of these other switch elements remain unchanged.

This enables desired switch elements of the switch matrix 1283 to be programmed.

For programming the totality of the switch elements of the switch matrix 1283, by way of erasure, Vpp is applied to all of the vertical wires 1256, and the totality of the wires of the horizontal interconnection is grounded. The control signal inputs 1296*a* to 1296*c* are all set to the high level so that the transistors 1280 are all turned on.

By so doing, the voltage Vpp is applied to the cathode side of the switch element 1103 via vertical wire 1256, while the anode side of the switch element is grounded via transistor 1280. Thus, the programmed state of the switch element 1103 is erased and set to an off-state.

It is assumed that the switch element 1103*b* in the switch 1285 is to be programmed. To this end, the transistors 1290 and 1293 are set to an on-state, the transistors 1291, 1292, 1294 and 1295 are all set to an off state, the vertical wire 1256 is set in its entirety to the potential of Vpp/2, the control input signals 1296*a* and 1296*c* are set to the high level and the control input signal 1296*b* are set to the low level.

The voltage Vpp is then supplied via transistor 1290 to one of the terminals of the switch element 1103*b*, the other terminal of which is grounded via transistor 1293. No voltage is applied across the terminals of the other switch elements, connected in parallel with these switch elements, because the transistors 1280*a* and 1280*c*, connected in parallel with these other switch elements, are turned on.

On the other hand, the potential difference across the two terminals of the switch elements, connected to the points of intersection of the horizontal wire 1250 and the vertical wire 1256, is less than Vpp/2, because the voltage of Vpp/2 is applied to the vertical wire 1256. Hence, the programmed state of the switch elements at these points of intersection is not changed.

In this manner, the programming state of the switch element 1103*b* optionally selected from the switches 1285 may be changed.

Figure 51:
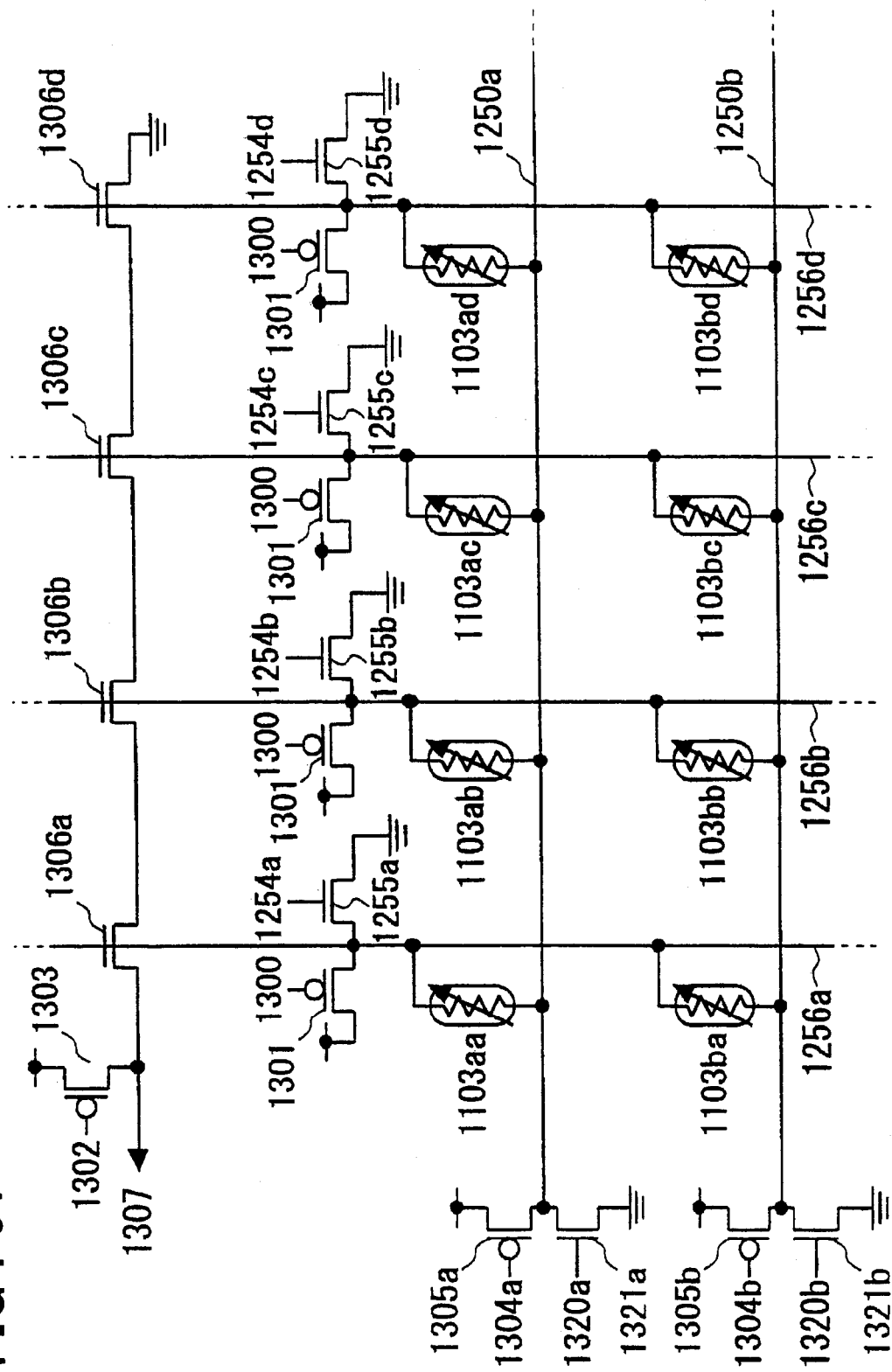
FIG. 51 is a diagram showing the structure of a programming circuit of a switch matrix having a connection verification circuit embodying the present invention.

FIG. 51 shows an example of a circuit for verifying the programming state of the switch matrix according to the present invention. Referring to FIG. 51, a verifying circuit of the present embodiment is made up by a two-terminal switch element 1103, a vertical wire 1256, a horizontal wire 1250, nMOS transistors 1255 and 1306, pMOS transistors 1301, 1301 and 1305, input terminals 1254, 1300, 1302 and 1304 and an output terminal 1307. With use of this verifying circuit, it may be verified, on the row basis, whether or not the totality of switches to be programmed on the row basis is all in the on-state.

For example, it is assumed that the switch elements 1103*aa* and 1103*ac* have been programmed to an on-state. For confirming this, a low level pulse is applied to the input terminal 1300, and the vertical wire 1256 in its entirety is pre-charged through the transistor 1301. A program pattern desired to be verified is then input (1254). For example, since 1103*aa* and 1103*ac* are programmed to an on-state, a high level is set on inputs 1254*aa* and 1254*ac*, and the inputs 1254*a*, 1254*c*, associated with these columns, while a low level is set on other inputs 1254*b* and 1254*d*.

The vertical wire 1256*a* and the vertical wire 1256*c* are then grounded via transistors 1254*a* and 1254*c*, and hence are at the zero potential. A low level pulse then is applied to the input 1302. This pre-charges the output 1307 via transistor 1303. Although the wires 1256*b* and 1256*d* remain pre-charged to a high level, the wires 1256*a* and 1256*c* are at zero potential, so that the transistors 1306*a* and 1306*c* are off. The output 1307 remains pre-charged and hence is kept at a high level.

Then, all of the inputs are reverted to a low level and the input 1304*a* is set to a low level. The wire 1250*a* is then set to the high level via transistor 1305*a*. If the switch elements 1103*aa* and 1103*ac* have been programmed to the on-state, the state of the wires 1256*a* and 1256*c* goes to a high level through these switch elements.

The transistors 1306*a* to 1206*d* are then all set to on-state and the output 1307 is grounded and is at a low level. If the switch element 1103*aa* or 1103*ac* is not programmed as normally and remains off, the wire 1256*a* or 1256*c* remains at the low level, such that the transistor 1306*a* or 1306*c* remains off.

The output 1307 then remains at the high level, and hence it may be detected that the switch, which should normally be programmed to an on-state, is in the off-state. The signal voltage used for these operations is desirably lower than the threshold voltage of the two-terminal switch element 1103.

Figure 52:
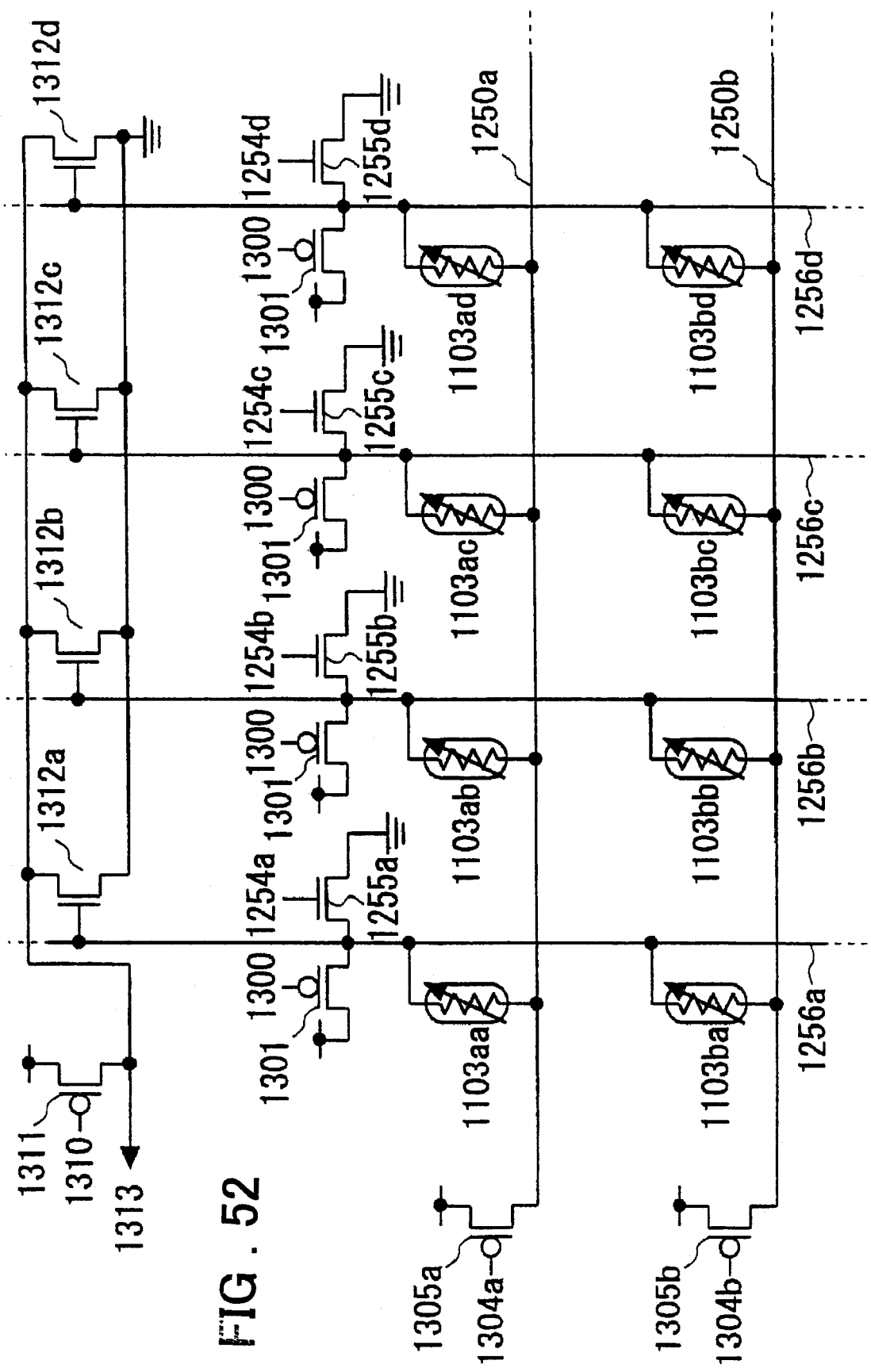
FIG. 52 is a diagram showing the structure of a programming circuit of a switch matrix having a connection verification circuit embodying the present invention.

FIG. 52 shows an example of a circuit for verifying the programming state of the switch matrix. Referring to FIG. 52, a verifying circuit of the present embodiment is made up by a two-terminal switch element 1103, a vertical wire 1256, a horizontal wire 1250, nMOS transistors 1255 and 1312, pMOS transistors 1301, 1305 and 1311, input terminals 1254, 1300, 1304 and 1310 and an output terminal 1313. With use of this verifying circuit, it may be verified whether or not the switches, which should be programmed to an off-state, are all in the off-state. For example, it is assumed that the switch elements 1103*aa* and 1103*ac* have been programmed to an off-state and the switch elements 1103*ab* and 1103*ad* have been programmed to an off-state. For confirming this, a high level pulse is applied to the input terminals 1254*a* to 1254*d*, the vertical wire 1256 in its entirety is grounded and the potential of the interconnection 1256 in its entirety is set to the low level.

A low level pulse then is applied to the input terminal 1304*a* to pre-charge the horizontal wire 1250*a* to the high level through the transistor 1305*a*. Since the switch elements 1103*aa* and 1103*ac* are in the on-state, the vertical wires 1256*a* and 1256*c* are at a high level. A program pattern desired to be verified is then input (1254). For example, since 1103*aa* and 1103*ac* are programmed to an on-state, a high level is set on inputs 1254*a* and 1254*c*, associated with these columns, while a low level is set on other inputs 1254*b* and 1254*d*. The vertical wires 1256*a* and 1256*c* are then grounded via transistors 1254*a* and 1254*c*, such that these wires are at the zero potential.

When a low level pulse is applied to the input 1310, the output 1313 is pre-charged via transistor 1311. The wires 1256*b* and 1256*d* remain at the low level as from the time the interconnection 1256 has been grounded, while the wires 1256*a* and 1256*c* are grounded via transistor 1255, in accordance with an input pattern supplied from the input terminal 1254, after pre-charging to the high level via a transistor 1305*a* and switch elements 1103*aa* and 1103*ac*, so that these wires 1256*a* and 1256*c* are at the low level. Consequently, the transistors 1312*a* to 1312*d* are all off, with the output 1313 remain pre-charged to keep a high level.

If the switch element 1103*ab* or 1103*ad* is not programmed as normally and remain in the on-state, the wire 1256*b* or 1256*d* is at a high level, along with the wire 1256*a* or 1256*c*, when a low level pulse is applied to the input terminal 1304*a*, such that the wire 1256*b* or 1256*d*, which is at a high level, even when a pattern is applied from the input terminal 1254 is supplied, remains at the low level.

The output 1313 then is grounded via transistor 1312*b* or 1312*d*, to issue a low level output. It can be detected in this manner that the switch, which should normally be programmed to an off-state, is in the off-state. The signal voltage, used for these operations, is preferably lower than the threshold value voltage of the two-terminal switch element 1103.

Figure 53:
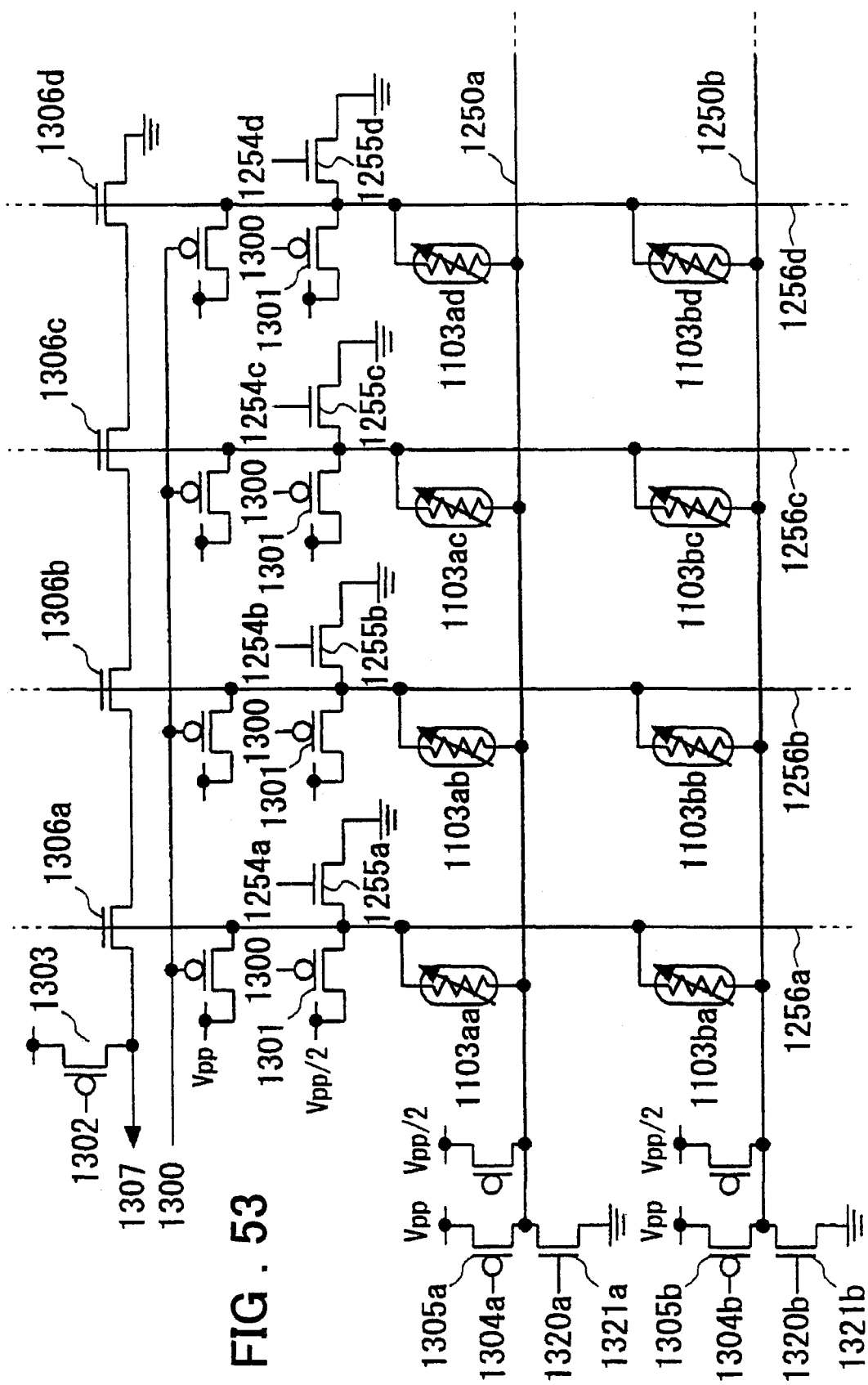
FIG. 53 is a diagram showing the structure of a programming circuit of a switch matrix having a connection verification circuit embodying the present invention.

FIG. 53 shows an embodiment of a circuit for Verifying whether or not part or all of the switch elements of the switch matrix are in the off-state. Referring to FIG. 53, a verifying circuit of the present embodiment is made up by a two-terminal switch element 1103, a vertical wire 1256, a horizontal wire 1250, nMOS transistors 1306 and 1321, pMOS transistors 1301 and 1303, control input terminals 1300, 1302 and 1320 and an output terminal 1307. With use of this verifying circuit, it may be verified, on the row basis or with respect to the switch matrix in its entirety, whether or not there is no on-state switch among the switches which should be programmed in their entirety to the off-state. For this verification, a low level pulse is applied to the input terminal 1300 and the vertical wire 1256 in its entirety is charged to the high level via transistor 1301.

The transistor 1321 of the row desired to be verified is then turned on. For example, if desired to verify two rows collectively, the input terminals 1320*a*, 1320*b* are set to the high level and the horizontal wires 1250*a* and 1250*b* are grounded via transistors 1321*a* and 1321*b*.

If there is any among the switch elements 1103 that is on, the wire 1256 pre-charged to the high level is grounded via the switch element, wire 1250 or the transistor 1321 to fall to the low level.

A low level pulse then is supplied to the input terminal 1302. The output 1307 then is pre-charged to the high level via transistor 1303. If the switch elements 1103 are off in their entirety, the vertical wires 1256 are maintained in their entirety at the high level, and hence the output 1307 is grounded through transistor 1306 to issue a low level. However, if there is any one of the switch elements 1103 that is in on-state, a part of the vertical wires are at the low level. Thus, the transistors 1306 of the column are in an off-state, so that the output 1307 is not grounded and is maintained at the high level.

It is possible in this manner to verify whether or not there is any switch element of the switch matrix that is in an on-state. The signal voltage used for these operations is desirably lower than the threshold voltage of the two-terminal switch element 1103.

Figure 54:
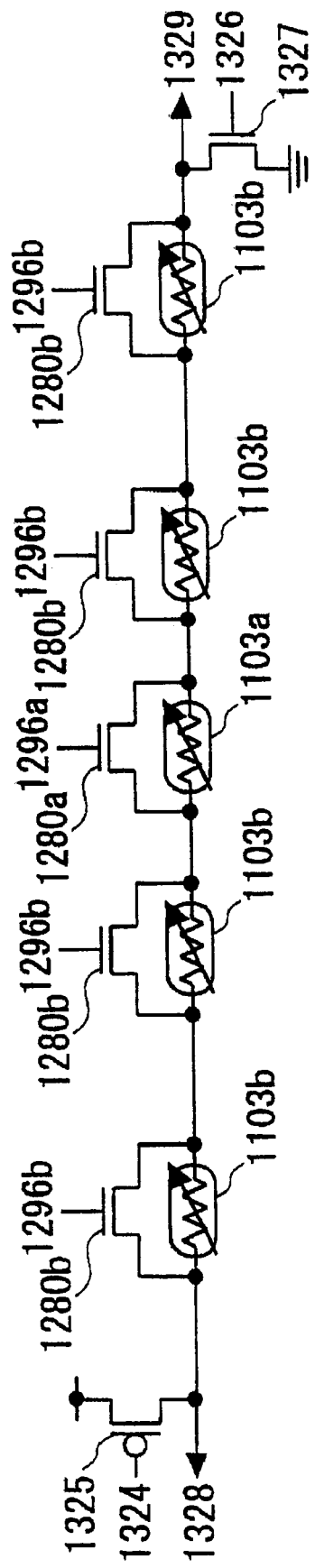
FIG. 54 is a diagram showing the structure of connection verification circuit of a series-connected switching circuit embodying the present invention.

FIG. 54 shows a programmable logic circuit, explained with reference to FIGS. 49 and 50, and specifically shows an embodiment of a circuit for verifying the connection in a structure comprised of a plural number of series-connected switch circuits 1282. Referring to FIG. 54, the verifying circuit of the present embodiment includes a plural number of two-terminal switch elements 1103, connected in series with one another, a transistor 1280, a source terminal and a drain terminal of which are connected in parallel with the switch elements, a control input terminal 1296, connected to the gate terminal of the switch elements, a pMOS transistor 1325, an n-MOS transistor 1327, control input terminals 1324 and 1326, and output terminals 1328 and 1329.

It is now assumed that the connection of the switch element 1103*a* is to be verified as to whether it is in the on-state or in the off-state. An input signal 1296*a* and an input signal 1296*b* are set to a low level and to a high level, respectively. A low level pulse is applied to an input signal 1324. This pre-charges an output signal 1328. If then the input signal 1326 is set to the high level, an output signal 1329 is grounded. If the switch element 1103*a* is in an on-state, the electrical charges, pre-charged in an output terminal 1328, are grounded through transistor 1280*b*, switch element 1103*a* and transistor 1327, so that a low level is output at the output terminal 1328.

If conversely the switch element 1103*a* is in an on-state, the electrical charges, pre-charged in an output terminal 1328, are retained, and hence a high level is output. At this time, the electrical path across two terminals of the switch elements 1103*b*, other than the switch element 1103*a* being verified, is in an on-state, by the transistors 1280*b* connected in parallel with the switch elements 1103*b*, without dependency on whether these switch elements 1103*b* are in the on-state or in the off-state. Thus, these switch elements 1103*b* do not affect the verification of the switch element 1103*a*.

By the above-described sequence of operations, it is possible to check the state of connection of an optional one of the plural series-connected two-terminal switch element. Similar effects for verification may be obtained by a method comprised of applying a high level pulse to the input terminal 1326 to set the output 1329 to a low level, and subsequently applying a low level pulse to the input terminal 1324 to determine the level of the output terminal 1329. The signal voltage used for these operations is desirably lower than the threshold voltage of the two-terminal switch element 1103.

Figure 55:
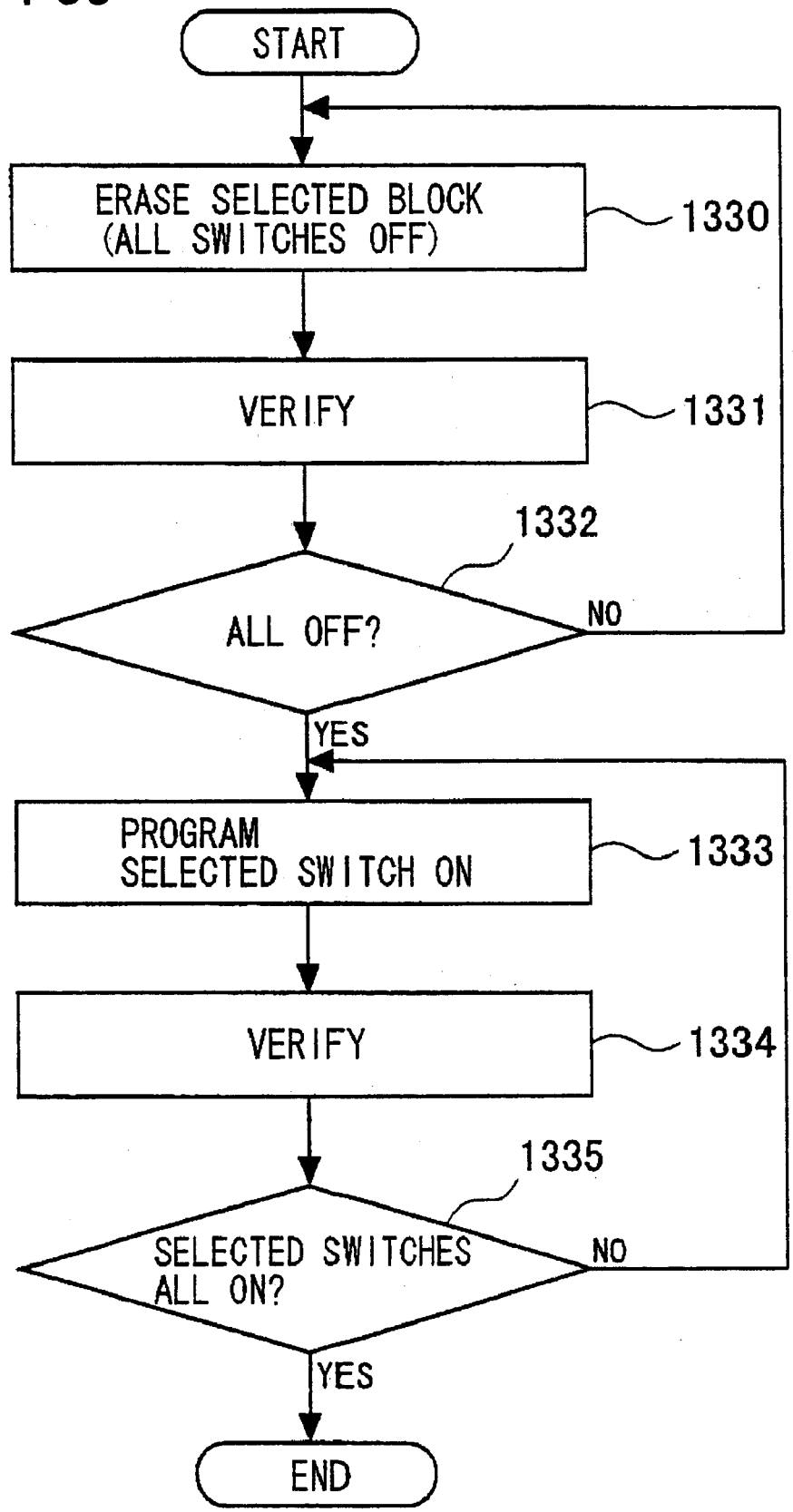
FIG. 55 is a diagram showing the structure of a programming sequence of a series-connected switching circuit embodying the present invention.

FIG. 55 depicts a flowchart showing the programming sequence of the two-terminal switch element 1103 employing the write erasure circuit and the verifying circuit described above. Referring to FIG. 55, the programming sequence for the two-terminal switch element is composed of the following steps:

A part or all of plural switch elements are programmed to an off-state (step 1330).

It is verified whether or not the totality of the switches programmed to the off-state is in the off-state (step 1331).

The result is verified (step 1332). If there is any switch in the off-state, the sequence of operations beginning from the step 1330 is repeated. If conversely the totality of the switches is off, the selected switch element is programmed to the on-state (step 1333).

It is verified whether or not the selected switch element is in the on-state (step 1334).

The result is verified (step 1335). If there is any switch element remaining in the off-state, the sequence of operations beginning from the step 1333 is repeated. If conversely the totality of the switch elements, programmed to the on-state, is programmed to the on-state, the programming comes to a close.

For the step 1330, for programming all of the switches to the off-state, the circuit shown in FIG. 46 may be used.

It is verified whether or not the totality of the switches, programmed to the off-state, is in the off-state (step 1331). For a step 1332, verifying the result, the circuit shown in FIG. 53 may be used.

For the step 1333, for programming all of the switches to the on-state, the circuit shown in FIG. 45 may be used.

For the step 1335, verifying whether or not the selected switch element is in the on-state (step 1334) to verify the result, the circuit shown in FIGS. 51 and 52 may be used.

By the above-described sequence of operations, the desired connection can positively be programmed in a circuit including an interconnection of plural switch elements 1103.

Figure 56:
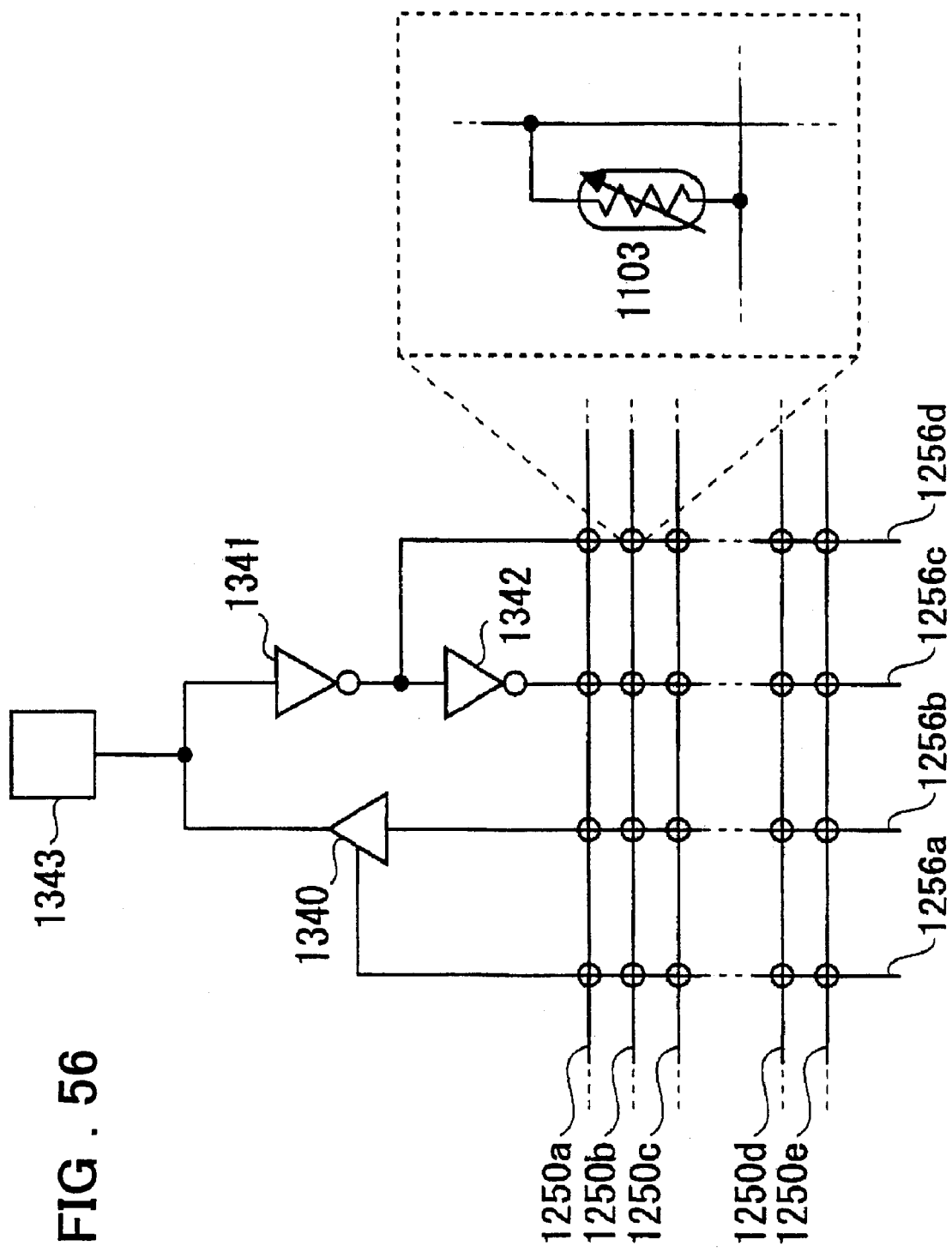
FIG. 56 is a diagram showing the structure of a programmable input/output circuit embodying the present invention.

FIG. 56 shows the structure of an embodiment of a programmable input/output (I/O) circuit employing a switch matrix according to the present invention. Referring to FIG. 56, the I/O circuit of the present embodiment includes a vertical wire 1256, a horizontal wire 1250, a plural number of two-terminal switch elements 1103, each arranged at a point of intersection of the interconnection 1256 and the interconnection 1250, and each having a terminal connected to the interconnection 1256 and having the other terminal connected to the interconnection 1250, a tri-state buffer 1340, an output of which can be set to a high level, a low level and to a high impedance, two inverters 1341 and 1342 and an input/output terminal 1343. The tri-state buffer 1340 outputs a value, entered from the wire 1256b, at the input/output terminal 1343, when the tri-state buffer is supplied with a high level from the wire 1256a. When a low level is entered to the tri-state buffer from the wire 1256a, the output of the tri-state buffer is in a high impedance state.

Assume that, with use of the I/O circuit as an output buffer, the value of the wire 1250a within the LSI is output to outside via input/output terminal 1343. The switch element at an interconnection of the wires 1256a and 1250b and the switch element at an interconnection of the wires 1256b and 1250a are programmed to the on-state, so that, as an example of the switch connection, the wire 1256a and 1250b are connected to each other and the wire 1256b and 1250a are connected to each other. Other switch elements are all connected to an off-state. If it is assumed that a signal of the high level is supplied at all times to the wire 1250b, the tri-state buffer 1340 outputs a signal of the wire 1250a, propagated via wire 1256b, to the input/output terminal 1343.

Assume that, with use of the I/O circuit as an output buffer, the value of the signal input to the input/output terminal 1343 from outside the LSI is entered to the wire 1250d within the LSI and an inverted version of the input signal is entered to the wire 1250e. The switch element at an interconnection of the wires 1256a and 1250b, the switch element at an interconnection of the wires 1256c and 1250d and the switch element at an interconnection of the wires 1256d and 1250e are programmed to the on-state, so that, as an example of the switch connection, the wire 1256a and 1250b are connected to each other, the wire 1256c and 1250d are connected to each other, and the wire 1256d and 1250b are connected to each other. Other switch elements are all connected to an off-state. If a signal of the low level is supplied at all times to the wire 1250b, the output of the tri-state buffer 1340 is in a high-impedance state, so that the input/output terminal 1343 is not affected by the value of the wire 1256b.

The input value from the input/output terminal 1343 is propagated through the inverters 1341 and 1342 and the wire 1256c and output to the wire 1250d. An inverted value of the input value to the input/output terminal 1343 is propagated through the inverter 1341 and the wire 1256d and output to the wire 1250e. By changing the connection of the switch matrix, such I/O circuit may be implemented which may be used for both the input and the output and which may be used for supplying a signal of an optional wire in the chip to outside or outputting a signal entered from outside to an optional wire in the chip.

Figure 57A:
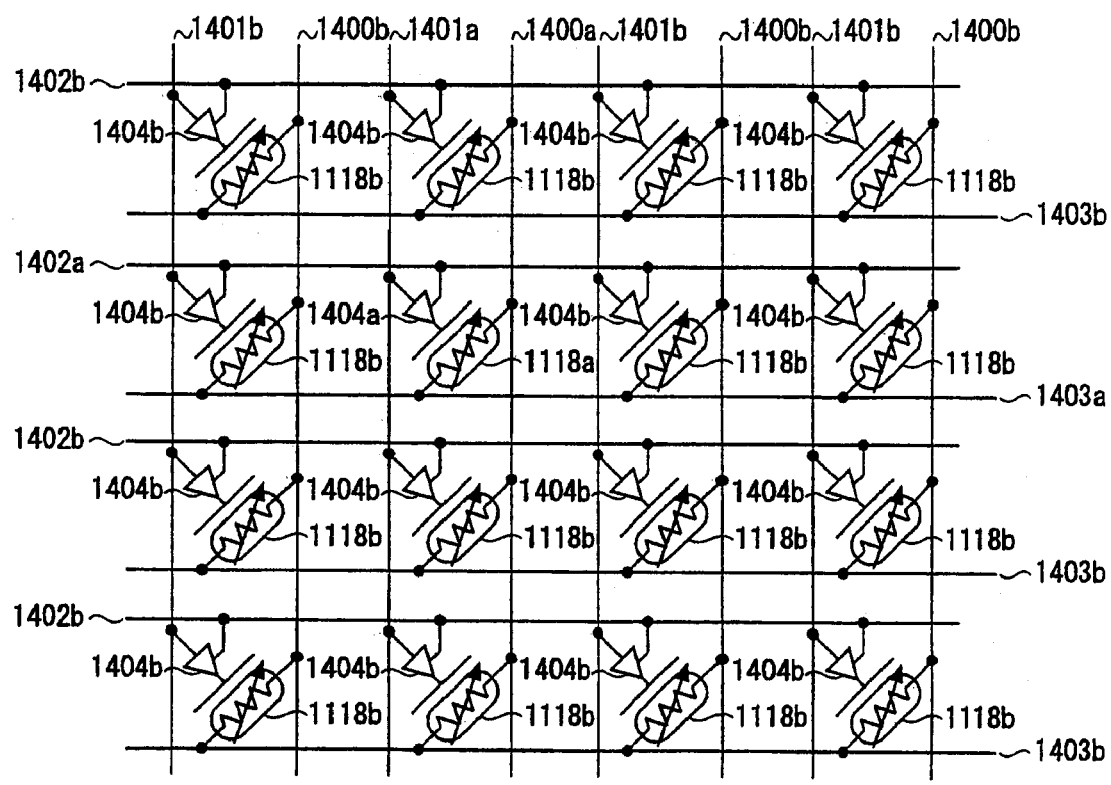
FIG. 57 is a diagram showing the structure of a switch matrix employing a three-terminal switch element embodying the present invention.

FIG. 57A shows a structure of an embodiment of a switch matrix employing a three-terminal switch element explained with reference to FIG. 2. Referring to FIG. 57A, the switch matrix of the present embodiment includes a vertical interconnection 1400, a vertical program control line 1401, a horizontal program control line 1402, a horizontal wire 1403.

Figure 57B:
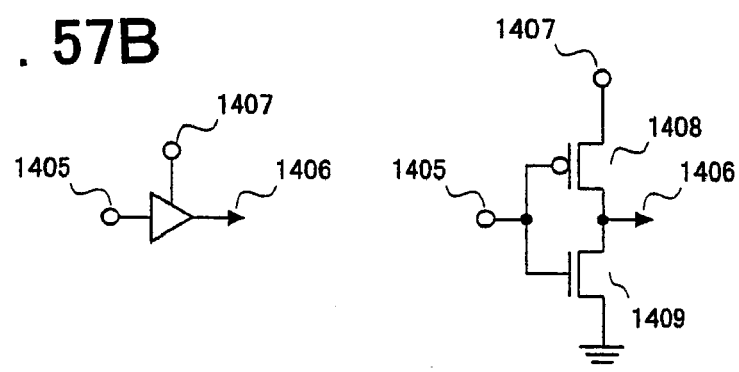

The switch elements 1118 are each provided at a point of intersection between the vertical wire 1400 and a horizontal wire 1403, and has a source terminal or a drain terminal connected to the wire 1400 or to the wire 1403. The gate terminal of the switch elements 1118 is connected to an output terminal of the inverter 1404. The vertical program control line 1401 is connected to the input terminal of the inverter, while the horizontal program control line 1402 is connected to the power supply input of the inverter. Referring to FIG. 57B, the inverter 1404 is made up by an input terminal 1405, an output terminal 1406, a power supply input 1407, a pMOS transistor 1408 and an nMOS transistor 1409. When a high level and a low level are supplied to the input terminal 1405, the output terminal 1406 outputs 0V and a voltage applied to a power supply input 1407, respectively.

The following description is directed to a case in which a switch element 1118a is programmed to an on-state and a wire 1400a is connected to a wire 1403a. The vertical wire 1400 and the horizontal wire 1403 are all grounded and the potential of the source and drain terminals of the three-terminal switch elements 1118 is set to zero.

The vertical program control line 1401b and 1401a are set to the high level. 0V and a voltage Vpp are applied to the horizontal program control lines 1402b and 1402a, respectively. The voltage Vpp is larger than the threshold voltage of the three-terminal switch element. The inverters 1404a and 1404b then output Vpp and 0V, respectively. Hence, the voltage Vpp is applied only to the gate of the switch element 1108a, and an electric path across the source and the drain is programmed to an on-state.

If the switch elements 1118 in their entirety are programmed to an off-state, the voltage Vpp is applied to the entire vertical wiring 1400 and to the entire horizontal wire 1403, while the vertical program control lines 1401 are is set in their entirety to the high level or the horizontal program control lines 1402 are is set in their entirety to 0V. This sets the source and drain terminals in their entirety to a voltage Vpp, while setting the voltage of the gate terminals in their entirety to 0V, and hence the totality of the switch elements 1118 is programmed to the off-state.

With the switch matrix, employing the three-terminal devices, according to the present invention, collective erasure and selective programming of the switch elements are possible, as described above.

With the switch matrix, employing the three-terminal switch element, described above, may be implemented by arranging two transistors and a three-terminal switch element in each point of intersection of the interconnection, the circuit area may be decreased to a fraction of that of a conventional switch matrix in which the conventional switch circuit is arranged at each point of interconnection of the interconnection, as shown in FIG. 39.

Figure 58:
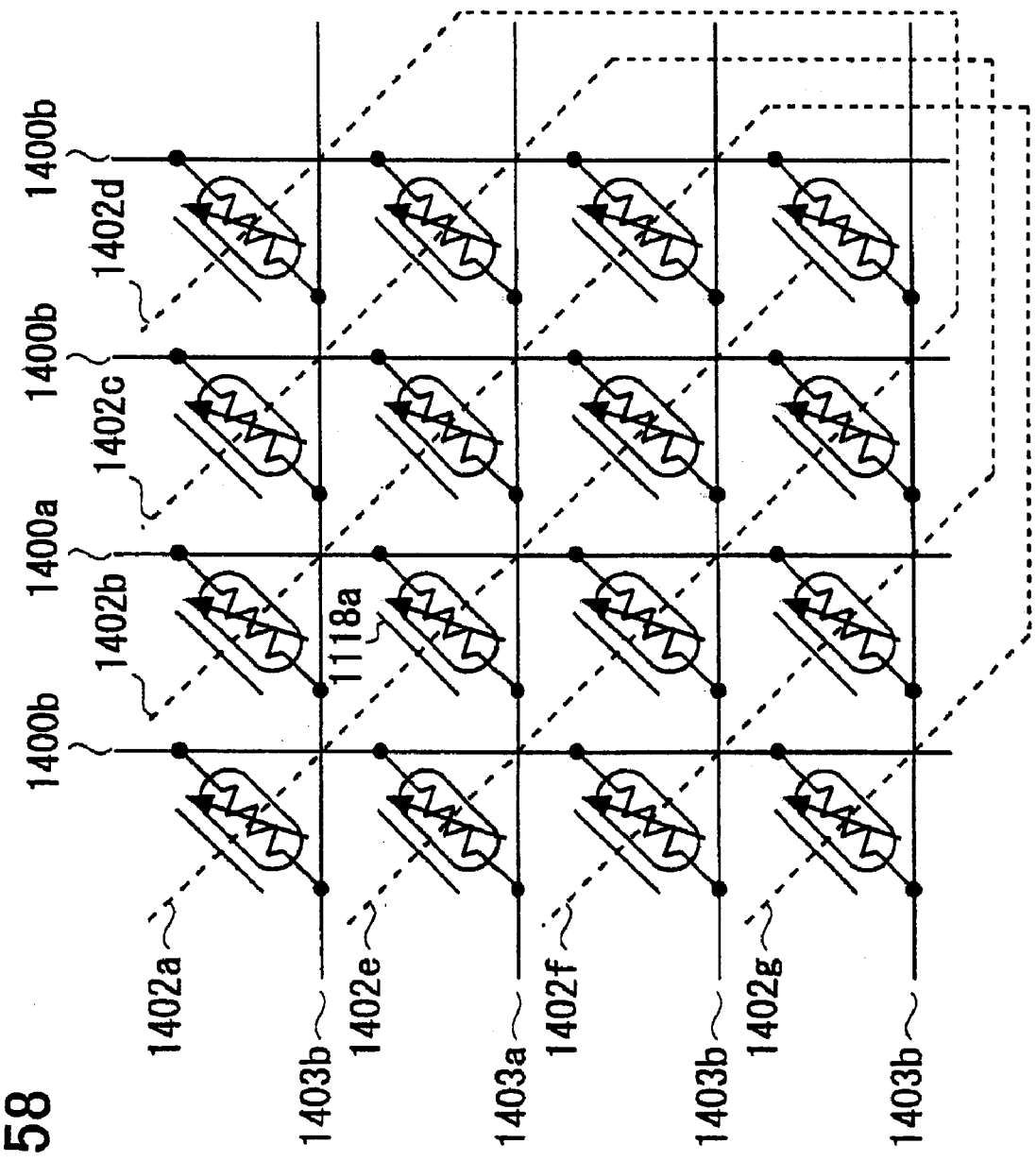
FIG. 58 is a diagram showing the structure of a switch matrix employing a three-terminal switch element embodying the present invention.

FIG. 58 shows the structure of an embodiment of the switch matrix that may be constructed without using transistors. Referring to FIG. 58, the switch matrix of the present embodiment is made up by a vertical wire 1400, a horizontal wire 1403, program control lines 1402 and switch elements 1118.

The switch elements 1118 are provided at the points of intersection of the vertical wire 1400 and the horizontal wire 1403. The source or drain terminal of each switch element 1118 is connected to the wiring 1400 or the wiring 1403, respectively. The gate of each switch element 1118 is connected to the program control lines 1402. The program control lines 1402 may be interconnected as indicated by broken lines in the drawing.

With the switch matrix of the present embodiment, there is only one point of intersection between one of the wires of the horizontal interconnection 1400 and one of the program control lines 1402, as there is only one point of intersection between one of the wires of the horizontal interconnection 1400 and of the program control lines 1403, while there is only one point of intersection between one of the wires of the horizontal wire 1403 and one of the program control lines 1402. That is, the control line 1402 is not connected to the gate terminal of two or more switches in the same column or in the same row. This condition is met if, in case an optional switch element in the switch matrix of m columns by n rows is labeled Sxy, where x<m and y<n, one of the control lines 1402 is connected to Sn,n (N=1, 2, 3 . . . ), while another control line 1402 is connected to Sn+1,n.

The circuit shown in FIG. 58 also satisfies the condition. If, in the circuit shown in FIG. 58, 1402*b*-1402*g*, 1402*c*-1402*f* and 1402*d*-1402*e* are connected together, as indicated by broken lines, to yield four program lines, the above condition is similarly met.

It is now assumed that, in the switch matrix, shown in FIG. 58, the switch element 1158*a* is programmed to an on-state, to interconnect the wires 1400*a* and 1403*a*. The wires 1400*a* and 1400*b*, connected to the source and drain terminals of the switch element 1118*a*, are grounded, and a voltage Vpp is applied to the program control line 1402*a* connected to the gate terminal of the switch element 1108*a*. The wires 1400*b*, 1403*b* and 1402*b*, connected to none of the terminals of the switch element 1108*a*, are set to a voltage of Vpp/2. The voltage Vpp exceeds the threshold voltage of the switch element 1118, with the half-voltage Vpp thereof not exceeding the threshold voltage.

Under these conditions, 0V is applied to the source and drain terminals of the switch element 1118*a*, while Vpp is applied to the gate terminal thereof, so that the potential difference across the gate and the channel is Vpp. The switch element 1118*a* is programmed to an on-state. On the other hand, the voltage of Vpp/2 is applied to the source and drain terminals of other switch elements, connected to the program control line 1402*a*, so that the potential difference from the gate potential is Vpp/2, with the programming state not being changed. With other switch elements, the gate terminal voltage is Vpp/2, while the voltage of the source and drain terminals is 0 to Vpp/2, so that the potential difference is 0 to Vpp/2, with the programming state not being changed.

For selectively programming the switch element 1118*a*, in the on-state, to an off-state, it is sufficient to set the wires 1400*a* and 1403*a* to Vpp, to set the program control line 1402*a* to 0V and to set other terminals to Vpp/2. This enables programming of an optionally selected sole switch element to an on-state or to an off-state.

For programming the totality of the switch elements to an off-state, the voltage Vpp is applied to all of the wires 1400 and to all of the wires 1403, and all of the program control lines 1402 are grounded. In this case, the voltage Vpp is applied to the source and drain terminals of the totality of the switch elements, and the gate terminals are at 0V in their entirety, so that the voltage of −Vpp is applied across the gate and the channel of each switch element. Thus, the switch elements are programmed in their entirety to the off-state.

In the switch matrix, constructed without using the transistors, shown in FIG. 58, lumped erasure and selective programming of the switch elements may be achieved, as described above.

In the switch matrix, constructed without using the transistors, according to the present invention, the circuit area may be reduced, as compared to the conventional structure comprised of the combination of the SRAM, FF(flip-flop)s and pass transistors, because neither SRAMs nor FFs are needed. Moreover, since no transistors are used, the switch matrix may be formed by arraying three-terminal switch elements in the interconnection layer, thereby further reducing the circuit area. In addition, transistors may be freely arranged below the interconnection layer, forming the switch matrix, and hence further transistor circuits and the switch matrix may be arranged three-dimensionally, thereby drastically increasing the area efficiency of the LSI.

Figure 59:
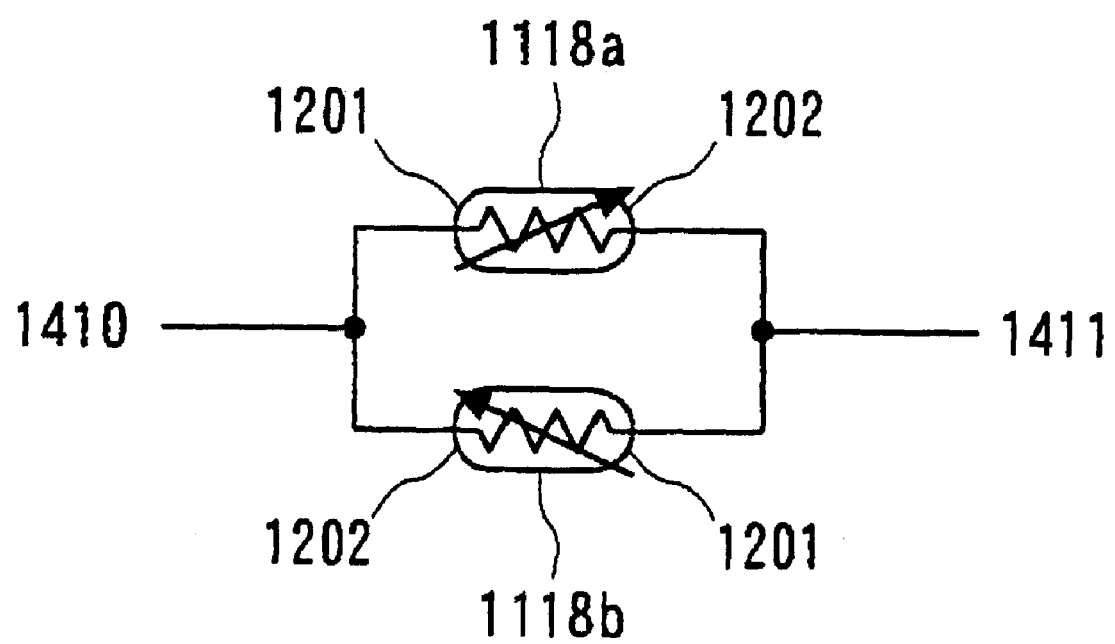
FIG. 59 is a diagram showing the structure of a non-polar switch circuit embodying the present invention.

FIG. 59 shows the structure of a non-polarity switch employing switch elements 1118. Referring to FIG. 59, this switch is comprised of a parallel connection of two two-terminal switch elements 1118*a* and 1118*b* so that the polarities thereof are opposite to each other, with the two-terminal switch elements being of a symmetrical structure across the terminals 1410 and 1411. If the voltage Vpp exceeding the threshold voltage is applied from the terminal 1410 and 0V (ground potential) is applied from the terminal 1411, the forward bias is applied to the switch element 1103*a*, and hence the electrical path across the terminals 1410 and 1411 is programmed to an on-state. If the voltages applied across the terminals 1410 and 1411 are interchanged, the electrical path across the terminals 1410 and 1411 is programmed to an on-state, because the forward bias is applied to the switch element 1103*b*.

In this manner, there may be provided a non-polarity switch which may be programmed to an on-state without regard to from which terminal the voltage is applied. Since the present device operates basically as an antifuse, the device may be applied to a pre-existing antifuse circuit.

FIGS. 60A, 60B and 60C show a circuit structure, a layout view and a cross-sectional view of an embodiment of a memory cell array employing the switch elements 1103, respectively. Referring to FIG. 60A, the memory cell array of the present invention is made up by two-terminal switch elements 1103, word lines 1500, bit lines 1501, plate lines 1502, wires or vias 1503 and transistors 1504.

With each of the transistors 1504, the gate terminal is connected to the word line 1500, and the source and drain terminals are connected to the anode and cathode terminals of the switch element 1118.

A plural number of memory cells, each comprised of the switch element and the transistor, are connected in series with one another. Out of the plural transistors 1504, connected in series with one another, the neighboring transistors share the sources and drains. A plural number of series connections of the memory cells are juxtaposed in parallel with one another and the shared word lines.

Figure 61:
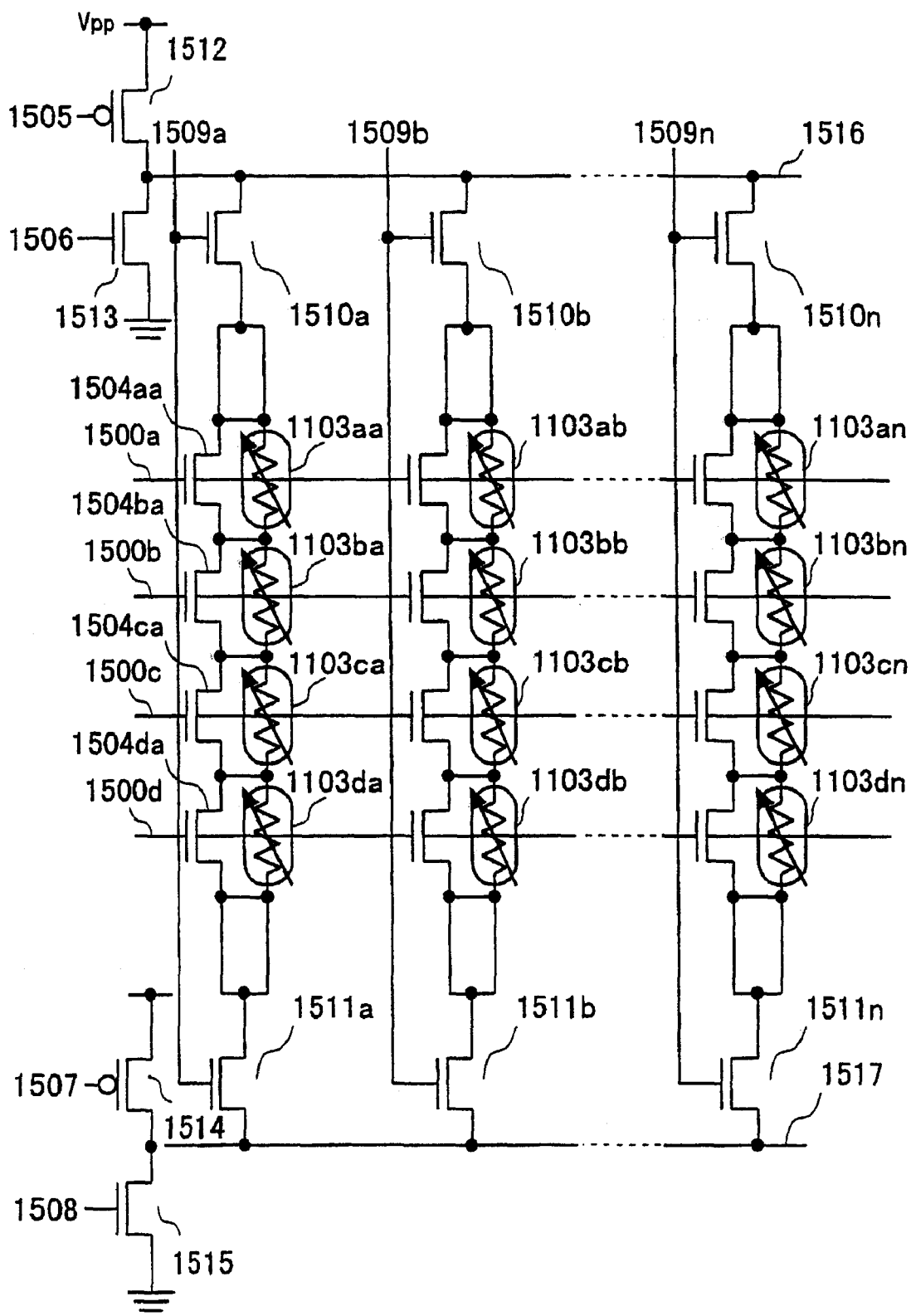
FIG. 61 illustrates the operation of the memory cell array of FIG. 60.

An example of programming optionally selected memory cells in the memory cell array is described with reference to FIG. 61. Taking the case of programming the switching device 1103*ba*, as an example, the word line 1500*b*, to which is connected the memory cell to be programmed, is set to the low level, while other word lines 1500*a*, 1500*c* and 1500*d* are all set to the high level.

For connecting the memory cell column, desired to be programmed, to the bit line and to the plate line, the word line 1509*a* is set to the high level. The memory cells 1103*ab* to 1103*dn* are not programmed and hence the word lines 1509*b* to 1509*n* are all set to the low level.

Under these conditions, the voltages on the bit line 1516 and the plate line 1517 are transmitted to both terminals of the switch element 1103*ba*, via transistors 1504*aa*, 1504*ca* and 1504*da*, without dependency on whether the switch elements 1103*aa*, 1103*ca* and 1103*da* are on or off, respectively.

The transistor 1504ba, connected in parallel with the switch element 1103ba, is in the off-state and hence current does not flow through the transistor 1504ba, such that the voltage on the bit line 1516 and that on the plate line 1517 is applied across the two terminals of the anode and the cathode of the switch element 1103ba. By applying signals to input terminals 1505, 1506, 1507 and 1508, and by suitably setting the transistors 1512, 1513, 1514 and 1515 to an on-state or to an off-state, the voltage on the bit line 1516 and that on the plate line 1517 may be controlled to apply the forward bias or the reverse bias to the switch element 1103ba. Since the transistors 1504aa, 1504ca and 1504da, to which are connected the switch elements 1103aa, 1103ca and 1103da in parallel, are turned on, no potential difference sufficient for rewriting is generated across the two terminals of these switch elements.

On the other hand, since the switch elements 1103ab, 1103bb, 1103cb, 1103db, 1103an, 1103bn, 1103cn and 1103dn are disconnected from the bit line 1516 and the plate line 1517, by the transistors 1510b, 1510n, 1511b and 1511n, the voltage on the bit line 1516 or the voltage on the plate line 1517 is not applied to the switch element, such that the programming state is not changed. This enables the programming state of the optionally selected switch element to be changed.

The memory cell structure of the present invention, as compared to the memory cell structure comprised of series connection of transistors and switch elements, shown in the Patent Publication (Claim 12 of the U.S. Pat. No. 6,487,106), has such merits that the memory cell area may be diminished and the storage capacity per unit area of the chip may be increased.

Figure 60:
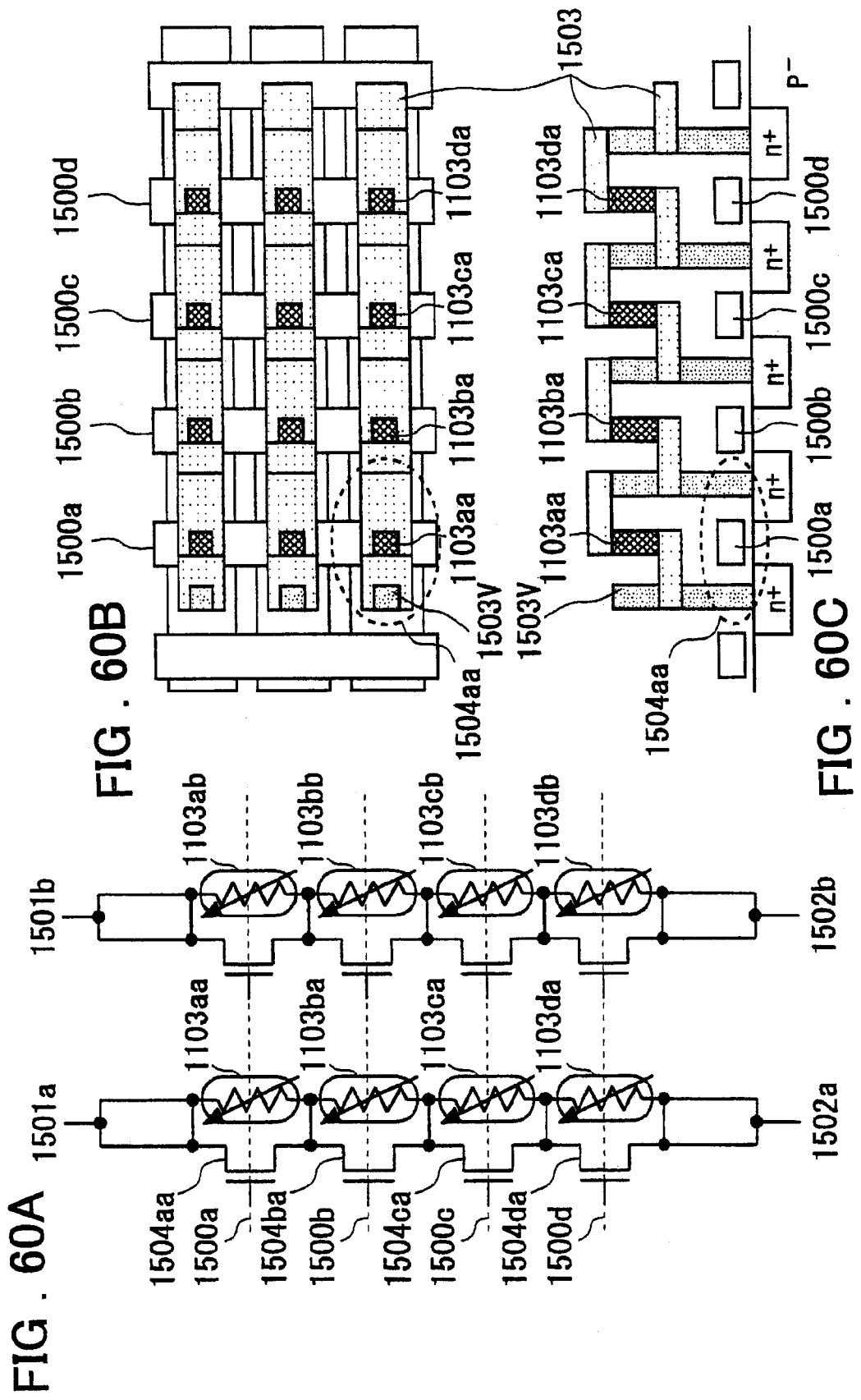
FIGS. 60A, 60B and 60C are a circuit diagram, a layout view and a cross-sectional view, respectively, of a memory cell array embodying the present invention.
Figure 62B:
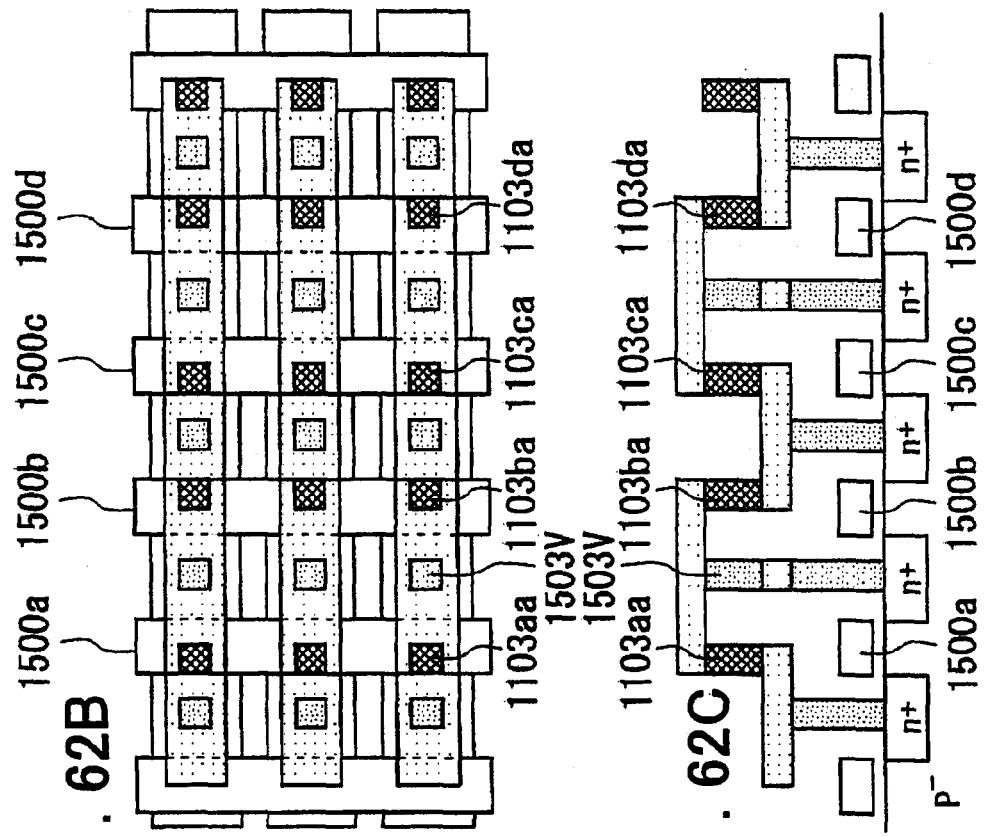
FIGS. 62A, 62B and 62C are a circuit diagram, a layout view and a cross-sectional view, respectively, of a memory cell array embodying the present invention.
Figure 62C:
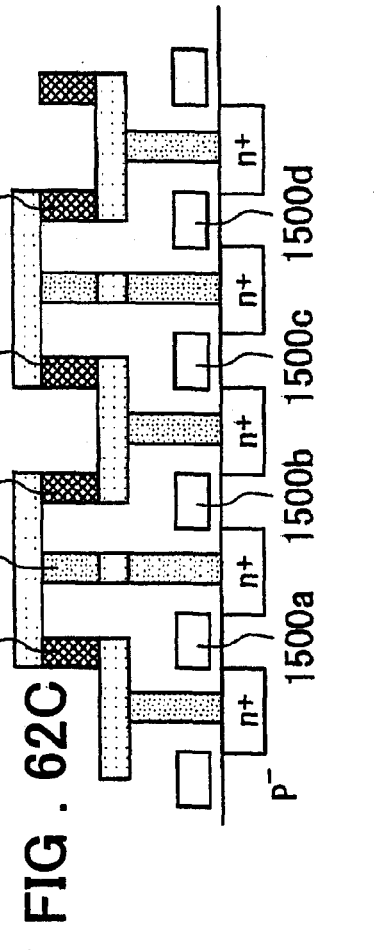
Figure 62A:
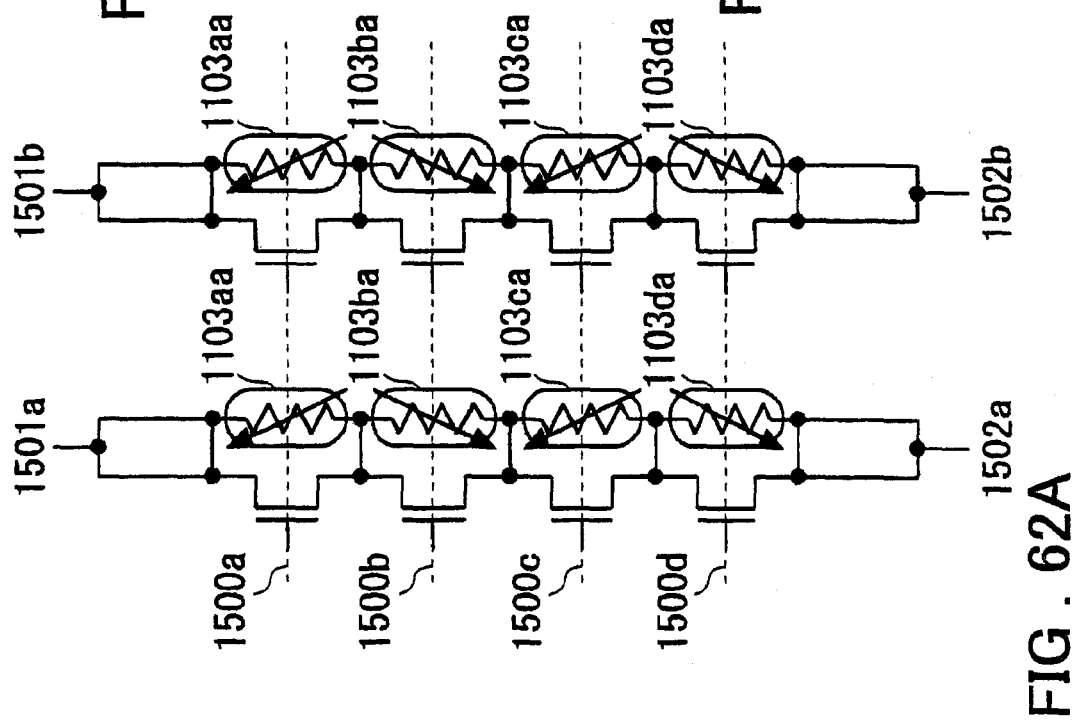

FIGS. 62A, 62B and 62C show a circuit structure, a layout view and a cross-sectional view of a modification of a memory cell array, employing the two terminal switch elements 1103, shown in FIG. 60, respectively. In the present modification, the anodes and the cathodes of the two-terminal switch elements are alternately reversed in orientation. That is, in any two optional neighboring two-terminal switch elements, the anodes of the switch elements are connected together, or the cathodes of the switch elements are connected together.

In the memory cell array of FIG. 60, one via 1503V of a normal interconnection and a switch element 1103 in the form of a via are arrayed in juxtaposition in each memory cell, such that, from the constraint of the via diameter and the interval between the vias, it is difficult to reduce the cell area.

In the memory cell array of FIG. 62, the via 1503V in the metal interconnection is shared by two memory cells, and hence one-half via 1503V and one switch element 1103 are arrayed in one memory cell. Since the number of vias 1503v may be reduced in this manner, the interval between the neighboring vias may be reduced, and hence the storage capacity per unit area of the chip may be higher than that of the structure shown in FIG. 60.

However, with the switch elements 1103, connected in series with one another in the vertical direction, even-numbered devices and odd-numbered devices are inverted in polarity. For this reason, such functions as inverting the bias direction at the time of programming or inverting the allocation of logic values '0' and '1' for the on-state and the off-state at the readout time for the odd-numbered memory cells and for the even-numbered memory cells may desirably be implemented in the write circuit or in the read-out circuit.

Figure 63A:
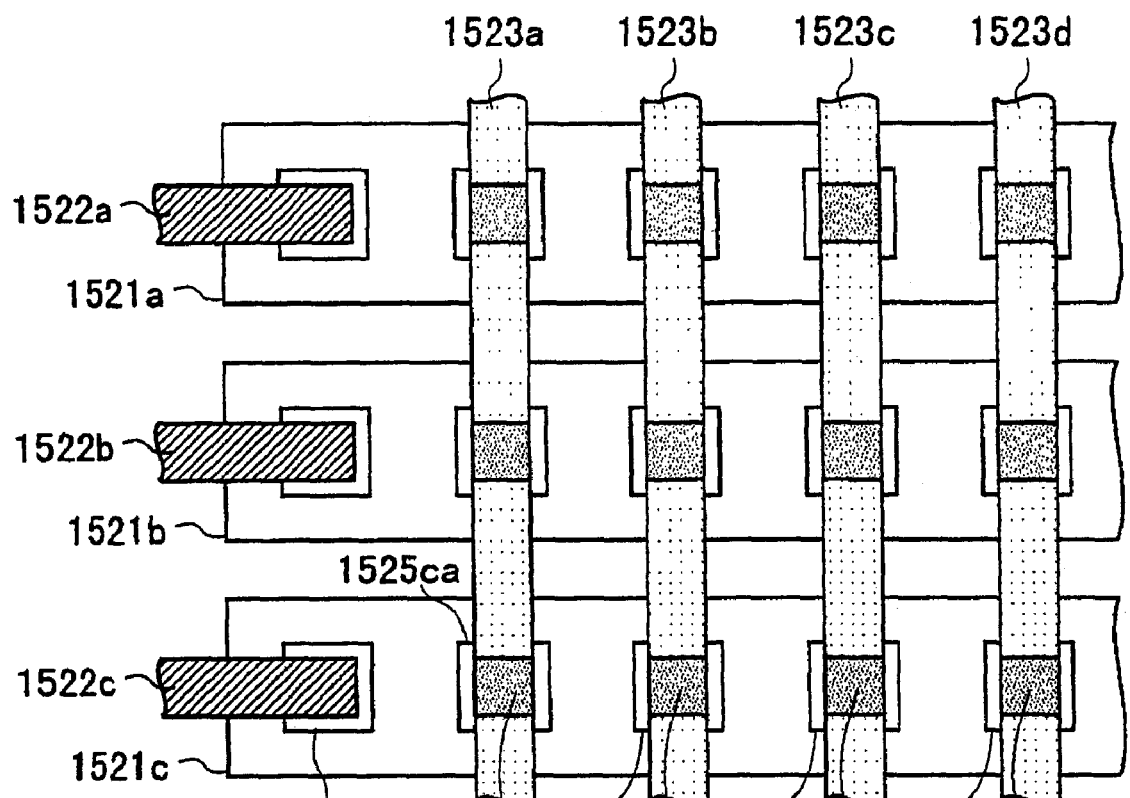
FIGS. 63A and 63B are a layout view and a cross-sectional view, respectively, of a memory cell array embodying the present invention.
Figure 63B:
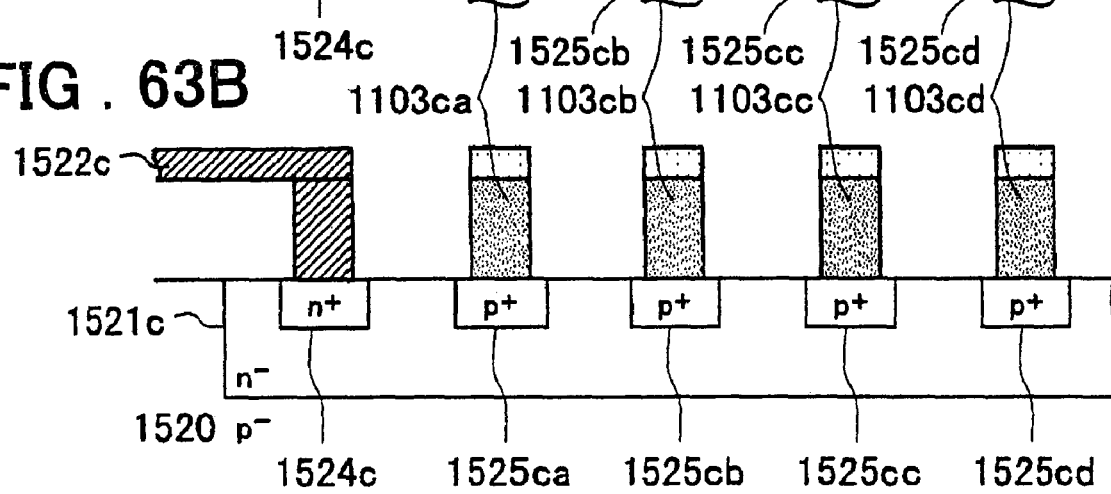

FIGS. 63A and 63B show an embodiment of a memory cell array employing two-terminal switch elements 1103 in a layout view and in a cross-sectional view, respectively. Referring to FIG. 63, the vertical wire 1523 of the memory cell array is made by a metal interconnection layer, while the horizontal wires is made up by N-wells 1521. The N-wells 1521 are each connected to the wiring 1522 via N+ diffusion region (heavily doped N+ region) 1524. Since the connection of the switch element 1103 and the N-well 1521 is via a P+diffusion region (heavily doped P+ region) 1525, there is formed a diode connected in series across the switch element 1103 and the N-well 1521.

The two-terminal switch element 1103 has an anode terminal and a cathode terminal connected to the P+ diffusion region 1525 and the wire 1523, respectively. Since this memory cell array is not in need of access transistors for read/write, so that the cell area may be smaller than that of the conventional structure.

Figure 64:
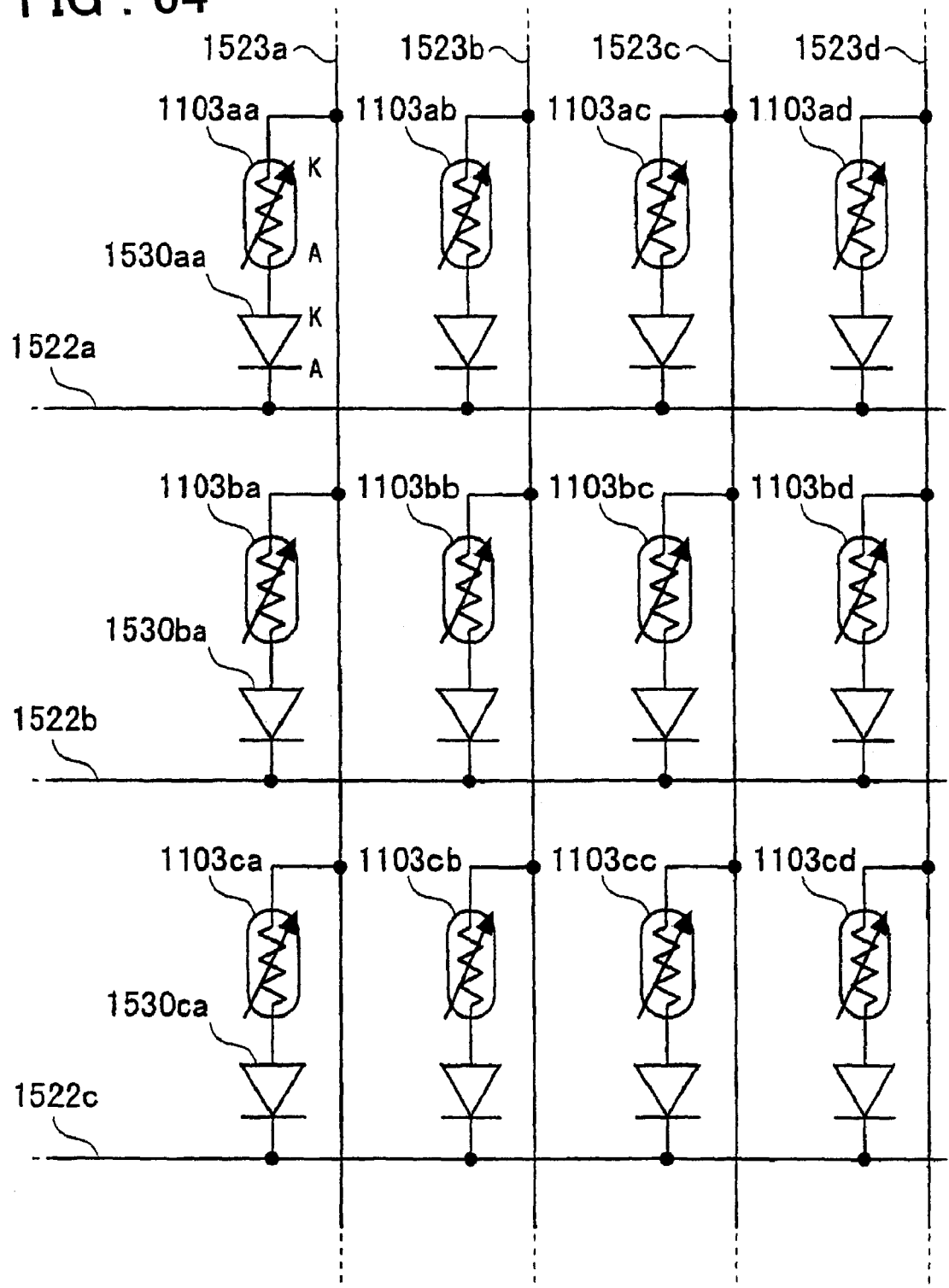
FIG. 64 illustrates the operation of the memory cell array of FIG. 63.

FIG. 64 shows the layout structure of FIG. 63A by a circuit diagram (equivalent circuit) for illustrating the memory cell readout and write explained with reference to FIG. 63. In FIG. 64, the junction of the N-well 1521 and the P+ diffusion layer 1525 is labeled as a diode 1530. This diode 1530 is connected in series with the switch element 1103. The anode terminal of the diode 1530 is connected to the anode terminal of the switch element 1103.

It is assumed that the threshold value of the switch element 1103 is lower by not less than 0.7V than the voltage Vpp and that turning the switch element on or off denotes erasure and write, respectively. It is also assumed that, in the initial state, the voltage of the anode terminal of the totality of the diodes is on the order of 0 to 0.7V.

First, the case of erasing the totality of bits is now explained. The wiring 1522 is grounded in its entirety and a voltage −Vpp lower than the grounded voltage is applied to the totality of the wire 1523. Since the voltage on the order of 0 to 0.7V is applied to the anode of the switch element 1103, and the voltage −Vpp is applied to the cathode thereof, the switch elements 1103 are forward-biased and hence are turned on in their entirety. Because of the diode 1530, no current flows through the wire 1523, from the wiring 1522, even if the switch elements are turned on. In this manner, the totality of the switch elements is erased. When the switches are turned on in their entirety, the totality of the wiring 1523 is grounded.

The case of writing the selected bit is now described. If the switch 1103ba is turned on for writing, as an example, the positive voltage Vpp is applied to the wire 1523a, while the wires 1523b, 1523c and 1523d are grounded. The wire 1522b is grounded and a positive voltage (e.g. Vpp or Vpp/2) is applied across 1522a and 1522c.

The positive voltage Vpp is then applied from the wire 1523a to the cathode terminal of the switch element 1103ba, and the anode terminal is grounded via diode 1530ba and wire 1522b. Thus, the switch element 1103ba is reverse-biased and written to the off-state. If written to the off-state, the anode side potential of the switch element 1103ba converges to a range from 0V to 0.7V via diode 1530ba. Since the voltage is applied to both the anodes and the cathodes of the switch elements 1103aa and 1103ca, via wires 1522a and 1522c, these switch elements are not written to the off-state, unless the potential difference across the anode and cathode terminals exceeds the threshold voltage. Moreover, since the wires 1523b, 1523c and 1523d are grounded, no reverse bias is applied to the switch elements, connected thereto, such that writing is not made in these switch elements.

Since the diode interrupts the voltage across the wires 1522a and 1522c, no forward bias is applied to the switch element 1103, and hence there is no fear of destructing the stored contents of the two-terminal device programmed to the off-state.

In reading out the wire 1523ba (switch element 1103ba), the potential on the wire 1522b is set so as to be lower by not lower than 0.7V than the potential of the wire 1523a. The potential on the wires 1522a and 1522c is set so as to be equal to or larger than that on the wire 1523a, while that on the wires 1523b, 1523c and 1523d is set so as to be equal to or lower than that on the wire 1522b.

The condition is now such that only the diode 1530ba is forward-biased, so that, if the switch element 1103a is on, the current flows from the wire 1523a to the wire 1522b, via diode 1530ba, whereas, if the switch element 1103a is off, there is no current flow. By detecting the current on the wire 1523a or on the wire 1522b, or by detecting whether or not the pre-charged voltage is maintained in the wire 1523b, it is possible to read out the state programmed in the switch element 1103ba.

Figure 65:
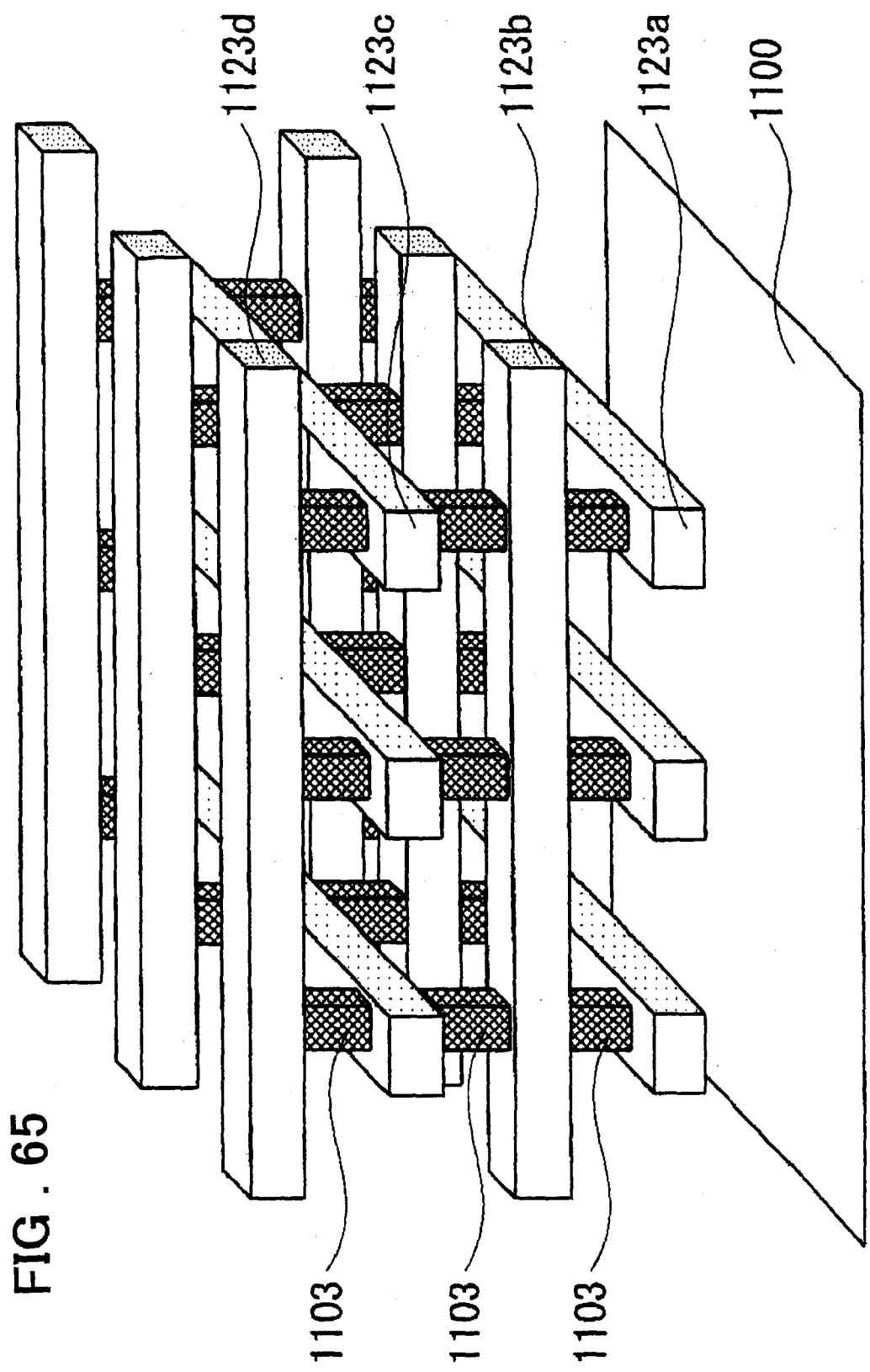
FIG. 65 shows the structure of an integrated circuit, including switching devices arranged three-dimensionally in an interconnection layer, embodying the present invention.

FIG. 65 shows the structure of a three-dimensionally arranged switch array according to an embodiment of the present invention. Referring to FIG. 65, the switch array of the present embodiment includes a semiconductor substrate 1100, a switch element 1103, a first interconnection layer 1123a, a second interconnection layer 1123b, a third interconnection layer 1123c and a fourth interconnection layer 1123d. The switch element 1103 is arranged between each of these interconnection layers.

The conventional switch circuit, formed by semiconductor devices, suffers from a drawback that, since the circuit is formed to a planar state on the semiconductor substrate 1100, the area taken up by the switch elements is increased relative to the number of the switches.

With the switch array structure, according to the present invention, employing the switches formed in the interconnection layer, the switch elements may be formed buried in multi-layers and hence may be formed to multi-layers. This enables the number of switches per unit area to be increased to improve the integration degree.

It should be noted that the present invention may encompass various changes or corrections of the semiconductor integrated circuit, having switch elements in the contact area or in the interconnection layer, without departing from the principle and the scope of the invention as set forth in the claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

The invention claimed is:

1. A memory device comprising:
a semiconductor substrate;
a variable electrical conductivity switch element comprising a via connecting a wire in a first interconnection layer to a wire in a second interconnection layer, the via including a member having a variable value of electrical conductivity, wherein the wire of the first interconnection layer is a first terminal of said switch element and the wire in the second interconnection layer is a second terminal of said switch element, and wherein a connection between said first and second terminals is variably set to a shorted state, an open circuit state, and a state between said shorted and open circuit states; and
at least a memory cell including said switch element and a transistor arranged on the semiconductor substrate,
wherein one of said first and second terminals of said switch element is connected to one of the source and the drain of said transistor, the other of said first and second terminals is connected to one of a bit line and a plate line, the other of the source and the drain of said transistor is connected to the other of said bit line and the plate line, and the gate terminal of said transistor is connected to a word line, and
wherein said switch element is arranged above said transistor,
wherein said variable electrical switching element includes an electrolyte material, said electrolyte material includes a sulfide of one or more elements selected from the group consisting of copper, silver, chromium, tantalum, tungsten and mixtures thereof.

2. A memory device comprising:
a semiconductor substrate;
a variable electrical conductivity switch element comprising a via connecting a wire in a first interconnection layer to a wire in a second interconnection layer, the via including a member having a variable value of electrical conductivity, wherein the wire of the first interconnection layer is a first terminal of said switch element and the wire in the second interconnection layer is a second terminal of said switch element, and wherein a connection between said first and second terminals is variably set to a shorted state, an open circuit state, and a state between said shorted and open circuit states;
at least a memory cell including said switch element and a transistor arranged on the semiconductor substrate;
a current source connected to one of said bit line and the plate line, to which is connected said memory cell; and
a voltage comparator for comparing the voltage on one of said bit line and the plate line, to which is connected said memory cell, to a reference voltage,
wherein one of said first and second terminals of said switch element is connected to one of the source and the drain of said transistor, the other of said first and second terminals is connected to one of a bit line and a plate line, the other of the source and the drain of said transistor is connected to the other of said bit line and the plate line, and the gate terminal of said transistor is connected to a word line, and
wherein said switch element is arranged above said transistor.

3. The memory device according to claim 2, further comprising a write circuit for supplying the current to said memory cell from said current source to cause the voltage entered to said voltage comparator to be changed in keeping with the electrical conductivity of said switch element, for comparing the voltage entered to said voltage comparator to said reference voltage to decide whether the electrical conductivity of said switch element is higher or lower than the target electrical conductivity, and for detecting the end of programming based on the decided result.

4. A memory device comprising:
a semiconductor substrate;
a variable electrical conductivity switch element comprising a via connecting a wire in a first interconnection layer to a wire in a second interconnection layer, the via including a member having a variable value of electrical conductivity, wherein the wire of the first interconnection layer is a first terminal of said switch element and the wire in the second interconnection layer is a second terminal of said switch element, and wherein a connection between said first and second terminals is variably set to a shorted state, an open circuit state, and a state between said shorted and open circuit states;

at least a memory cell including said switch element and a transistor arranged on the semiconductor substrate;

a replica memory cell, corresponding to substitution by a resistor device or a transistor of said switch element of said memory cell;

a first current source connected to one of the bit line and the plate line to which is connected said memory cell;

a second current source connected to one of the bit line and the plate line to which is connected said replica memory cell; and a voltage comparator having two input terminals connected to one of said bit line and the plate line, to which is connected said memory cell, and to one of said bit line and the plate line, to which is connected said replica memory cell, wherein one of said first and second terminals of said switch element is connected to one of the source and the drain of said transistor, the other of said first and second terminals is connected to one of a bit line and a plate line, the other of the source and the drain of said transistor is connected to the other of said bit line and the plate line, and the gate terminal of said transistor is connected to a word line, and wherein said switch element is arranged above said transistor.

5. The memory device according to claim 4, further comprising a write circuit for supplying the current to said memory cell from said first current source to cause the voltage entered to said voltage comparator to be changed in keeping with the electrical conductivity of said switch element, for comparing the voltage entered to said voltage comparator to a voltage supplied from said replica memory cell to decide whether the electrical conductivity of said switch element is higher or lower than the electrical conductivity of the resistor device of said replica memory cell, and for detecting the end of programming based on the decided result.

6. A memory device comprising:

a semiconductor substrate;

a variable electrical conductivity switch element comprising a via connecting a wire in a first interconnection layer to a wire in a second interconnection layer, the via including a member having a variable value of electrical conductivity, wherein the wire of the first interconnection layer is a first terminal of said switch element and the wire in the second interconnection layer is a second terminal of said switch element, and wherein a connection between said first and second terminals is variably set to a shorted state, an open circuit state, and a state between said shorted and open circuit states;

at least a memory cell including said switch element and a transistor arranged on the semiconductor substrate;

a voltage source connected to one of the bit lines and the plate lines, to which is connected said memory cell; and a current comparator supplied with one of the bit lines and the plate lines, to which is connected said memory cell, and with reference current, wherein one of said first and second terminals of said switch element is connected to one of the source and the drain of said transistor, the other of said first and second terminals is connected to one of a bit line and a plate line, the other of the source and the drain of said transistor is connected to the other of said bit line and the plate line, and the gate terminal of said transistor is connected to a word line, and wherein said switch element is arranged above said transistor.

7. The memory device according to claim 6 further comprising a write circuit for supplying the voltage to said memory cell from said voltage source to cause the current flowing in said current comparator to be changed in keeping with the electrical conductivity of said switch element, for comparing the current flowing in said current comparator to said reference current supplied from outside to decide whether the electrical conductivity of said switch element is higher or lower than the target electrical conductivity, and for detecting the end of programming based on the decided result.

8. A memory device comprising:

a semiconductor substrate;

a variable electrical conductivity switch element comprising a via connecting a wire in a first interconnection layer to a wire in a second interconnection layer, the via including a member having a variable value of electrical conductivity, wherein the wire of the first interconnection layer is a first terminal of said switch element and the wire in the second interconnection layer is a second terminal of said switch element, and wherein a connection between said first and second terminals is variably set to a shorted state, an open circuit state, and a state between said shorted and open circuit states;

at least a memory cell including said switch element and a transistor arranged on the semiconductor substrate;

a replica memory cell, corresponding to substitution by a resistor device or a transistor of said switch element of said memory cell;

a current comparator having two inputs;

a first voltage source connected to one of the bit line and the plate line, to which is connected said memory cell;

a second voltage source connected to one of the bit line and the plate line, to which is connected said replica memory cell; and a current comparator connected to one of the bit line and the plate line, to which is connected said memory cell, and to one of the bit line and the plate line, to which is connected said replica memory cell, wherein one of said first and second terminals of said switch element is connected to one of the source and the drain of said transistor, the other of said first and second terminals is connected to one of a bit line and a plate line, the other of the source and the drain of said transistor is connected to the other of said bit line and the plate line, and the gate terminal of said transistor is connected to a word line, and wherein said switch element is arranged above said transistor.

9. The memory device according to claim 8, further comprising a write circuit for supplying the voltage to said memory cell from said first voltage source to cause the current flowing in said current comparator to be changed in keeping with the electrical conductivity of said switch element, for comparing the current flowing in said current comparator to the current supplied from said replica memory cell to decide whether the electrical conductivity of said switch element is higher or lower than the electrical conductivity of the resistor device of the replica memory cell, and for detecting the end of programming based on the decided result.

10. The memory device according to claim 3, further comprising:
- a combinational logic circuit or a state transition circuit;
- an output of said voltage comparator being coupled to an input terminal of said combinational logic circuit or said state transition circuit;
- an output terminal of said combinational logic circuit or said state transition circuit being connected to an output terminal of said current source;
- the current being caused to flow continuously in said memory cell until the output of said voltage comparator issues a signal indicating the end of programming to permit the writing to be carried out so that the electrical conductivity of said switch element reaches a desired value; the writing being discontinued on reaching the desired value of electrical conductivity.

11. The memory device according to claim 7, further comprising:
- a combinational logic circuit or a state transition circuit;
- an output of said current comparator being coupled to an input terminal of said combinational logic circuit or said state transition circuit;
- an output terminal of said combinational logic circuit or said state transition circuit being connected to a control terminal of said voltage source;
- the current being caused to flow continuously in said memory cell until the output of said current comparator issues a signal indicating the end of programming to permit the writing to be carried out so that the electrical conductivity of said switch element reaches a desired value; the writing being discontinued on reaching the desired value of electrical conductivity.

12. The memory device according to claim 5, wherein
- a plurality of replica memory cells are arranged in said write circuit;
- one of said replica cells has a resistor device of an impedance different from the impedance of the other replica memory cells;
- the impedance of the resistor device provided to said replica memory cell being larger and smaller than the on-resistance and off-resistance of said switch element, respectively.

13. The memory device according to claim 3, further comprising:
- a replica memory cell, corresponding to substitution by a resistor device or a transistor of said switch element of said memory cell;
- two input terminals of said voltage comparator are connected to said memory cell and to the bit line or the plate line of said replica memory cell; and
- a readout circuit for comparing the voltage appearing in said memory cell to the voltage appearing in said replica memory cell to decide whether the electrical conductivity of said memory cell is higher or lower than that of said replica memory cell to determine the information written in said memory cell.

14. The memory device according to claim 13, wherein
- a plurality of said replica memory cells are provided;
- one of said replica memory cells has a resistance device of an impedance different from the impedance of other replica memory cells;
- the impedance of the resistor device provided to said replica memory cell being larger and smaller than the on-resistance and off-resistance of said switch element, respectively.

* * * * *